US011842705B2

United States Patent
Kawashima et al.

(10) Patent No.: US 11,842,705 B2
(45) Date of Patent: Dec. 12, 2023

(54) DISPLAY APPARATUS AND ELECTRONIC DEVICE

(71) Applicant: Semiconductor Energy Laboratory Co., Ltd., Atsugi (JP)

(72) Inventors: Susumu Kawashima, Atsugi (JP); Koji Kusunoki, Isehara (JP); Kazunori Watanabe, Machida (JP); Naoto Kusumoto, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/844,931

(22) Filed: Jun. 21, 2022

(65) Prior Publication Data

US 2022/0319461 A1 Oct. 6, 2022

Related U.S. Application Data

(63) Continuation of application No. 17/298,999, filed as application No. PCT/IB2019/060823 on Dec. 16, 2019, now Pat. No. 11,373,610.

(30) Foreign Application Priority Data

Dec. 26, 2018 (JP) ................. 2018-242749

(51) Int. Cl.
*G09G 3/34* (2006.01)
*G09G 3/36* (2006.01)
*G02F 1/1368* (2006.01)

(52) U.S. Cl.
CPC ......... *G09G 3/3648* (2013.01); *G02F 1/1368* (2013.01); *G09G 3/3696* (2013.01);
(Continued)

(58) Field of Classification Search
CPC ............... G09G 3/3648; G09G 3/3696; G09G 2300/0426; G09G 2330/021; G02F 1/1368
See application file for complete search history.

(56) References Cited

U.S. PATENT DOCUMENTS

| 5,712,652 A | 1/1998 | Sato et al. |
| 6,724,359 B2 | 4/2004 | Yamamoto et al. |

(Continued)

FOREIGN PATENT DOCUMENTS

| CN | 101887689 A | 11/2010 |
| CN | 102034443 A | 4/2011 |

(Continued)

OTHER PUBLICATIONS

International Search Report (Application No. PCT/IB2019/060823) dated Mar. 31, 2020.

(Continued)

*Primary Examiner* — Roy P Rabindranath
(74) *Attorney, Agent, or Firm* — ROBINSON INTELLECTUAL PROPERTY LAW OFFICE; Eric J. Robinson

(57) ABSTRACT

A display apparatus with low-power consumption is provided. The display apparatus includes an inverter circuit and a pixel having a function of adding data, and the inverter circuit has a function of inverting data supplied from a source driver. The inverter circuit has a function of inverting data supplied from a source driver. The pixel has a function of adding data supplied from the source driver and the inverter circuit. Accordingly, the pixel can generate a voltage several times higher than the output voltage of the source driver and can supply the voltage to a display device. With such a structure, the output voltage of the source driver (Continued)

can be lowered, so that a display apparatus with low power consumption can be achieved.

5 Claims, 31 Drawing Sheets

(52) U.S. Cl.
CPC ............... *G09G 2300/0426* (2013.01); *G09G 2330/021* (2013.01)

(56) References Cited

U.S. PATENT DOCUMENTS

| | | | |
|---|---|---|---|
| 6,873,116 | B2 | 3/2005 | Kimura et al. |
| 7,180,485 | B2 | 2/2007 | Kimura et al. |
| 7,674,650 | B2 | 3/2010 | Akimoto et al. |
| 8,860,108 | B2 | 10/2014 | Yamazaki et al. |
| 8,884,852 | B2 | 11/2014 | Yamamoto et al. |
| 8,976,090 | B2 | 3/2015 | Yamamoto. et al. |
| 10,074,646 | B2 | 9/2018 | Yamazaki et al. |
| 10,140,940 | B2 | 11/2018 | Aoki |
| 2002/0067327 | A1* | 6/2002 | Ozawa ................ G09G 3/3648 345/89 |
| 2002/0089813 | A1 | 7/2002 | Yamamoto. et al. |
| 2003/0201729 | A1 | 10/2003 | Kimura et al. |
| 2004/0252116 | A1* | 12/2004 | Tobita ................ G09G 3/3688 345/211 |
| 2006/0232577 | A1 | 10/2006 | Edwards et al. |
| 2009/0225242 | A1 | 9/2009 | Sato |
| 2010/0065840 | A1 | 3/2010 | Yamazaki et al. |
| 2010/0289830 | A1 | 11/2010 | Yamamoto. et al. |
| 2011/0090196 | A1 | 4/2011 | Li. et al. |
| 2012/0223978 | A1 | 9/2012 | Yamamoto. et al. |
| 2012/0249509 | A1 | 10/2012 | Kim et al. |
| 2013/0135267 | A1* | 5/2013 | Jeong ................ G09G 3/3688 345/204 |
| 2013/0234918 | A1 | 9/2013 | Yamashita et al. |
| 2013/0321371 | A1 | 12/2013 | Koyama |
| 2015/0009111 | A1* | 1/2015 | Yamauchi ............. G06F 1/3265 345/92 |
| 2015/0123961 | A1* | 5/2015 | Park ..................... G09G 3/3614 345/212 |
| 2016/0055817 | A1 | 2/2016 | Kuo |
| 2017/0025080 | A1 | 1/2017 | Aoki |
| 2018/0090553 | A1* | 3/2018 | Rieutort-Louis .. H10K 59/1213 |
| 2019/0235250 | A1* | 8/2019 | Miyasaka .......... G02B 17/0856 |
| 2020/0193907 | A1* | 6/2020 | Shin ..................... G09G 3/3258 |
| 2020/0193928 | A1 | 6/2020 | Kawashima et al. |
| 2020/0194527 | A1 | 6/2020 | Kawashima et al. |
| 2020/0302889 | A1 | 9/2020 | Takahashi et al. |

FOREIGN PATENT DOCUMENTS

| | | |
|---|---|---|
| CN | 102737586 A | 10/2012 |
| CN | 105304039 A | 2/2016 |
| EP | 2506247 A | 10/2012 |
| JP | 08-286170 A | 11/1996 |
| JP | 2002-277898 A | 9/2002 |
| JP | 2003-323153 A | 11/2003 |
| JP | 2007-096055 A | 4/2007 |
| JP | 2007-123861 A | 5/2007 |
| JP | 2010-092036 A | 4/2010 |
| JP | 2010-266494 A | 11/2010 |
| JP | 2011-119674 A | 6/2011 |
| JP | 2012-185328 A | 9/2012 |
| JP | 2017-027012 A | 2/2017 |
| KR | 2010-0122443 A | 11/2010 |
| KR | 2012-0110387 A | 10/2012 |
| TW | 201106323 | 2/2011 |
| TW | 201709192 | 3/2017 |
| WO | WO-2010/029866 | 3/2010 |
| WO | WO-2020/128721 | 6/2020 |

OTHER PUBLICATIONS

Written Opinion (Application No. PCT/IB2019/060823) dated Mar. 31, 2020.

* cited by examiner

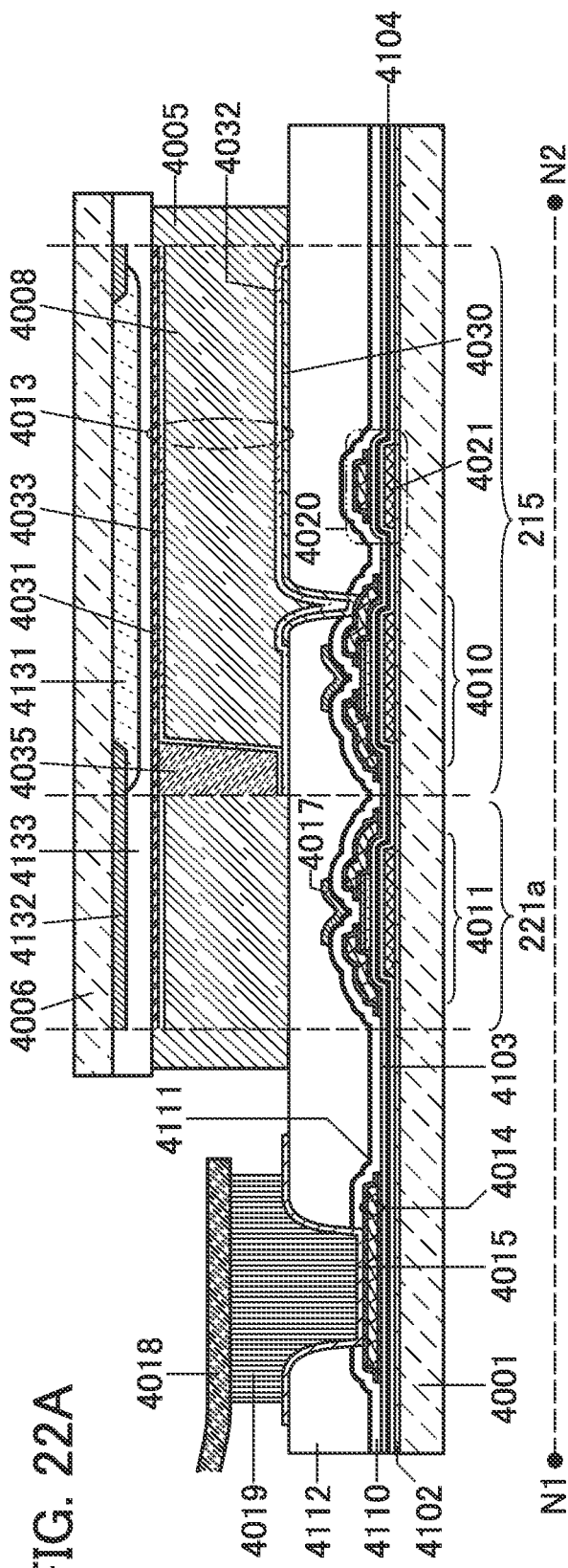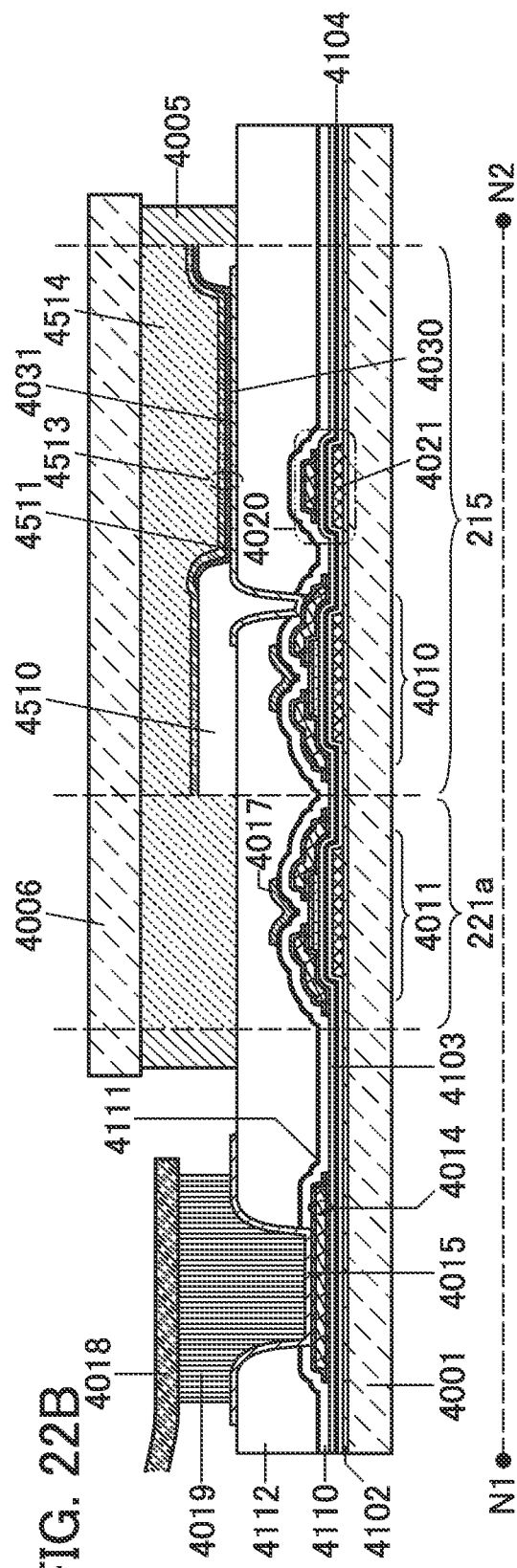

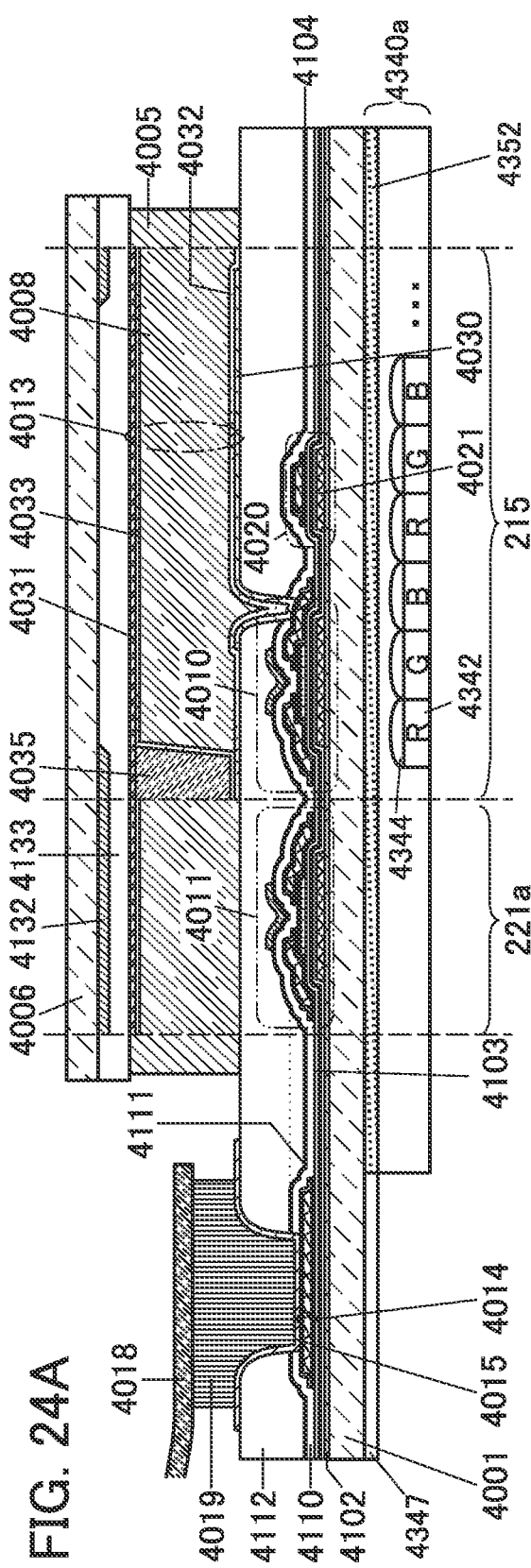
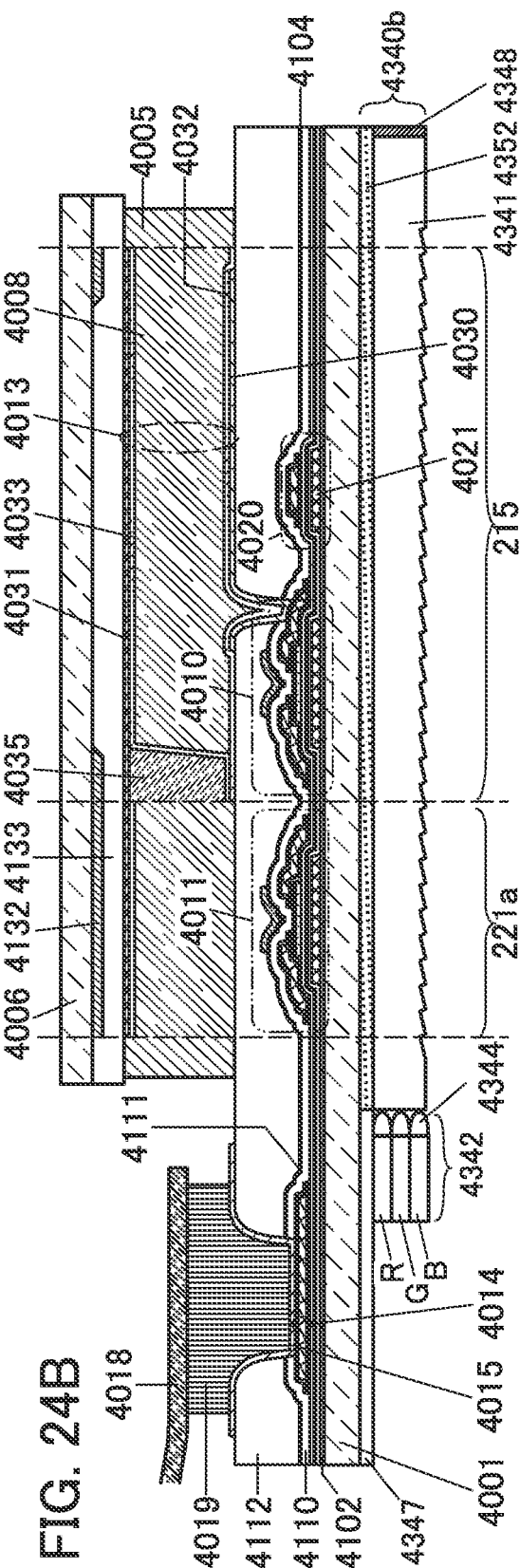
FIG. 24A
FIG. 24B

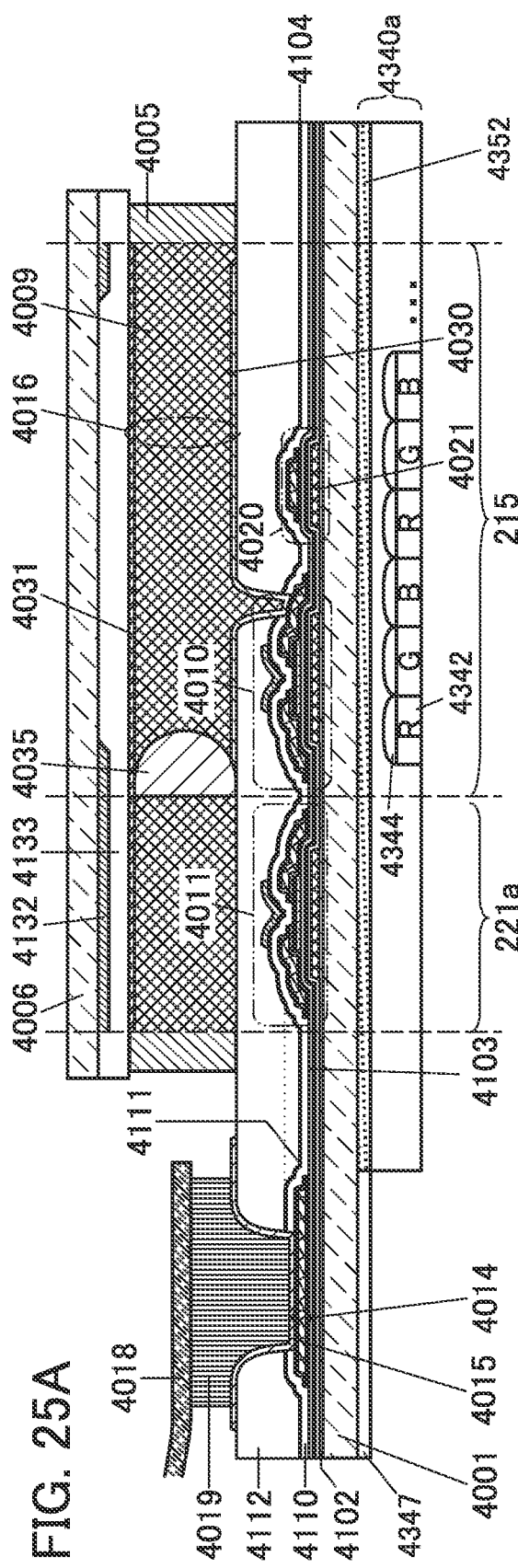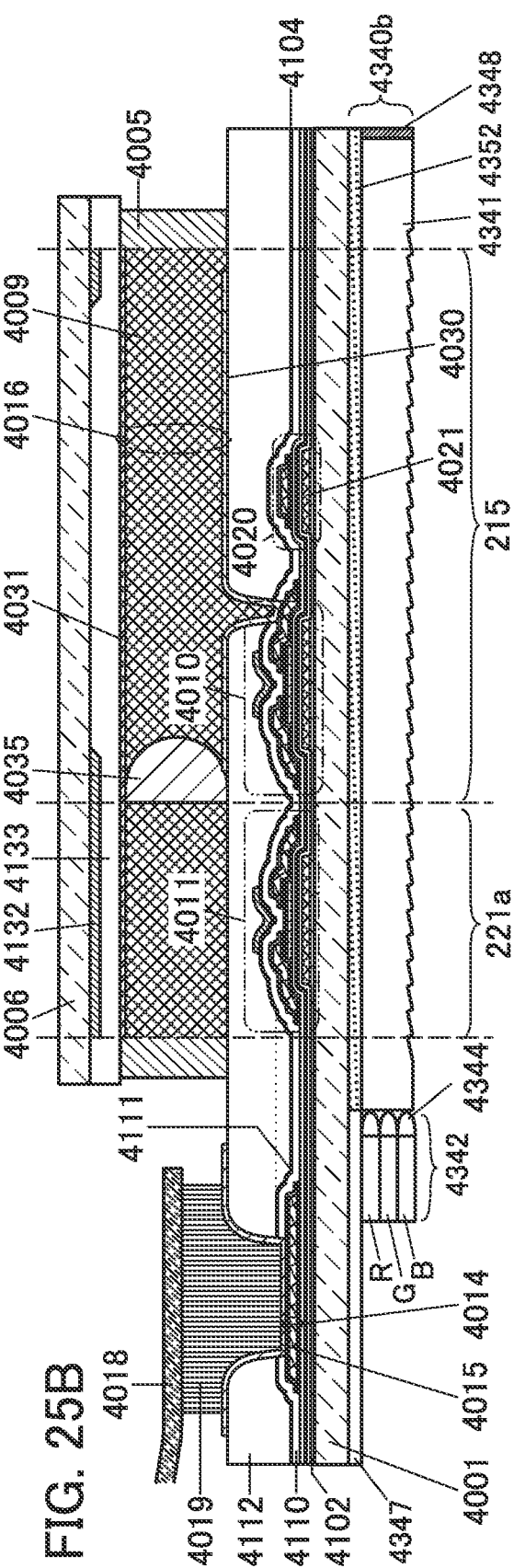

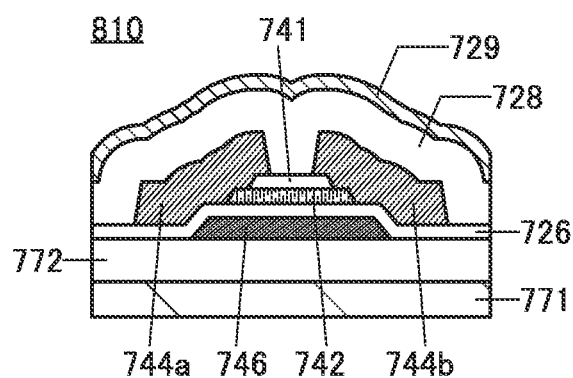
FIG. 27A1
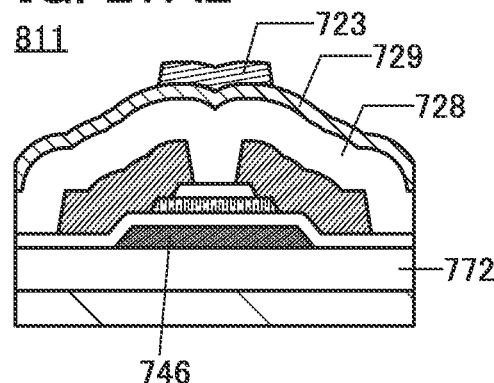
FIG. 27A2
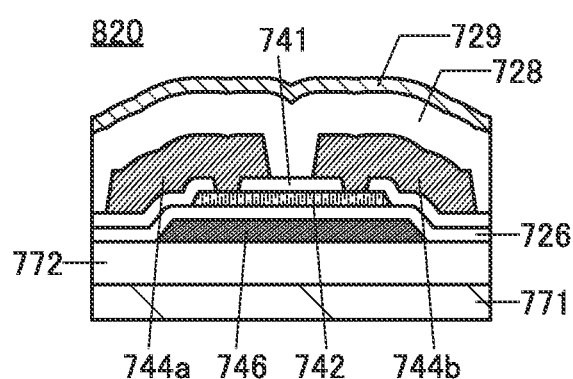
FIG. 27B1
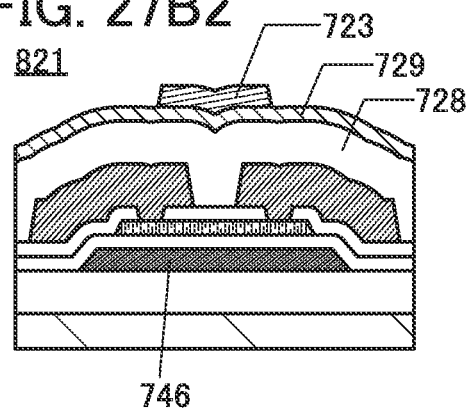
FIG. 27B2
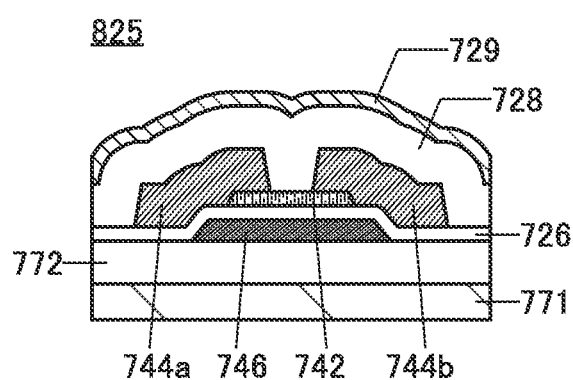
FIG. 27C1
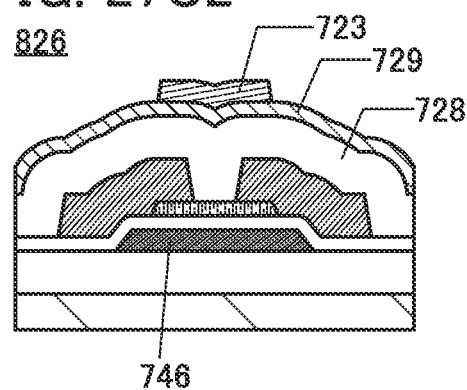
FIG. 27C2

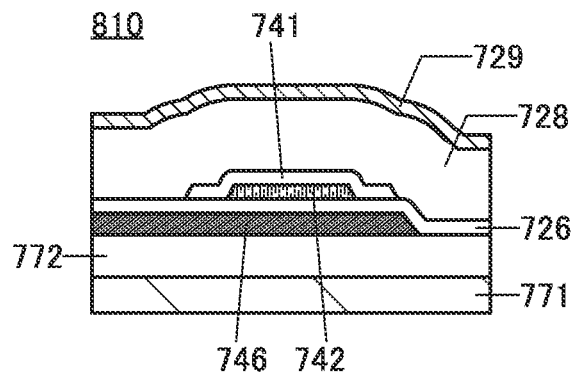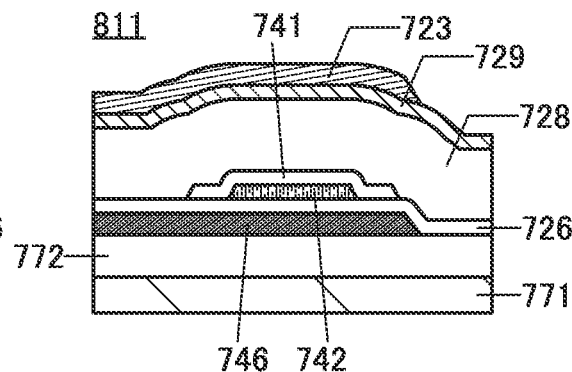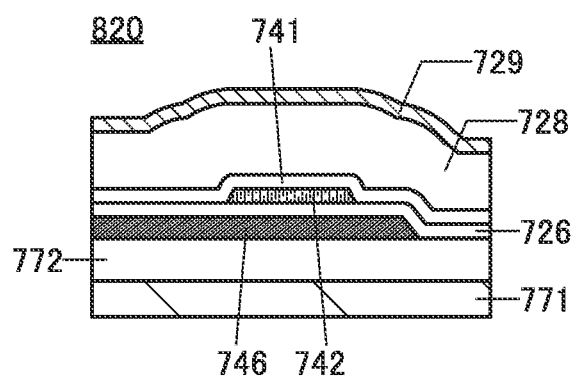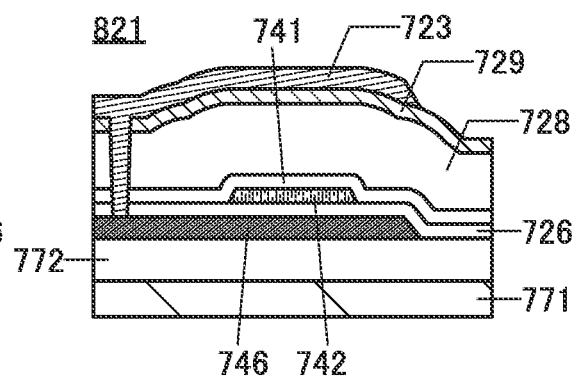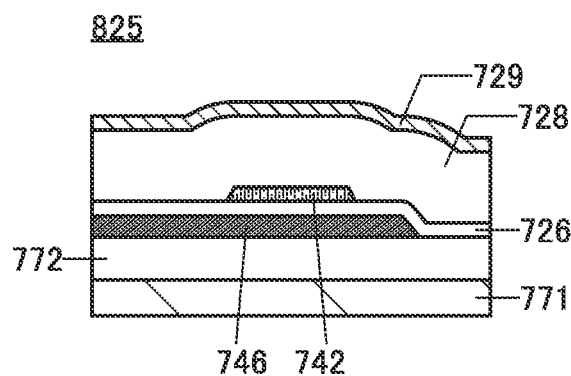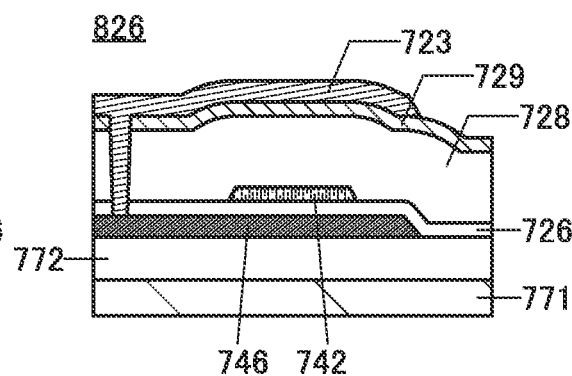

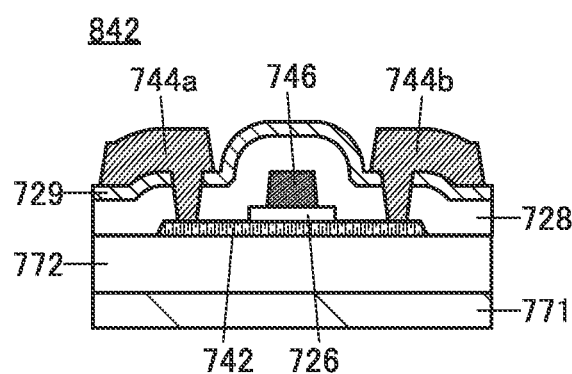
FIG. 29A1
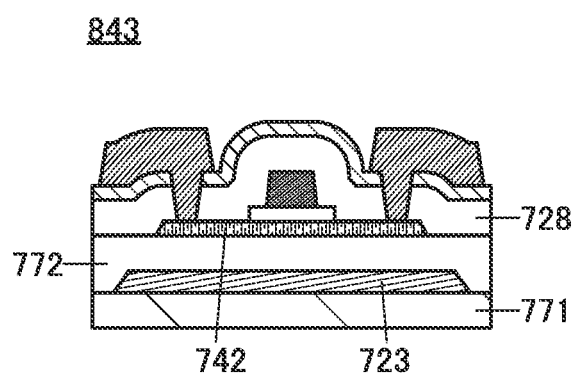
FIG. 29A2
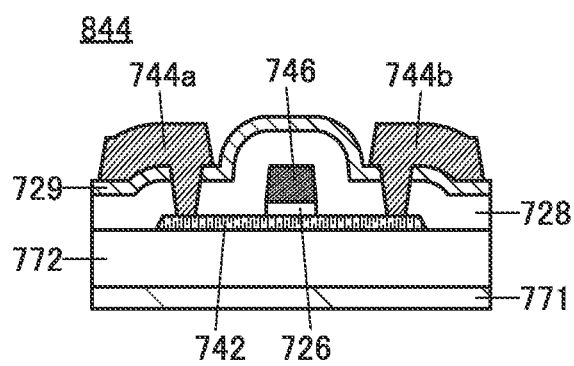
FIG. 29B1
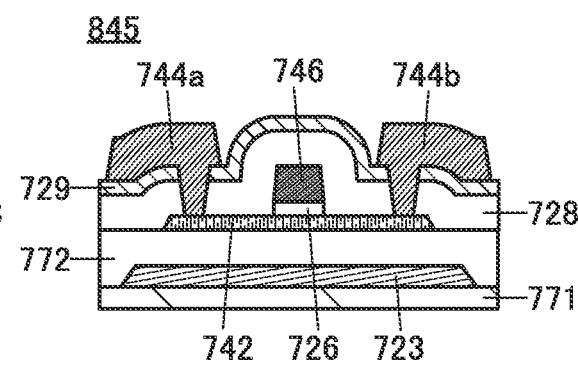
FIG. 29B2
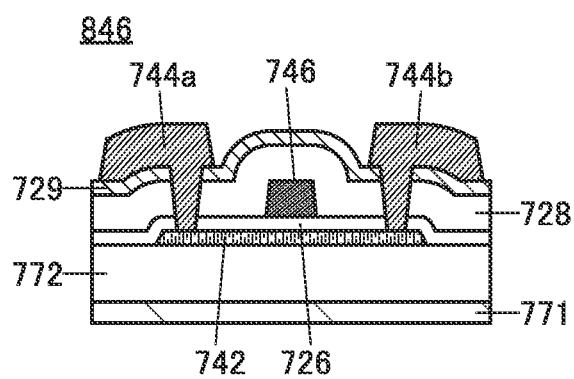
FIG. 29C1
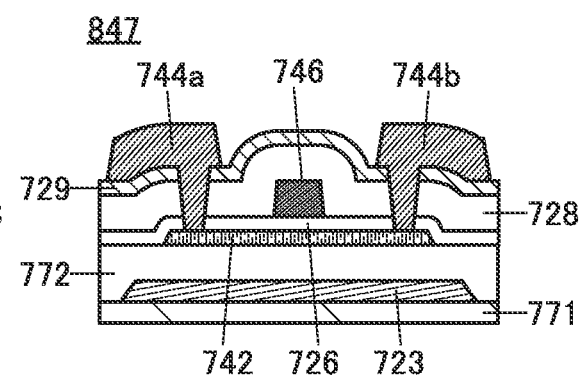
FIG. 29C2

FIG. 30A1
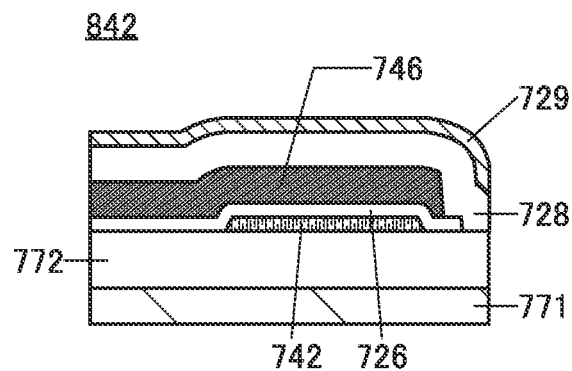
FIG. 30A2
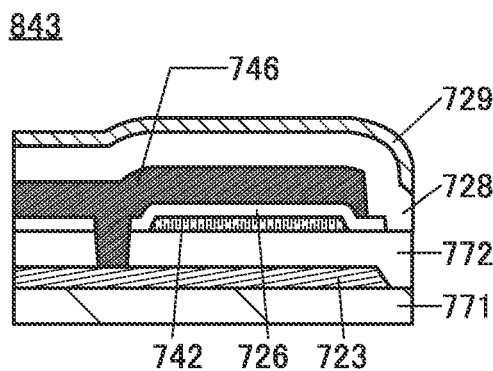
FIG. 30B1
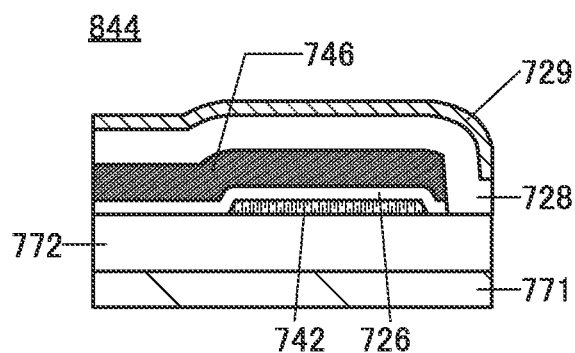
FIG. 30B2
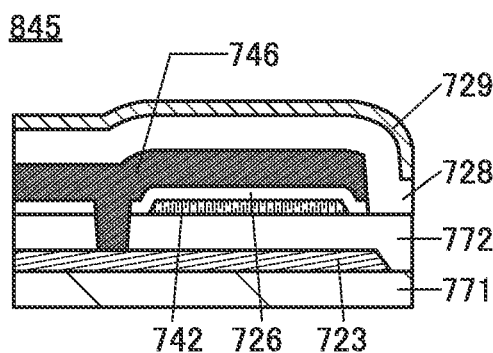
FIG. 30C1
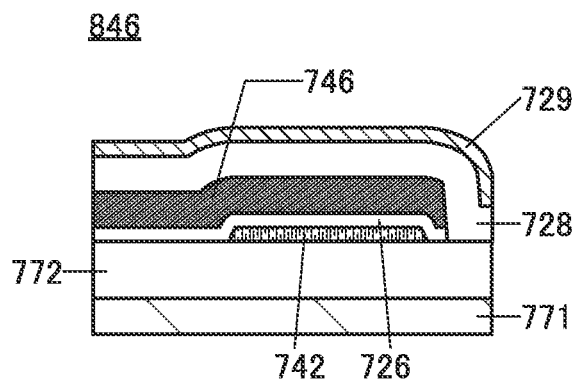
FIG. 30C2
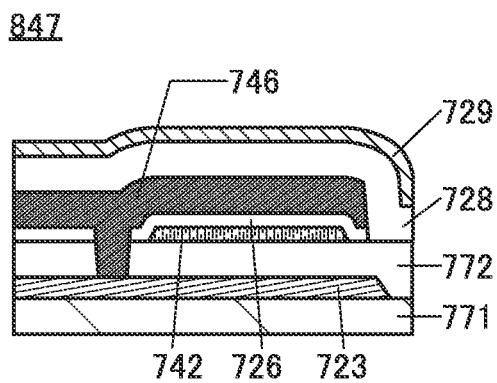

DISPLAY APPARATUS AND ELECTRONIC DEVICE

TECHNICAL FIELD

One embodiment of the present invention relates to a display apparatus.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Accordingly, more specific examples of the technical field of one embodiment of the present invention disclosed in this specification include a semiconductor device, a display apparatus, a liquid crystal display apparatus, a light-emitting apparatus, a lighting device, a power storage device, a memory device, an imaging device, an operation method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display apparatus, an imaging device, or an electronic device includes a semiconductor device.

BACKGROUND ART

A technique for forming transistors using a metal oxide formed over a substrate has been attracting attention. For example, a technique in which a transistor formed using zinc oxide or an In—Ga—Zn-based oxide is used as a switching element or the like of a pixel of a display apparatus is disclosed in Patent Document 1 and Patent Document 2.

Patent Document 3 discloses a memory device having a structure in which a transistor with an extremely low off-state current is used in a memory cell.

REFERENCES

Patent Documents

[Patent Document 1] Japanese Published Patent Application No. 2007-123861
[Patent Document 2] Japanese Published Patent Application No. 2007-96055
[Patent Document 3] Japanese Published Patent Application No. 2011-119674

SUMMARY OF THE INVENTION

Problems to be Solved by the Invention

Display apparatuses have been used for a variety of electronic devices. The low voltage operation of a display apparatus is one way to reduce power consumption of an electronic device.

A source driver included in a display apparatus includes a high-speed logic unit with a low driving voltage and an amplifier unit with a high withstand voltage and a high output voltage. The power consumption of the amplifier unit, which needs a relatively high power supply voltage, is higher than that of the logic unit.

When the output voltage of the source driver can be decreased, i.e., the power supply voltage of the amplifier unit can be decreased, the amplifier unit can be fabricated employing technology similar to that for the logic unit. Employing common technology for the amplifier unit and the logic unit can reduce the power consumption and manufacturing costs of the source driver.

In addition, a display device is required to be appropriately operate even when input data for a pixel is a low voltage.

Thus, an object of one embodiment of the present invention is to provide a display apparatus with low power consumption. Another object is to provide a display apparatus capable of supplying a voltage higher than or equal to the output voltage of a source driver to a display device. Another object is to provide a display apparatus capable of enhancing the luminance of a displayed image. Another object is to provide a display apparatus operated with a low-cost driver.

Another object is to provide a highly reliable display apparatus. Another object is to provide a novel display apparatus or the like. Another object is to provide a method for operating the above display apparatus. Another object is to provide a novel semiconductor device or the like.

Note that the description of these objects does not preclude the existence of other objects. One embodiment of the present invention does not have to achieve all these objects. Other objects are apparent from the description of the specification, the drawings, the claims, and the like, and other objects can be derived from the description of the specification, the drawings, the claims, and the like.

Means for Solving the Problems

One embodiment of the present invention relates to a display apparatus with low power consumption.

One embodiment of the present invention is a display apparatus including a first circuit, a second circuit, and a pixel. The first circuit and the second circuit are electrically connected to each other; the first circuit and the pixel are electrically connected to each other; the second circuit and the pixel are electrically connected to each other; the first circuit has a function of outputting first data to the second circuit; the first circuit has a function of outputting the first data to the pixel; the second circuit has a function of outputting second data to the pixel on the basis of the first data; when a potential of the first data is represented by $D1$, a potential of the second data is represented by $D2$, and a reference potential is represented by $V0$, relation of $V0=(D1+D2)/2$ is satisfied; and the pixel has a function of generating third data on the basis of the first data and the second data and a function of performing display in accordance with the third data.

The second circuit can further include a third circuit. The third circuit can have a function of selecting an output path; an input terminal of the third circuit can be electrically connected to the second circuit; and an output terminal of the third circuit can be electrically connected to the pixel.

The pixel can include a first transistor, a second transistor, a third transistor, a first capacitor, and a fourth circuit. One electrode of the first capacitor can be electrically connected to one of a source and a drain of the first transistor; the one of the source and the drain of the first transistor can be electrically connected to the third circuit; the other electrode of the first capacitor can be electrically connected to one of a source and a drain of the second transistor; the one of the source and the drain of the second transistor can be electrically connected to one of a source and a drain of the third transistor; the other of the source and the drain of the first transistor can be electrically connected to the other of the source and the drain of the second transistor; the other of the source and the drain of the second transistor can be electrically connected to the second circuit; the other of the source and the drain of the second transistor can be electrically connected to the first circuit; the other of the source and the drain of the third transistor can be electrically connected to the second circuit; and the fourth circuit can include a display device.

The channel width of the third transistor can be smaller than the channel width of the first transistor and the channel width of the second transistor.

The fourth circuit can include a liquid crystal device as the display device, and one electrode of the liquid crystal device can be electrically connected to the one of the source and the drain of the first transistor. A second capacitor may be further included and one electrode of the second capacitor may be electrically connected to the one electrode of the liquid crystal device.

Alternatively, the fourth circuit can include a fourth transistor, a third capacitor, and a light-emitting device as the display device. A gate of the fourth transistor can be electrically connected to the one of the source and the drain of the first transistor; one of a source and a drain of the fourth transistor can be electrically connected to one electrode of the light-emitting device; the one electrode of the light-emitting device can be electrically connected to one electrode of the third capacitor; and the other electrode of the third capacitor can be electrically connected to the gate of the fourth transistor.

The second circuit can include a fifth transistor, a sixth transistor, a seventh transistor, an eighth transistor, a ninth transistor, a tenth transistor, a fourth capacitor, and a fifth capacitor. One of a source and a drain of the fifth transistor can be electrically connected to one electrode of the fourth capacitor; the one electrode of the fourth capacitor can be electrically connected to one of a source and a drain of the sixth transistor; a gate of the fifth transistor can be electrically connected to a gate of the seventh transistor; one of a source and a drain of the seventh transistor can be electrically connected to the other electrode of the fourth capacitor; the other electrode of the fourth capacitor can be electrically connected to one of a source and a drain of the eighth transistor; a gate of the eighth transistor can be electrically connected to a gate of the sixth transistor; the other of the source and the drain of the eighth transistor can be electrically connected to a gate of the ninth transistor; the gate of the ninth transistor can be electrically connected to one electrode of the fifth capacitor; the other of a source and a drain of the ninth transistor can be electrically connected to one of a source and a drain of the tenth transistor; the one of the source and the drain of the tenth transistor can be electrically connected to the pixel; and the other of the source and the drain of the fifth transistor can be electrically connected to the first circuit.

The transistors of the second circuit, the third circuit, and the pixel each preferably include a metal oxide in a channel formation region, and the metal oxide preferably contains In, Zn, and M (M is Al, Ti, Ga, Sn, Y, Zr, La, Ce, Nd, or Hf).

Another embodiment of the present invention is a method for operating a display apparatus including a pixel in which a display device is electrically connected to one electrode of a capacitor. The method includes a first step of generating first data and second data obtained by inverting the first data using a specific potential as a reference and supplying the second data to the other electrode of the capacitor while the first data is supplied to one electrode of the capacitor, and a second step of supplying the first data to the other electrode of the capacitor while the one electrode of the capacitor is floating. Operations are performed in the above-described order.

Effect of the Invention

With the use of one embodiment of the present invention, a display apparatus with low power consumption can be provided. Alternatively, a display apparatus capable of supplying a voltage higher than or equal to the output voltage of a source driver to a display device can be provided. Alternatively, a display apparatus capable of enhancing the luminance of a displayed image can be provided. Alternatively, a display apparatus operated with a low-cost driver can be provided.

Alternatively, a highly reliable display apparatus can be provided. Alternatively, a novel display apparatus or the like can be provided. Alternatively, a method for operating the above display apparatus can be provided. Alternatively, a novel semiconductor device or the like can be provided.

BRIEF DESCRIPTION OF THE DRAWINGS

FIG. 22A and FIG. 22B are diagrams illustrating display apparatuses.

FIG. 24A and FIG. 24B are diagrams illustrating display apparatuses.

FIG. 25A and FIG. 25B are diagrams illustrating display apparatuses.

FIG. 27A1 to FIG. 27C2 are diagrams illustrating transistors.

FIG. 28A1 to FIG. 28C2 are diagrams illustrating transistors.

FIG. 29A1 to FIG. 29C2 are diagrams illustrating transistors.

FIG. 30A1 to FIG. 30C2 are diagrams illustrating transistors.

MODE FOR CARRYING OUT THE INVENTION

Figure 1:
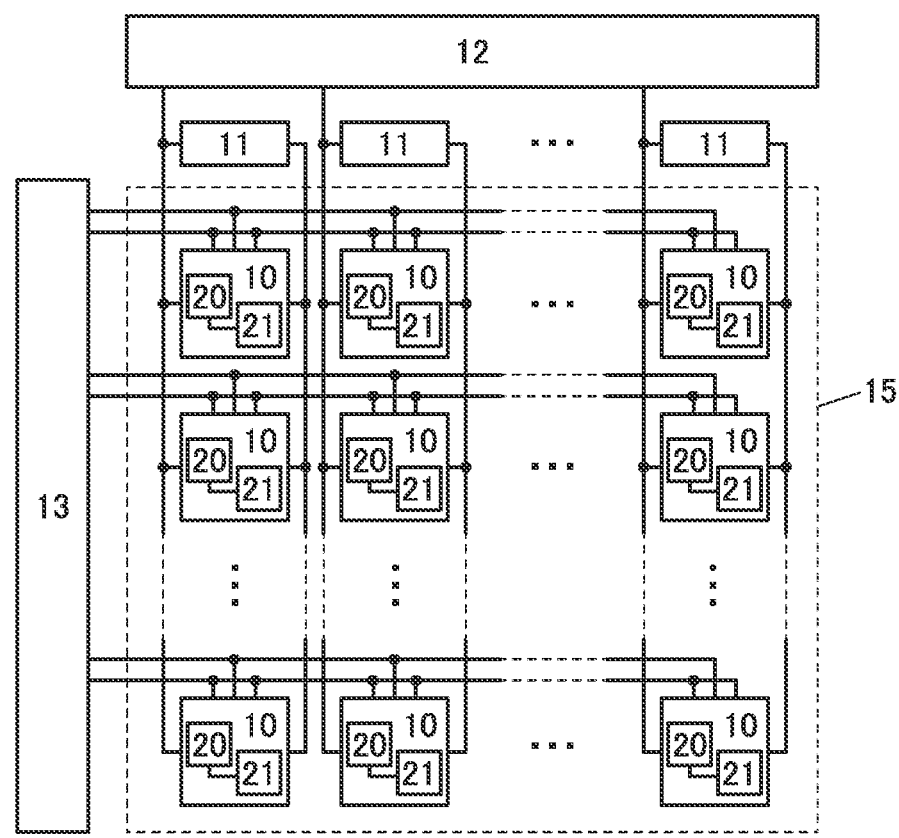
FIG. 1 is a diagram illustrating a display apparatus.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the descriptions of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are separately arranged in a plurality of positions.

One conductor has a plurality of functions such as a wiring, an electrode, and a terminal in some cases, and in this specification, a plurality of names are used for the same component in some cases. Even in the case where components are illustrated in a circuit diagram as if they were directly connected to each other, the components may actually be connected to each other through a plurality of conductors; in this specification, even such a structure is included in direct connection.

Embodiment 1

In this embodiment, a display apparatus that is one embodiment of the present invention will be described with reference to drawings.

One embodiment of the present invention is a display apparatus including a circuit having a function of inverting data (hereinafter, inverter circuit) and a pixel also having a function of adding data.

The inverter circuit has a function of inverting data supplied from a source driver. The pixel has a function of adding data supplied from the source driver and the inverter circuit. Accordingly, the pixel can generate a voltage higher than the output voltage of the source driver and can supply the voltage to a display device. With such a structure, the output voltage of the source driver can be lowered, so that a display apparatus with low power consumption can be achieved.

In addition, the inverter circuit can generate a positive data potential and a negative data potential; thus, even when the source driver can generate one of a positive potential and a negative potential, the potentials can correspond to the positive polarity operation and negative polarity operation of a liquid crystal device. In that case, the circuit structure of the source driver can be simple, so that a chip area can be reduced. Thus, the display apparatus can be composed of a low-cost source driver.

Note that "inversion of data" means generation of data that has the same (or substantially the same) absolute value of a difference between the data and a reference potential as that of original data and is different from the original data. In the case where original data, inverted data, and a reference potential (e.g., common potential) are represented by first data (D1), second data (D2), and V0, respectively, the following relation is satisfied: V0=(D1+D2)/2. In this embodiment, for easy understanding, it is expressed in many descriptions that the reference potential is 0 V and the first data and the second data have the same absolute value and different polarities; however, there is no such limitation. The reference potential can be set freely in accordance with the design, and the first data and the second data may have the same polarity as long as the above formula is satisfied. Moreover, the first data and the second data may have different absolute values.

<Display Apparatus>

FIG. 1 is a diagram illustrating a display apparatus of one embodiment of the present invention. The display apparatus includes a display region 15 including pixels 10 arranged in a column direction and in a row direction, a source driver 12, a gate driver 13, and circuits 11. The source driver 12 is electrically connected to the circuits 11 and the pixels 10. The gate driver 13 is electrically connected to the pixels 10. The circuits 11 are electrically connected to the pixels 10. Note that a plurality of source drivers 12 and a plurality of gate drivers 13 may be provided.

Each of the circuits 11 can be provided for one column of the pixels 10 and can be electrically connected to the pixels 10 arranged in the same column, for example.

The circuit 11 is an inverter circuit, and has a function of generating an analog potential (the second data) obtained by inverting an analog potential (the first data) supplied from the source driver 12.

The pixels 10 each include a circuit 20 and a circuit 21. The circuit 20 has a function of adding the first data supplied from the source driver 12 and the second data supplied from the circuit 11 by capacitive coupling to generate third data. The circuit 21 includes a display device, and has a function of operating the display device in accordance with the third data supplied from the circuit 20.

Figure 2:
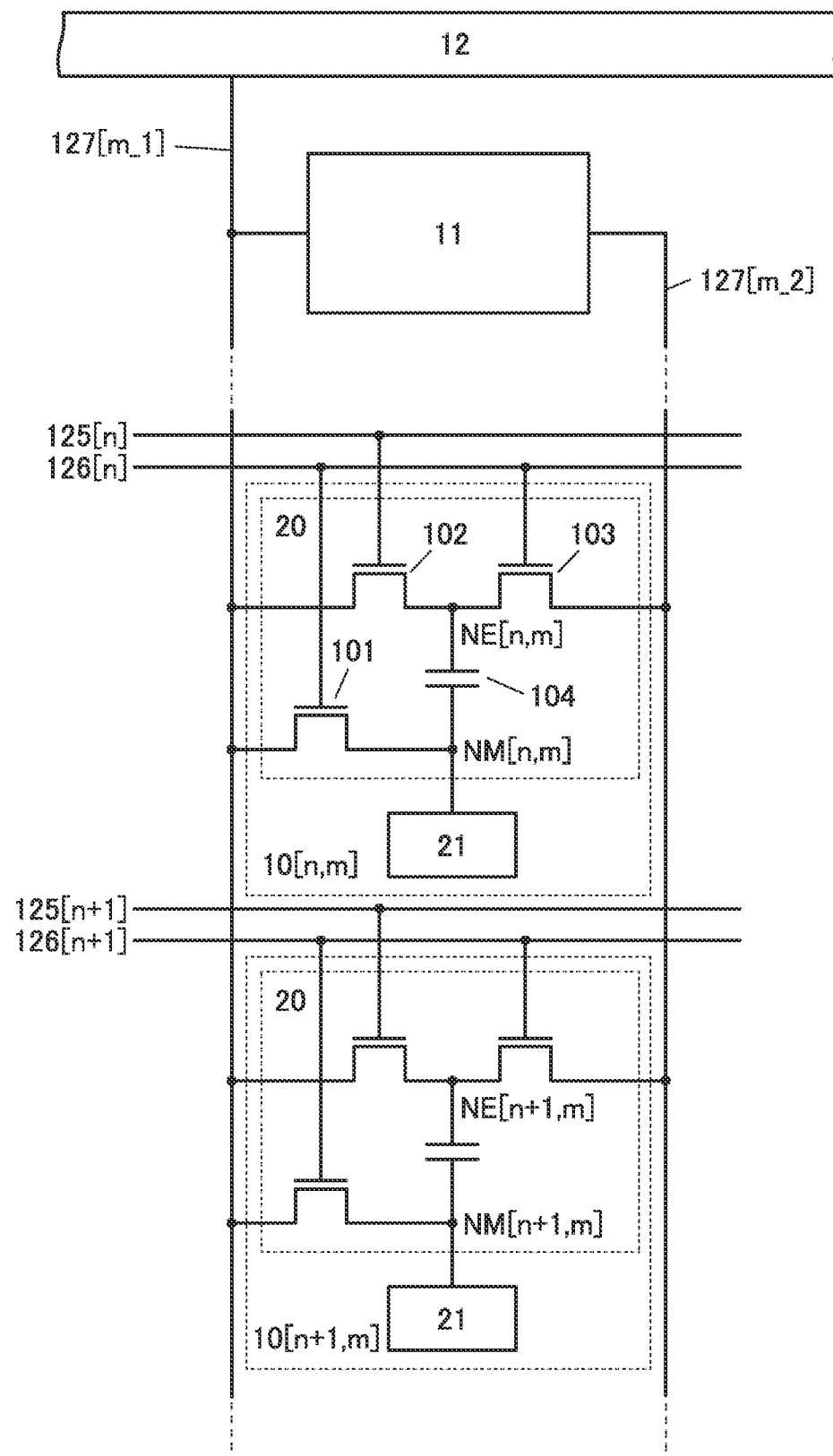
FIG. 2 is a diagram illustrating an inverter circuit and pixels.

FIG. 2 is a diagram illustrating the circuit 11 and the pixels 10 (a pixel 10[n,m] and a pixel 10[n+1,m] (m and n are each a natural number greater than or equal to 1)) adjacent in the vertical direction (the direction in which a source line extends), which are arranged in a given column (the m-th column) of the display apparatus illustrated in FIG. 1.

<Inverter Circuit>

Figure 3:
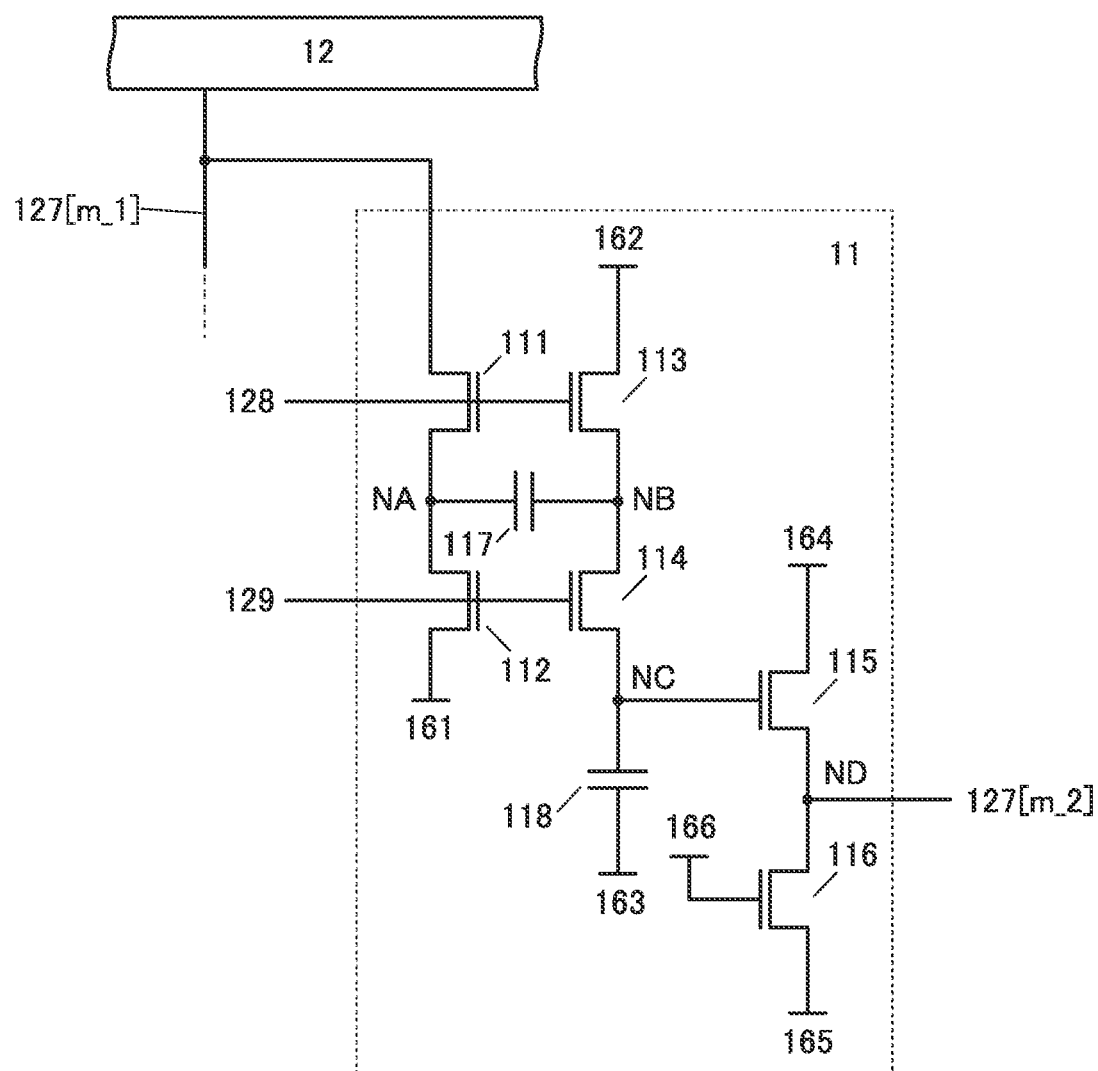
FIG. 3 is a diagram illustrating an inverter circuit.

FIG. 3 shows an example of a structure of the circuit 11. The circuit 11 can have a structure including a transistor 111, a transistor 112, a transistor 113, a transistor 114, a transistor 115, a transistor 116, a capacitor 117, and a capacitor 118.

One of a source and a drain of the transistor 111 is electrically connected to one electrode of the capacitor 117. The one electrode of the capacitor 117 is electrically connected to one of a source and a drain of the transistor 112. One of a source and a drain of the transistor 113 is electrically connected to the other electrode of the capacitor 117. The other electrode of the capacitor 117 is electrically connected to one of a source and a drain of the transistor 114. The other of the source and the drain of the transistor 114 is electrically connected to a gate of the transistor 115, and the gate of the transistor 115 is electrically connected to one electrode of the capacitor 118. One of a source and a drain of the transistor 115 is electrically connected to one of a source and a drain of the transistor 116.

In this structure, the other of the source and the drain of the transistor 111 corresponds to an input terminal and is electrically connected to a wiring 127[$m\_1$]. The one of the source and the drain of the transistor 116 corresponds to an output terminal and is electrically connected to a wiring 127[$m\_2$]. Note that the structure of the circuit 11 is not limited to the above structure as long as a component corresponding to an input terminal and a component corresponding to an output terminal are included and an analog potential input to the input terminal can be inverted and then output from the output terminal.

Gates of the transistor 111 and the transistor 113 are electrically connected to a wiring 128. A gate of the transistor 112 and a gate of the transistor 114 are electrically connected to a wiring 129. The other of the source and the drain of the transistor 112 is electrically connected to a wiring 161. The other of the source and the drain of the transistor 113 is electrically connected to a wiring 162. The other electrode of the capacitor 118 is electrically connected to a wiring 163. The other of the source and the drain of the transistor 115 is electrically connected to a wiring 164. The other of the source and the drain of the transistor 116 is electrically connected to a wiring 165. A gate of the transistor 116 is electrically connected to a wiring 166.

The wirings 128 and 129 can each have a function of a gate line. For example, the wirings 128 and 129 can be electrically connected to a circuit for controlling the operation of the circuit 11. The wirings 161, 162, 163, 164, and 165 can each have a function of a power supply line. For example, the wirings 161, 163, and 165 can each be a low potential power supply line and the wirings 162 and 164 can each be a high potential power supply line. The wiring 166 has a function of supplying a constant potential.

Figure 4:
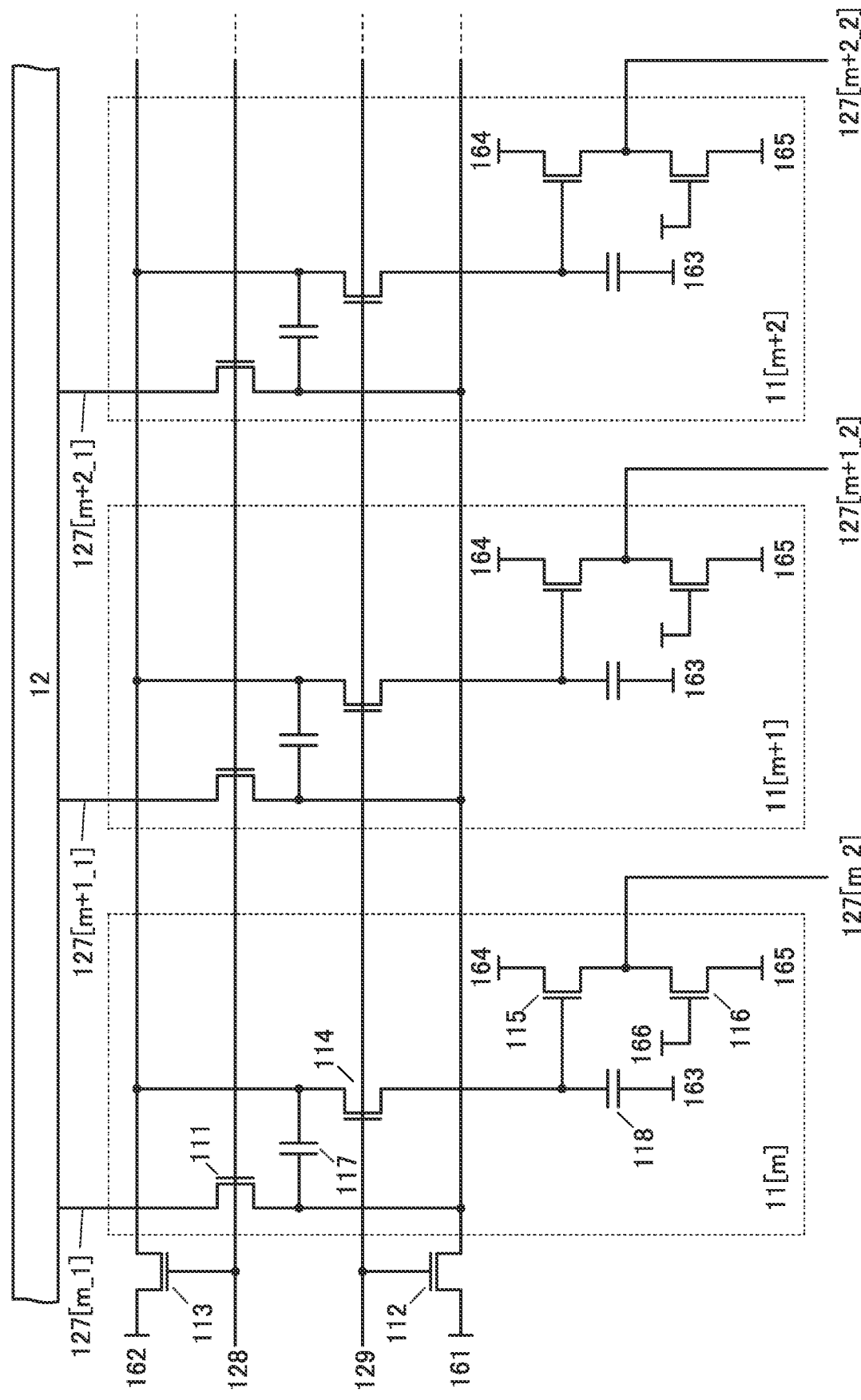
FIG. 4 is a diagram illustrating an inverter circuit.

Note that as illustrated in FIG. 4, a structure in which the circuits 11 arranged in a plurality of columns share the transistor 112 and the transistor 113 may be employed. Although FIG. 4 shows an example in which the transistor 112 and the transistor 113 are shared by three or more columns, a structure in which the transistors are shared by two columns may be employed. Note that in FIG. 4, although the transistor 112 and the transistor 113 are illustrated outside the circuit 11, the transistor 112 and the transistor 113 are components shared by the circuits 11. With such a structure, the number of components of the circuit 11 can be reduced, which is effective in narrowing a frame.

<Pixel Circuit>

The pixel 10 can have a structure including the circuit 20 that generates image data and the circuit 21 that performs a display operation.

The circuit 20 can have a structure including a transistor 101, a transistor 102, a transistor 103, and a capacitor 104. One electrode of the capacitor 104 is electrically connected to one of a source and a drain of the transistor 101. The one of the source and the drain of the transistor 101 is electrically connected to the circuit 21. The other electrode of the capacitor 104 is electrically connected to one of a source and a drain of the transistor 102. The one of the source and the drain of the transistor 102 is electrically connected to one of a source and a drain of the transistor 103.

The circuit 21 can have a structure including a transistor, a capacitor, a display device, and the like and will be described in detail later.

Connections between the components of the circuit 11 and the pixels 10 and a variety of wirings are described.

In the pixel 10[$n,m$], a gate of the transistor 101 is electrically connected to a wiring 126[$n$]. A gate of the transistor 102 is electrically connected to a wiring 125[$n$]. A gate of the transistor 103 is electrically connected to the wiring 126[$n$]. The other of the source and the drain of the transistor 101 is electrically connected to the wiring 127[$m\_1$]. The other of the source and the drain of the transistor 102 is electrically connected to the wiring 127[$m\_1$]. The other of the source and the drain of the transistor 103 is electrically connected to the wiring 127[$m\_2$].

The wirings 125 and 126 can each have a function of a gate line. The wirings 125 and 126 can be electrically connected to the gate driver 13 (see FIG. 1). The wiring 127 (127[$m\_1$] and 127[$m\_2$]) can have a function of a source line. The wiring 127[$m\_1$] can be electrically connected to an output terminal of the source driver 12.

Note that the connection relation between the pixel 10 and the wiring 127[$m\_1$] and the wiring 127[$m\_2$] is not limited to the above, and the connection relation in which the wiring 127[$m\_1$] and the wiring 127[$m\_2$] are interchanged with each other may be employed.

Here, in the circuit 11, a wiring connecting the one of the source and the drain of the transistor 111, the one electrode of the capacitor 117, and the one of the source and the drain of the transistor 112 is referred to as a node NA. A wiring connecting the one of the source and the drain of the transistor 113, the other electrode of the capacitor 117, and the one of the source and the drain of the transistor 114 is referred to as a node NB. A wiring connecting the other of the source and the drain of the transistor 114, the gate of the transistor 115, and the one electrode of the capacitor 118 is referred to as a node NC. A wiring connecting the one of the source and the drain of the transistor 115, the one of the source and the drain of the transistor 116, and the wiring 127[$m\_2$] is referred to as a node ND.

In the pixel 10, a wiring connecting the one electrode of the capacitor 104, the one of the source and the drain of the transistor 101, and the circuit 21 is referred to as anode NM. A wiring connecting the other electrode of the capacitor 104, the one of the source and the drain of the transistor 102, and the one of the source and the drain of the transistor 103 is referred to as a node NE.

The node NM can be floating, and the display device included in the circuit 21 operates in accordance with the potential of the node NM.

<Description of Inversion Operation>

In the circuit 11, first, "+D" (the first data) is written to the node NA and "+V1" (e.g., a positive power supply potential) is written to the node NB. At this time, "+V1−D1" is retained in the capacitor 117.

Next, the node NB is brought into floating, and "−V1" (e.g., a negative power supply potential) is written to the node NA.

At this time, when the capacitance value of the capacitor 117 is set to $C_{117}$ and the capacitance value of the node NB is set to $C_{NB}$, the potential of the node NB becomes "+V1+($C_{117}/(C_{117}+C_{NB})$)×(−V1−D1)". Here, when the value of $C_{117}$ is made large and the value of $C_{NB}$ becomes negligible, the potential of the node NB becomes "−D1".

The potential of the node NB is supplied to the node NC through the switch (the transistor 114). The potential of the node NC is output to the node ND through the source follower circuit (the transistors 115 and 116). That is, "−D" (the second data), which is inverted data of "+D" input to the node NA first, can be output to the node ND. Although the example in which a positive potential is used as the first data is described above, a negative potential may be used.

<Description of Addition Operation (Boosting Operation)>

In the pixel 10, first, "+D" (the first data) is written to the node NM and "−D" (the second data) is written to the node NE at timings overlapping with each other. At this time, "+D−(−D)=+2D" is retained in the capacitor 117. Next, the node NM is brought into floating and "+D" is supplied to the node NE At this time, when the capacitance value of the capacitor 117 is set to $C_{117}$ and the capacitance value of the node NM is set to $C_{NM}$, the potential of the node NM becomes +D1+($C_{117}/(C_{117}+C_{NM})$)×(+D−(−D)). Here, when the value of $C_{117}$ is made large and the value of $C_{NM}$ becomes negligible, the potential of the node NM becomes "+D+(+D−(−D))"="+3D".

In other words, the third data ("+3D"), which is a potential approximately three times the output of the source driver 12, can be supplied to the node NM.

By such an action, since a voltage that is supplied from the source driver 12 in order to drive a general liquid crystal device or light-emitting device can be reduced to up to approximately ⅓. Thus, the power consumption of the display apparatus can be reduced. Alternatively, a high voltage can be generated even using a general-purpose driver IC. For example, a liquid crystal device or the like that requires a high voltage for gray level control can be driven by a general-purpose driver IC.

Furthermore, since the power supply voltage of the source driver 12 can be lowered, the power consumption of the source driver can be reduced. In addition, a plurality of circuits included in the source driver can have the same power supply voltage and the plurality of circuits can be fabricated employing common technology. Therefore, the number of fabrication steps of the source driver can be reduced, leading to cost reduction.

In one embodiment of the present invention, inverted data generated in the circuit 11 as described above is supplied to a specific pixel 10 to determine the potential of the node NM. Such an operation is performed in the pixels 10 in the same row successively, whereby the potential of the node NM of each of the pixels 10 can be determined. That is, different image data can be supplied to the pixels 10.

The node NA, the node NB, the node NC, and the node ND, the node NE, and the node NM function as storage nodes. When the transistor connected to the corresponding node is brought into conduction, data can be written to the node. When the transistor is brought into non-conduction, the data can be retained in the node. The use of a transistor with an extremely low off-state current as the transistor enables a leakage current to be reduced and the potential of the node to be retained for a long time. As the transistor, a transistor using a metal oxide in a channel formation region (hereinafter referred to as an OS transistor) can be used, for example.

Specifically, OS transistors are preferably used as any or all of the transistors 101, 102, 103, 111, 112, 113, 114, 115, and 116. An OS transistor may also be used for a component included in the circuit 21. In the case of operating within a range where the amount of leakage current is acceptable, a transistor containing Si in a channel formation region (hereinafter, Si transistor) may be used. Alternatively, an OS transistor and a Si transistor may be used together. Examples of the Si transistor include a transistor containing amorphous silicon and a transistor containing crystalline silicon (microcrystalline silicon, low-temperature polysilicon, or single crystal silicon).

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS or a CAC-OS described later can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor can have extremely low off-state current characteristics of several yA/μm (current per micrometer of a channel width). An OS transistor has features such that impact ionization, an avalanche breakdown, a short-channel effect, or the like does not occur, which are different from those of a Si transistor, and thus a highly reliable circuit can be formed. Moreover, variations in electrical characteristics due to crystallinity unevenness, which are caused in Si transistors, are less likely to occur in OS transistors.

A semiconductor layer included in the OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium). The In-M-Zn-based oxide can be formed by, for example, a sputtering method, an ALD (Atomic layer deposition) method, an MOCVD (Metal organic chemical vapor deposition) method, or the like.

In the case where an In-M-Zn-based oxide is deposited by a sputtering method, it is preferable that the atomic ratio of metal elements in a sputtering target satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the deposited semiconductor layer varies from the above atomic ratio of metal elements in the sputtering target in a range of ±40%.

An oxide semiconductor with low carrier concentration is used for the semiconductor layer. For example, the semiconductor layer can use an oxide semiconductor whose carrier concentration is lower than or equal to $1×10^{17}/cm^3$, preferably lower than or equal to $1×10^{15}/cm^3$, further preferably lower than or equal to $1×10^{13}/cm^3$, still further preferably lower than or equal to $1×10^{11}/cm^3$, even further preferably lower than $1×10^{10}/cm^3$, and higher than or equal to $1×10^{-9}/cm^3$. Such an oxide semiconductor is referred to as a highly purified intrinsic or substantially highly purified intrinsic oxide semiconductor. The oxide semiconductor has a low density of defect states and can thus be regarded as an oxide semiconductor having stable characteristics.

Note that, without limitation to these, a material with an appropriate composition may be used in accordance with required semiconductor characteristics and electrical characteristics (e.g., field-effect mobility and a threshold voltage) of the transistor. To obtain the required semiconductor characteristics of the transistor, it is preferable that the carrier concentration, the impurity concentration, the defect density, the atomic ratio between a metal element and oxygen, the interatomic distance, the density, and the like of the semiconductor layer be set to appropriate values.

When the oxide semiconductor in the semiconductor layer contains silicon or carbon, which is an element belonging to Group 14, the amount of oxygen vacancies is increased, and the semiconductor layer becomes n-type. Thus, the concentration of silicon or carbon (the concentration obtained by secondary ion mass spectrometry) in the semiconductor layer is set to $2\times10^{18}$ atoms/cm$^3$ or lower, preferably $2\times10^{17}$ atoms/cm$^3$ or lower.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to $1\times10^{18}$ atoms/cm$^3$ or lower, preferably $2\times10^{16}$ atoms/cm$^3$ or lower.

When the oxide semiconductor in the semiconductor layer contains nitrogen, electrons serving as carriers are generated and the carrier concentration increases, so that the semiconductor layer easily becomes n-type. Thus, a transistor using an oxide semiconductor that contains nitrogen is likely to be normally on. Hence, the concentration of nitrogen in the semiconductor layer (the concentration obtained by secondary ion mass spectrometry) is preferably set to $5\times10^{18}$ atoms/cm$^3$ or lower.

When hydrogen is contained in an oxide semiconductor included in the semiconductor layer, hydrogen reacts with oxygen bonded to a metal atom to be water, and thus sometimes causes an oxygen vacancy in the oxide semiconductor. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect that is an oxygen vacancy into which hydrogen enters can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration in the oxide semiconductor obtained by secondary ion mass spectrometry (SIMS) is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

Oxide semiconductors (metal oxides) can be classified into a single crystal oxide semiconductor and a non-single-crystal oxide semiconductor. Examples of the non-single-crystal oxide semiconductors include a CAAC-OS (C-Axis Aligned Crystalline Oxide Semiconductor), a polycrystalline oxide semiconductor, an nc-OS (nanocrystalline oxide semiconductor), an amorphous-like oxide semiconductor (a-like OS), and an amorphous oxide semiconductor. Among the non-single-crystal structures, an amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of the following: a region having an amorphous structure, a region having a microcrystalline structure, a region having a polycrystalline structure, a region of the CAAC-OS, and a region having a single crystal structure. The mixed film has, for example, a single-layer structure or a stacked-layer structure including two or more of the foregoing regions in some cases.

The composition of a CAC (Cloud-Aligned Composite)-OS, which is one embodiment of a non-single-crystal semiconductor layer, is described below.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state where one or more metal elements are unevenly distributed and regions containing the metal element(s) are mixed is referred to as a mosaic pattern or a patch-like pattern. The region has a size greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide in the CAC-OS may be particularly referred to as CAC-IGZO) has a composition in which materials are separated into indium oxide (hereinafter, $InO_{X1}$ (X1 is a real number greater than 0) or indium zinc oxide (hereinafter, $In_{X2}Zn_{Y2}O_{Z2}$ (X2, Y2, and Z2 are real numbers greater than 0)), and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region containing $GaO_{X3}$ as a main component and a region containing $In_{X2}Zn_{Y2}O_{Z2}$ or $InO_{X1}$ as a main component are mixed. Note that in this specification, when the atomic ratio of In to an elementMin a first region is greater than the atomic ratio of In to an elementMin a second region, for example, the first region is described as having higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a stacked-layer structure including two or more films with different atomic ratios is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are randomly dispersed in a mosaic pattern.

The CAC-OS can be formed by a sputtering method under a condition where a substrate is not heated intentionally, for example. In the case where the CAC-OS is formed by a sputtering method, one or more of an inert gas (typically, argon), an oxygen gas, and a nitrogen gas may be used as a deposition gas. The flow rate of the oxygen gas to the total flow rate of the deposition gas in deposition is preferably as low as possible; for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an out-of-plane method, which is an X-ray diffraction (XRD) measurement method. That is, it is found by the XRD measurement that there are no alignment in the a-b plane direction and no alignment in the c-axis direction in the measured areas.

In an electron diffraction pattern of the CAC-OS that is obtained by irradiation with an electron beam with a probe diameter of 1 nm (also referred to as a nanometer-sized electron beam), a ring-like region (ring region) with high luminance and a plurality of bright spots in the ring region are observed. Thus, it is found from the electron diffraction pattern that the crystal structure of the CAC-OS includes an nc (nano-crystal) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the region containing $GaO_{X3}$ as a main component and the region containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, the region containing $GaO_{X3}$ or the like as a main component and the region containing $In_{X2}Zn_{Y2}O_{Z2}$ or $InO_{X1}$ as a main component are separated to form a mosaic pattern.

The conductivity of the region containing $In_{X2}Zn_{Y2}O_{Z2}$ or $InO_{X1}$ as a main component is higher than that of the region containing $GaO_{X3}$ or the like as a main component. In other words, when carriers flow through the region containing $In_{X2}Zn_{Y2}O_{Z2}$ or $InO_{X1}$ as a main component, the conductivity of an oxide semiconductor is generated. Accordingly, when the regions containing $In_{X2}Zn_{Y2}O_{Z2}$ or $InO_{X1}$ as a main component are distributed like a cloud in an oxide semiconductor, high field-effect mobility (μ) can be achieved.

By contrast, the insulating property of the region containing $GaO_{X3}$ or the like as a main component is superior to that of the region containing $In_{X2}Zn_{Y2}O_{Z2}$ or $InO_{X1}$ as a main component. In other words, when the regions containing $GaO_{X3}$ or the like as a main component are distributed in an oxide semiconductor, leakage current can be suppressed and a favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby a high on-state current (Ion) and a high field-effect mobility (μ) can be achieved.

A semiconductor element using a CAC-OS has high reliability. Thus, the CAC-OS is suitably used as a material in a variety of semiconductor devices.

Figure 5A:
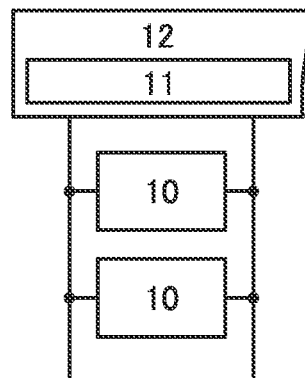
FIG. 5A to FIG. 5C are drawings illustrating display apparatuses.

Note that in the display apparatus of one embodiment of the present invention, the circuit 11 may be incorporated in the source driver 12 as illustrated in FIG. 5A. Alternatively, a stack structure including a region where the source driver 12 and the circuit 11 overlap with each other may be employed. With such a structure, the frame can be narrowed. Note that an external IC chip can be used for the source driver 12. Alternatively, the source driver 12 may be monolithically formed over a substrate with the pixel circuit.

Figure 5B:
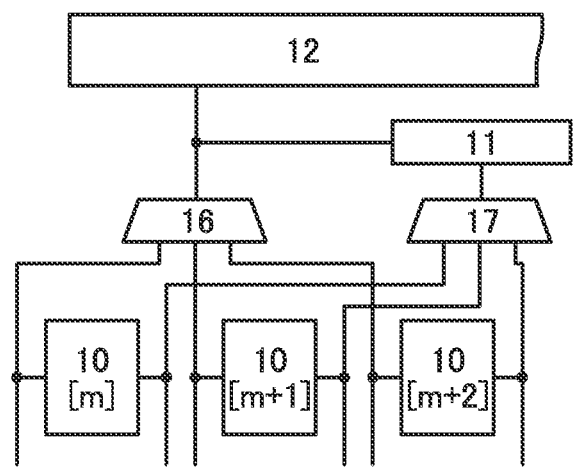

Although FIG. 1 shows the example in which the circuit 11 is provided for each column, a selection circuit 16 may be provided between the source driver 12 and the pixels 10 and a selection circuit 17 may be provided between the circuit 11 and the pixels 10 as illustrated in FIG. 5B. With such a structure, one circuit 11 can perform data writing on pixels in a plurality of columns. Moreover, the number of circuits 11 can be reduced, and the frame can be narrowed. Although FIG. 5B shows an example in which one circuit 11 performs data writing on pixels 10 in three columns (pixels [m] to [m+2]), it is not limited thereto and the number of columns is determined in the range of allowable writing time.

Figure 5C:
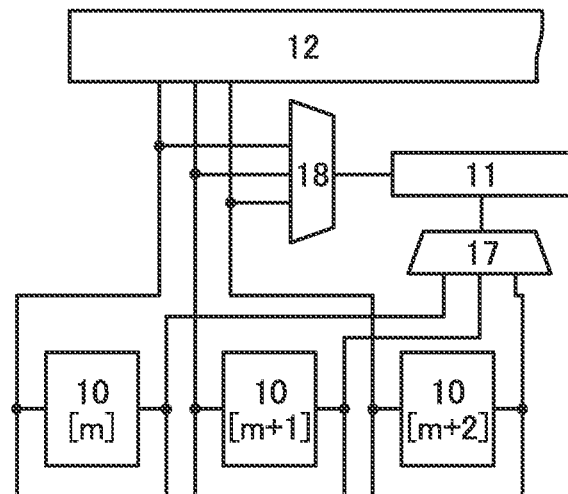

Alternatively, as illustrated in FIG. 5C, the structure in FIG. 5B may be modified into a structure in which data is supplied to the circuit 11 through the selection circuit 18.

Note that the structure in FIG. 5A may be employed for the structures in FIG. 5B and FIG. 5C.

Since the transistors 111 to 116 included in the circuit 11 are provided outside the display region 15 (see FIG. 1), the area occupied by the transistor is less likely to be limited and the channel width thereof is easily made larger than that of the transistor provided in the pixel 10. The use of a transistor with a large channel width makes it possible to shorten the charge and discharge time for the wiring 127 and to facilitate an increase in the frame frequency. Furthermore, such a transistor can be easily used in a high-resolution display including a large number of pixels with a short horizontal period.

When OS transistors are used as the transistors 111 to 116, the circuit 11 can have high reliability, and a stable operation can be performed even at a relatively high voltage. In the case where the transistors 111 to 116 are Si transistors provided in an IC chip, a higher-speed operation can be performed. Even in the case where the transistors 111 to 116 are provided in an IC chip, the transistors may be OS transistors.

<Modification Example of Display Apparatus>

Figure 6C:
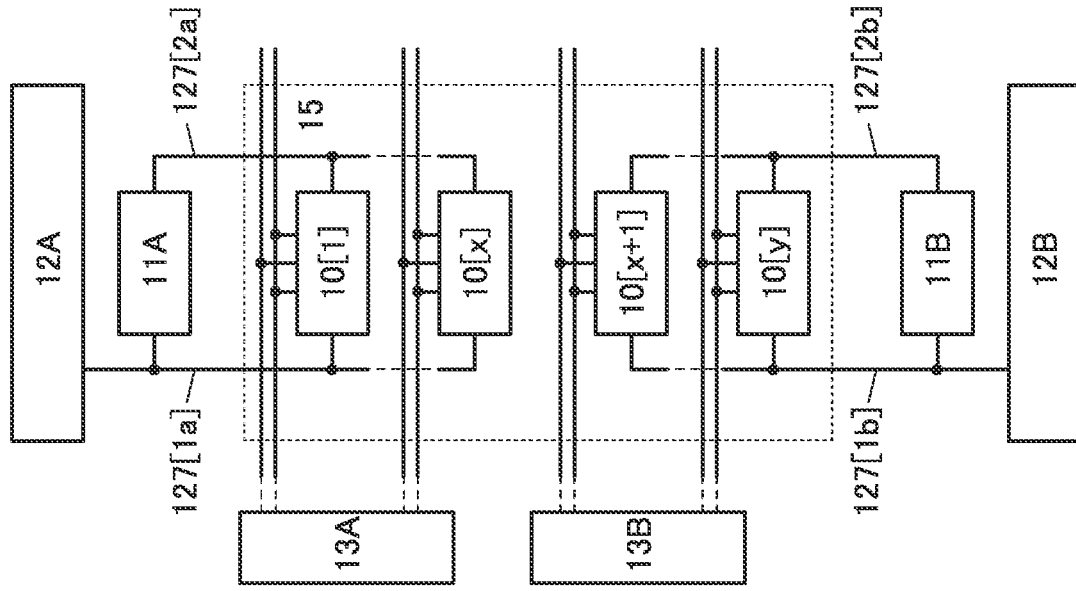
FIG. 6A to FIG. 6C are drawings illustrating display apparatuses.
Figure 6B:
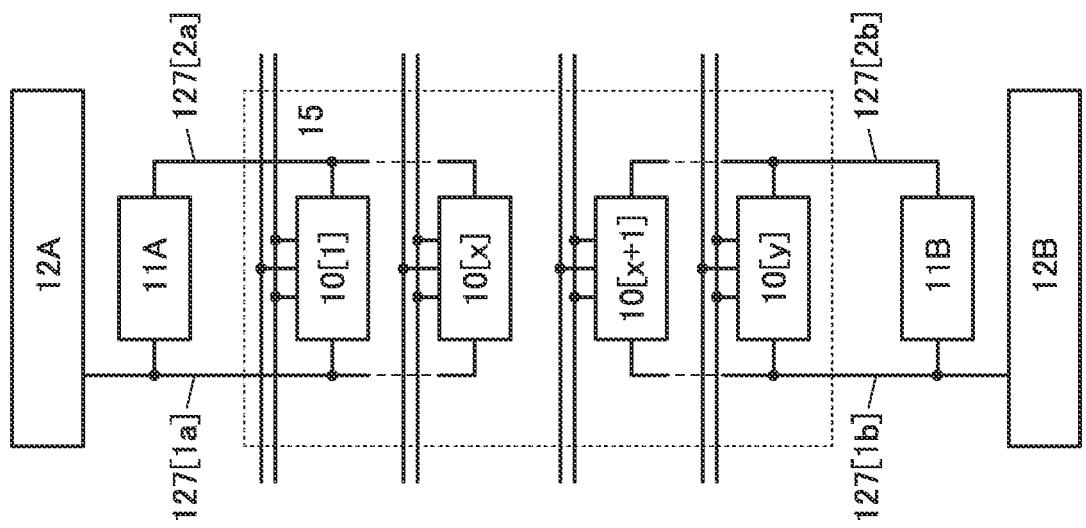
Figure 6A:
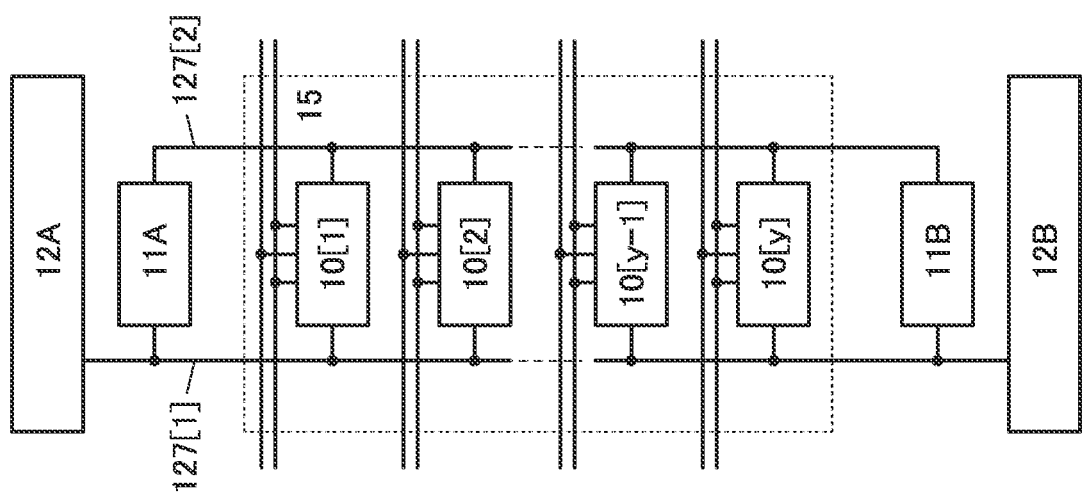

The source driver 12 and the circuit 11 may be provided not only on one end side of the display region 15 but also on the opposite end side, as illustrated in FIG. 6A, FIG. 6B, and FIG. 6C.

Here, the circuit 11 provided on one end side of the display region 15 is a circuit 11A. The circuit 11A is electrically connected to a source driver 12A. The circuit 11 provided on the opposite end side of the display region 15 is a circuit 11B. The circuit 11B is electrically connected to a source driver 12B.

With such a structure, the wirings 127[1] and 127[2] can be charged and discharged at high speed, and a display apparatus including a large number of pixels with a short horizontal period, a large-sized display apparatus including the wiring 127 with high parasitic capacitance, or the like can be easily achieved.

Alternatively, as illustrated in FIG. 6B, the source driver 12A and the circuit 11A may be electrically connected to a pixel 10[1] to a pixel 10[x] (x is a natural number greater than or equal to 2, e.g., the substantially medium value of a row), and the source driver 12B and the circuit 11B may be electrically connected to a pixel 10[x+1] to a pixel 10[y] (y is the last value of a row).

The source driver 12A and the circuit 11A perform charge and discharge of wirings 127[1a] and 127[2a], and the source driver 12B and the circuit 11B perform charge and discharge of wirings 127[1b] and 127[2b]. When the wiring 127 is divided in such a manner, charge and discharge of the wiring 127 can be performed at high speed and accordingly high-speed driving becomes easy to deal with.

Alternatively, as illustrated in FIG. 6C, a plurality of gate drivers (the gate drivers 13A and 13B) may be provided. When a plurality of source drivers and a plurality of gate drivers are used, the divided wirings 127 can be charged and discharged in parallel, so that writing time is easily ensured.

FIG. 6B and FIG. 6C each show a structure for performing what is called division driving, and data writing is easily performed even in a display apparatus with a large number of pixels and a short horizontal period.

<Operation Example of Inverter Circuit>

Figure 7:
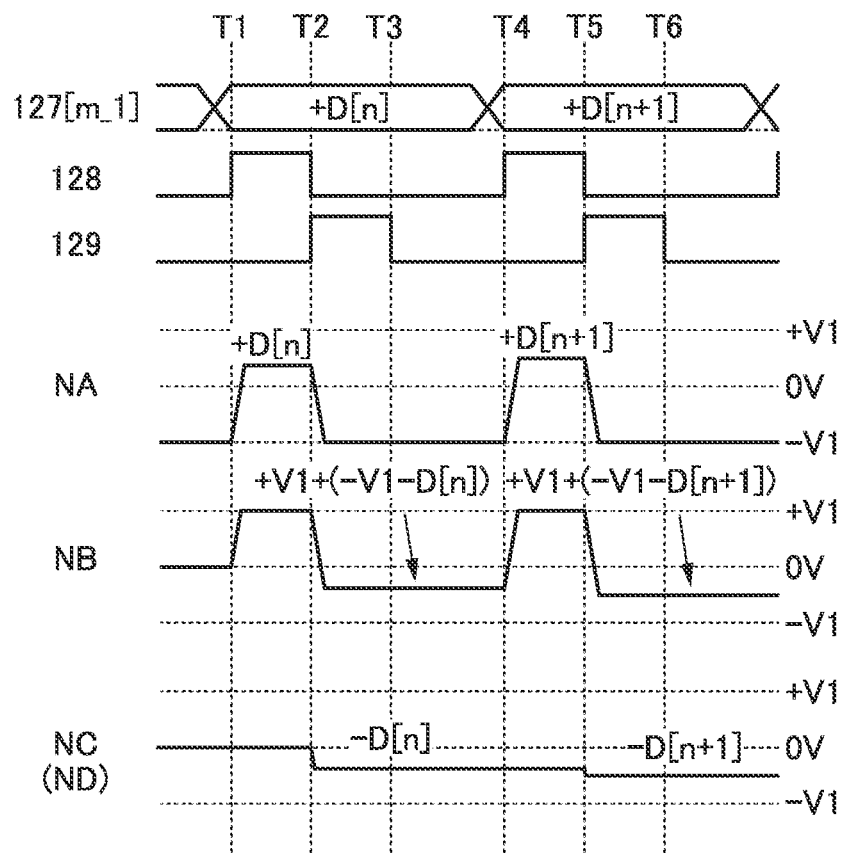
FIG. 7 is a timing chart showing the operation of an inverter circuit.
Figure 8A:
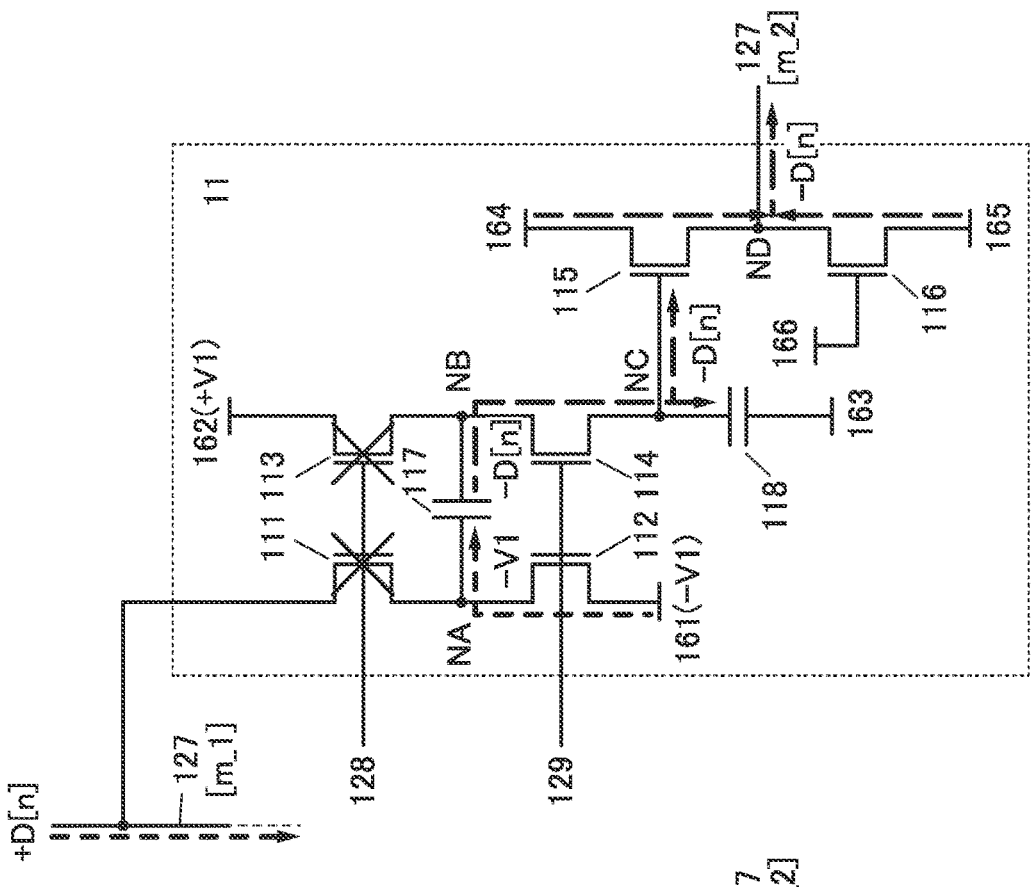
FIG. 8A and FIG. 8B are drawings illustrating a circuit operation.
Figure 8B:
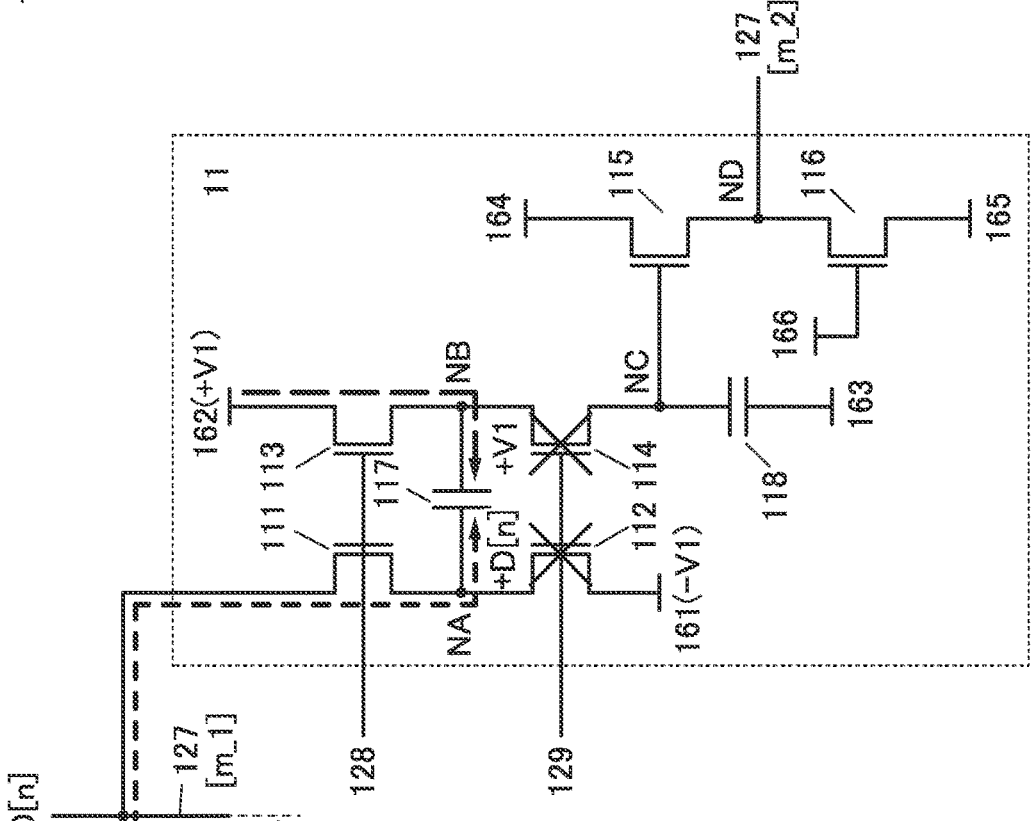

Next, the detail of the inversion operation in the circuit 11 will be described with reference to a timing chart shown in FIG. 7 and diagrams that are shown in FIG. 8A and FIG. 8B and illustrate a circuit operation.

Note that in the following description, a high potential is represented by "H" and a low potential is represented by "L". The first data supplied from the source driver 12 is represented by "+D", a negative power supply potential supplied from the wiring 161 is represented by "−V1", and a positive power supply potential supplied from the wiring 162 is represented by "+V1". In addition, "+D[n]" represents data of a pixel in the n-th row and "+D[n+1]" represents data of a pixel in the n+1-th row.

Note that in potential distribution, potential coupling, or potential loss, detailed changes due to a circuit structure, operation timing, or the like are not considered. In addition, a potential change due to capacitive coupling using the capacitor depends on the capacitance ratio of the capacitor to a component connected to the capacitor; however, for clarity of description, the capacitance value of the component is assumed to be sufficiently small.

At Time T1, "+D[n]" is supplied to the wiring 127[m_1], the potential of the wiring 128 is set to "H", and the potential of a wiring 129[n] is set to "L", whereby the transistors 111 and 113 are brought into conduction and the potential of the node NA becomes "+D[n]" and the potential of the node NB becomes "+V1" (see FIG. 8A). At this time, "+V1−D[n]" is retained in the capacitor 117.

At Time T2, the potential of the wiring 128 is set to "L" and the potential of the wiring 129 is set to "H", whereby the transistors 111 and 113 are brought into non-conduction and the transistors 112 and 114 are brought into conduction. At this time, the potential of the node NA becomes "−V1", and the potential of the node NB becomes "+V1+(−V1−D[n])"="−D[n]" by capacitive coupling of the capacitor 117.

The potential of the node NC becomes "−D[n]" through the transistor 114. The potential of the node NC is read out to the node ND by the source follower circuit including the transistor 115 and the transistor 116. That is, the circuit 11 can output "−D[n]" (the second data), which is obtained by inverting "+D[n]" (the first data) input from the wiring 127[m_1], to the wiring 127[m_2] (see FIG. 8B).

At Time T3, the potential of the wiring 128 is set to "L" and the potential of the wiring 129 is set to "L", whereby the transistors 112 and 114 are brought into non-conduction and the potential of the node NC is retained. That is, "−D[n]" output to the wiring 127[m_2] is retained.

From Time T4 to T6, an operation of generating inverted data "−D[n+1]" by supplying "+D[n+1]" to the wiring 127[m_1] is performed. As described above, inversion data of input data can be generated in the circuit 11.

<Operation Example of Pixel Circuit>

Figure 9:
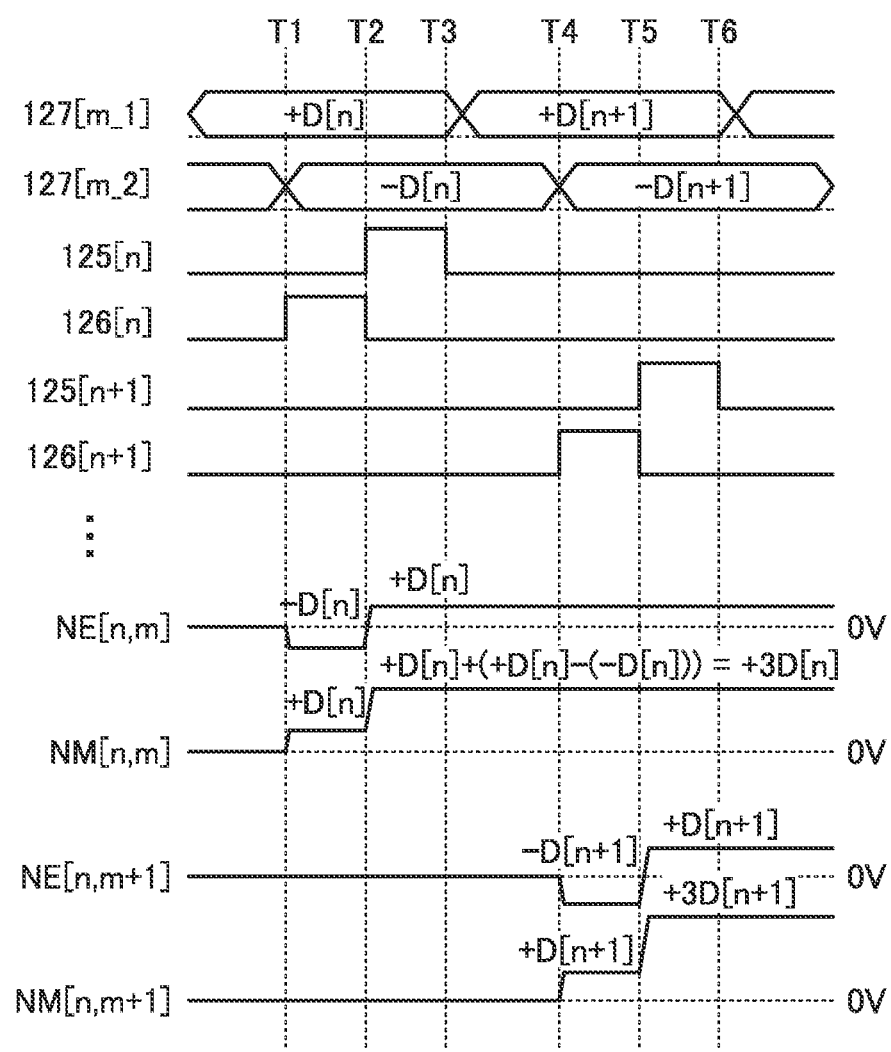
FIG. 9 is a timing chart showing the operation of a pixel.
Figure 10A:
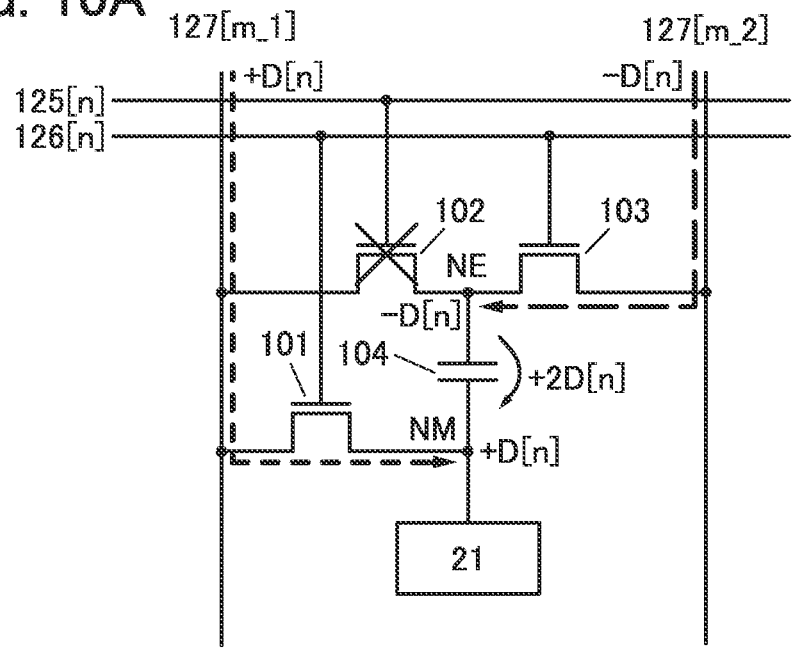
FIG. 10A and FIG. 10B are drawings illustrating a circuit operation.
Figure 10B:
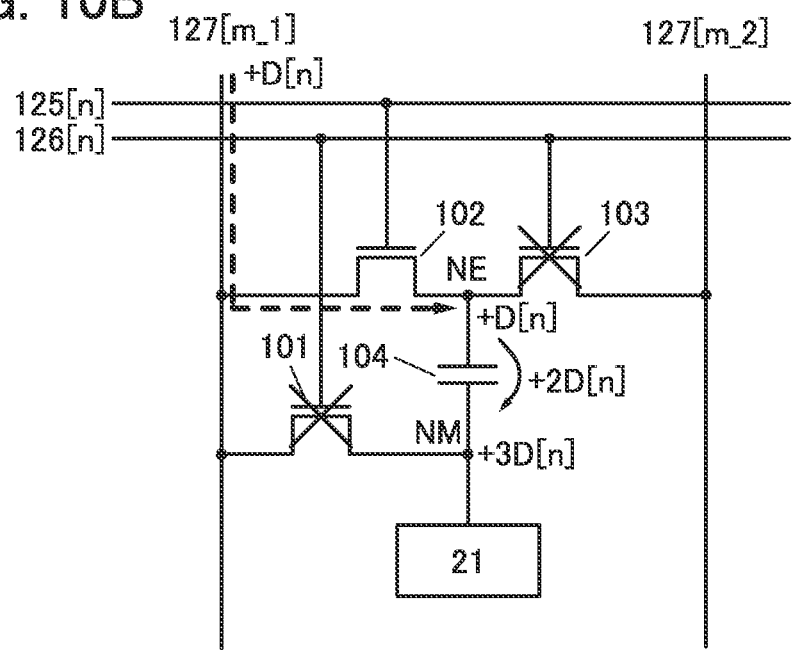

Next, a method for supplying, to the display device of the pixel 10, a data potential that is approximately three times a data potential output by the source driver 12 will be described with reference to a timing chart shown in FIG. 9 and diagrams that are shown in FIG. 10A and FIG. 10B and illustrate a circuit operation. Note that the description of an operation of generating the second data supplied to the pixel 10 is omitted.

At Time T1, "+D[n]" is supplied to a wiring 127[m,1], "−D[n]" is supplied to a wiring 127[m,2], the potential of the wiring 125[n] is set to "L", and the potential of the wiring 126[n] is set to "H", whereby the transistors 101 and 103 are brought into conduction, the potential of the node NM becomes "+D[n]", and the potential of the node NE becomes "−D[n]". At this time, "+2D[n]" is retained in the capacitor 104 (see FIG. 10A).

At Time T2, the potential of the wiring 125 [n] is set to "H" and the potential of the wiring 126[n] is set to "L", whereby the transistor 101 is brought into non-conduction and the node NM is brought into floating. In addition, the transistor 103 is brought into non-conduction, the transistor 102 is brought into conduction, and the potential of the node NE is rewritten from "−D[n]" to "+D[n]". The amount of change is added to the potential of the node NM in accordance with the capacitance ratio of the capacitor 104 to the node NM, and the potential of the node NM becomes "+D[n]+(+D[n]−(−D[n]))"="+3D[n]" (see FIG. 10B).

At Time T3, the potential of the wiring 125 [n] is set to "L" and the potential of the wiring 126[n] is set to "L", whereby the transistor 102 is brought into non-conduction and the potentials of the node NE and the node NM are retained.

From Time T4 to T6, "+D[n+1]" is supplied to the wiring 127[m,1], "−D[n+1]" is supplied to the wiring 127[m,2], and an operation similar to the above is performed, whereby a writing operation is performed on the pixel [n+1,m]

In the pixel 10, a voltage that is approximately three times a voltage supplied from the source driver 12 can be supplied to the display device by the above-described operation.

MODIFICATION EXAMPLE 1

Figure 11A:
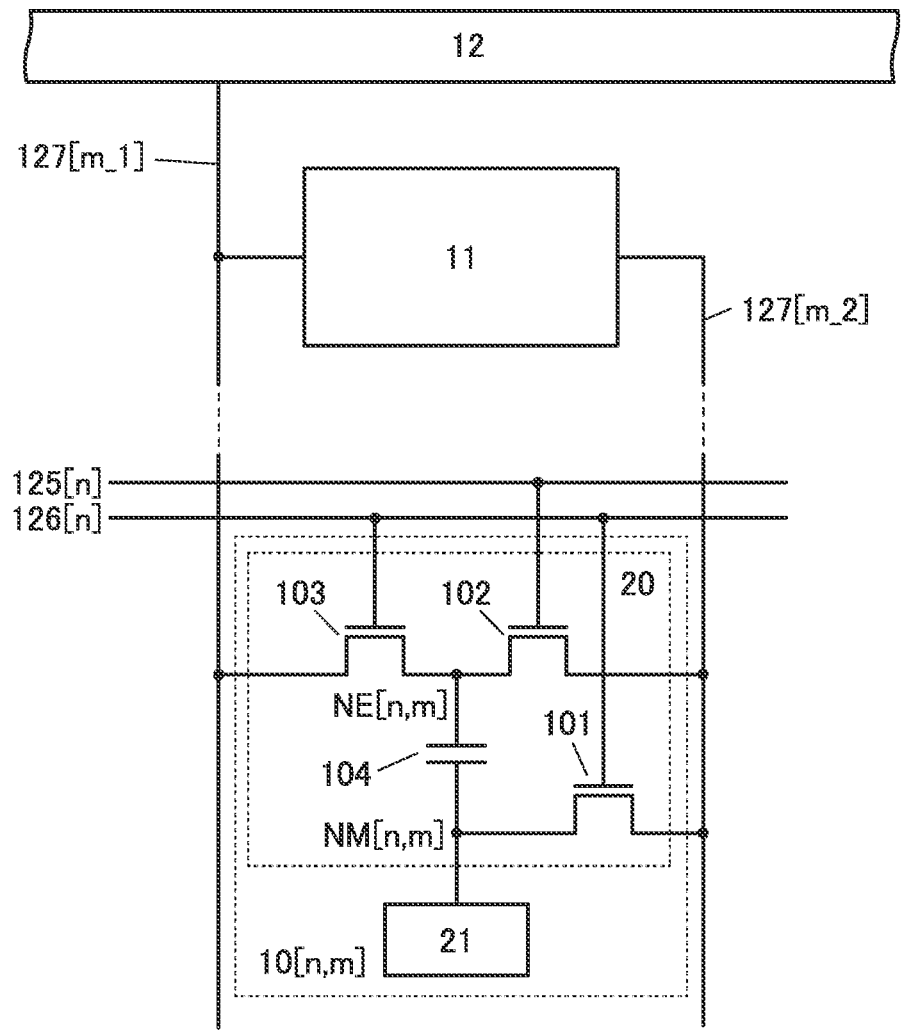
FIG. 11A is a diagram illustrating an inverter circuit and a pixel.

The structure illustrated in FIG. 11A is a structure in which the connection relation between the pixel 10 and the two source lines is changed. The other of the source and the drain of the transistor 103 is electrically connected to the wiring 127[m_1]. The other of the source and the drain of the transistor 101 and the other of the source and the drain of the transistor 102 are electrically connected to the wiring 127[m_2].

In the writing operation on the pixel 10 with the structure illustrated in FIG. 2, the first data supplied from the source driver 12 and the second data supplied from the circuit 11 are written concurrently in the first operation, and the first data is written again in the second operation. In that case, the output of the first data needs to be maintained until the second operation, so that the standby time of the circuit 11 is generated.

Figure 11B:
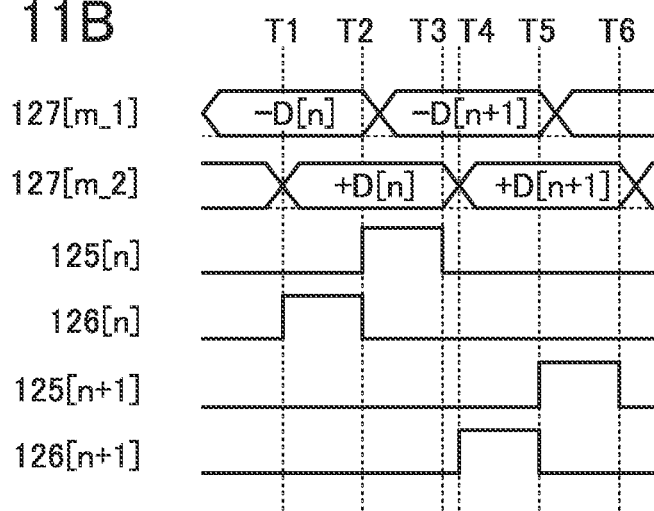
FIG. 11B is a timing chart showing operations of the inverter circuit and the pixel.

Meanwhile, in the writing operation on the pixel 10 with the structure illustrated in FIG. 11A, the first data and the second data are written concurrently in the first operation, and the second data is written in the second operation. With this structure, as shown in a timing chart in FIG. 11B, time for writing data to pixels in the n-th row and a period for generating inverted data for pixels in the n+1-th row in the circuit 11 can overlap with each other. Therefore, even when the number of pixels is large and a horizontal period is short, sufficient writing time can be ensured. In contrast, even when a horizontal period is short, writing can be performed.

MODIFICATION EXAMPLE 2

Figure 12:
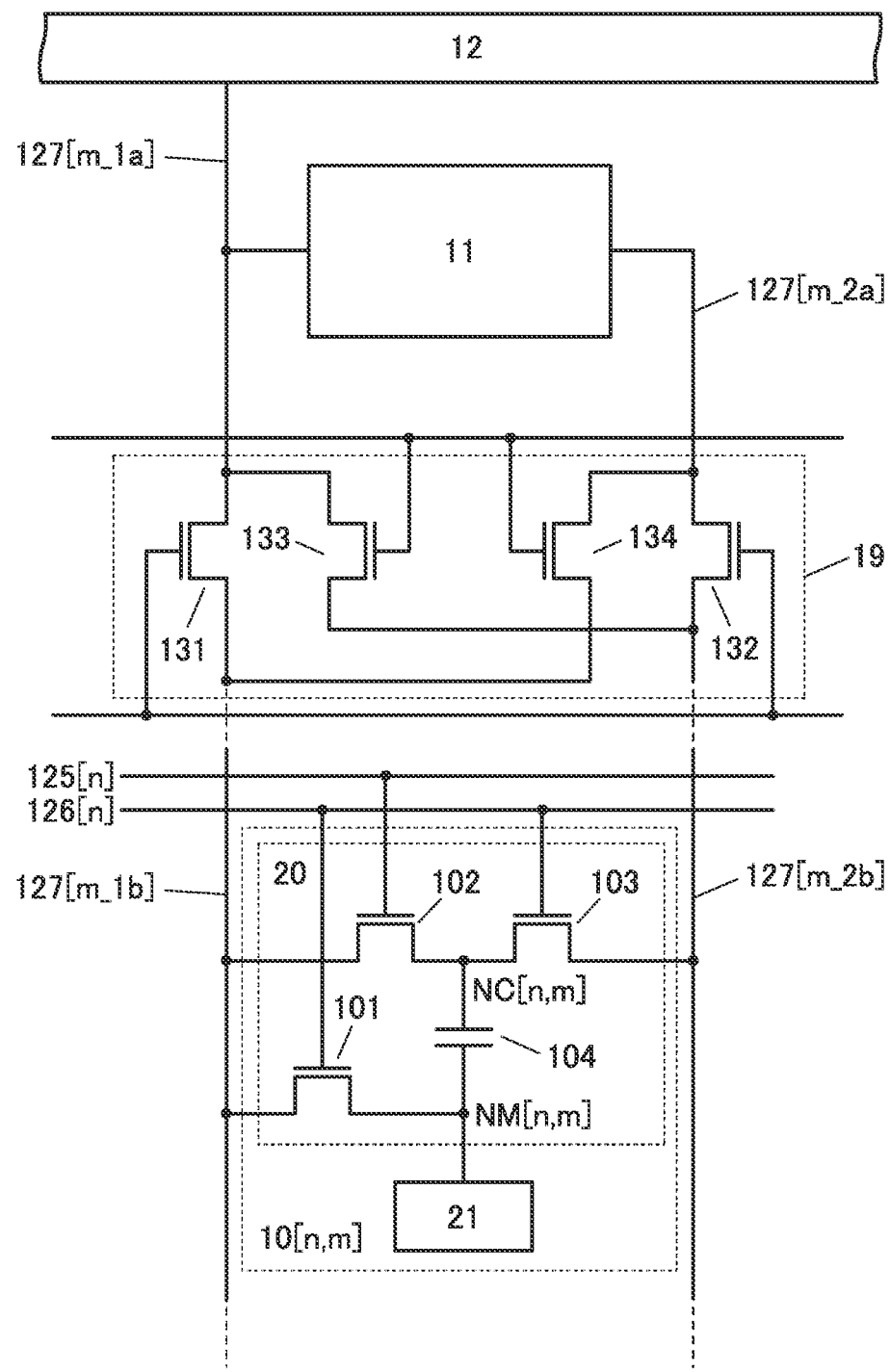
FIG. 12 is a diagram illustrating an inverter circuit, a selection circuit, and a pixel.

FIG. 12 illustrates a structure in which a selection circuit 19 is provided between the source driver 12 and the circuit 11, and the pixel 10.

The selection circuit 19 can have a structure including a transistor 131, a transistor 132, a transistor 133, and a transistor 134. One of a source and a drain of the transistor 131 is electrically connected to one of a source and a drain of the transistor 133. The other of the source and the drain of the transistor 133 is electrically connected to one of a source and a drain of the transistor 132. The other of the source and the drain of the transistor 132 is electrically connected to one of a source and a drain of the transistor 134. The other of the source and the drain of the transistor 134 is electrically connected to the other of the source and the drain of the transistor 131.

The one of the source and the drain of the transistor 131 is electrically connected to a wiring 127[m_1a]. The wiring 127[m_1a] is electrically connected to the output terminal of the source driver 12. The other of the source and the drain of the transistor 132 is electrically connected to a wiring 127[m_2a]. The wiring 127[m_2a] is electrically connected to an output terminal of the circuit 11.

Figure 13A:
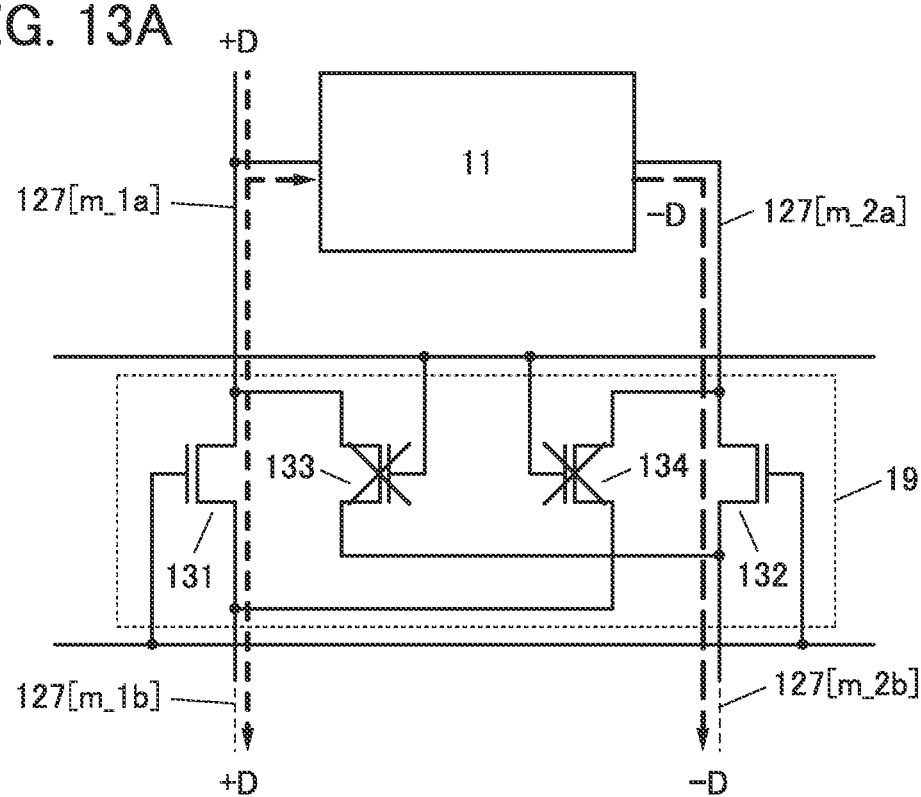
FIG. 13A and FIG. 13B are drawings illustrating a circuit operation.

The transistors 131 and 132 are brought into conduction and the transistors 133 and 134 are brought into non-conduction in the selection circuit 19, whereby the data "+D" output to the wiring 127[m_1a] can be output to a wiring 127[m_1b] and the data "−D" output to the wiring 127[m_2a] can be output to a wiring 127[m_2b] as illustrated in FIG. 13A.

Figure 13B:
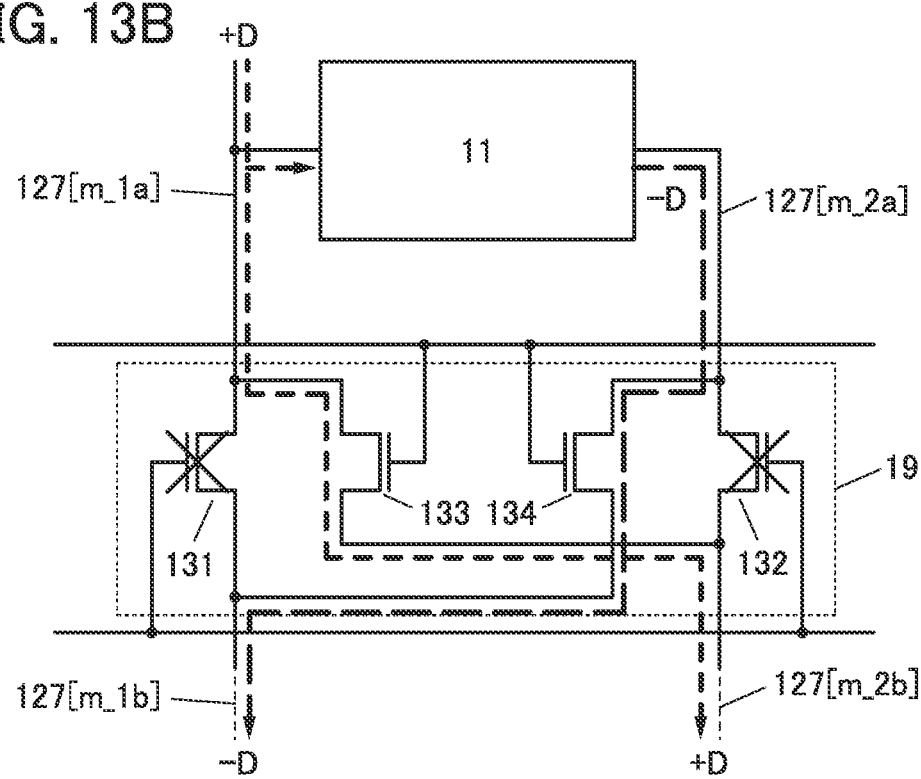

The transistors 131 and 132 are brought into non-conduction and the transistors 133 and 134 are brought into conduction, whereby the data "+D" output to the wiring 127[m_1a] can be output to the wiring 127[m_2b] and the data "−D" output to the wiring 127[m_1b] can be output to the wiring 127[m_2a] as illustrated in FIG. 13B.

The above-described operation is effective in the inversion operation (positive polarity operation and negative polarity operation) of a liquid crystal device. Note that since the circuit 11 can generate inverted data, a potential that can be output from the source driver may be one of a positive potential and a negative potential. Thus, a source driver with a simplified function can be used. The circuit structure of the source driver with a simplified function can be simplified, so that manufacturing costs and a chip area can be reduced. Consequently, the costs of a display apparatus can also be reduced.

MODIFICATION EXAMPLE 3

Figure 14:
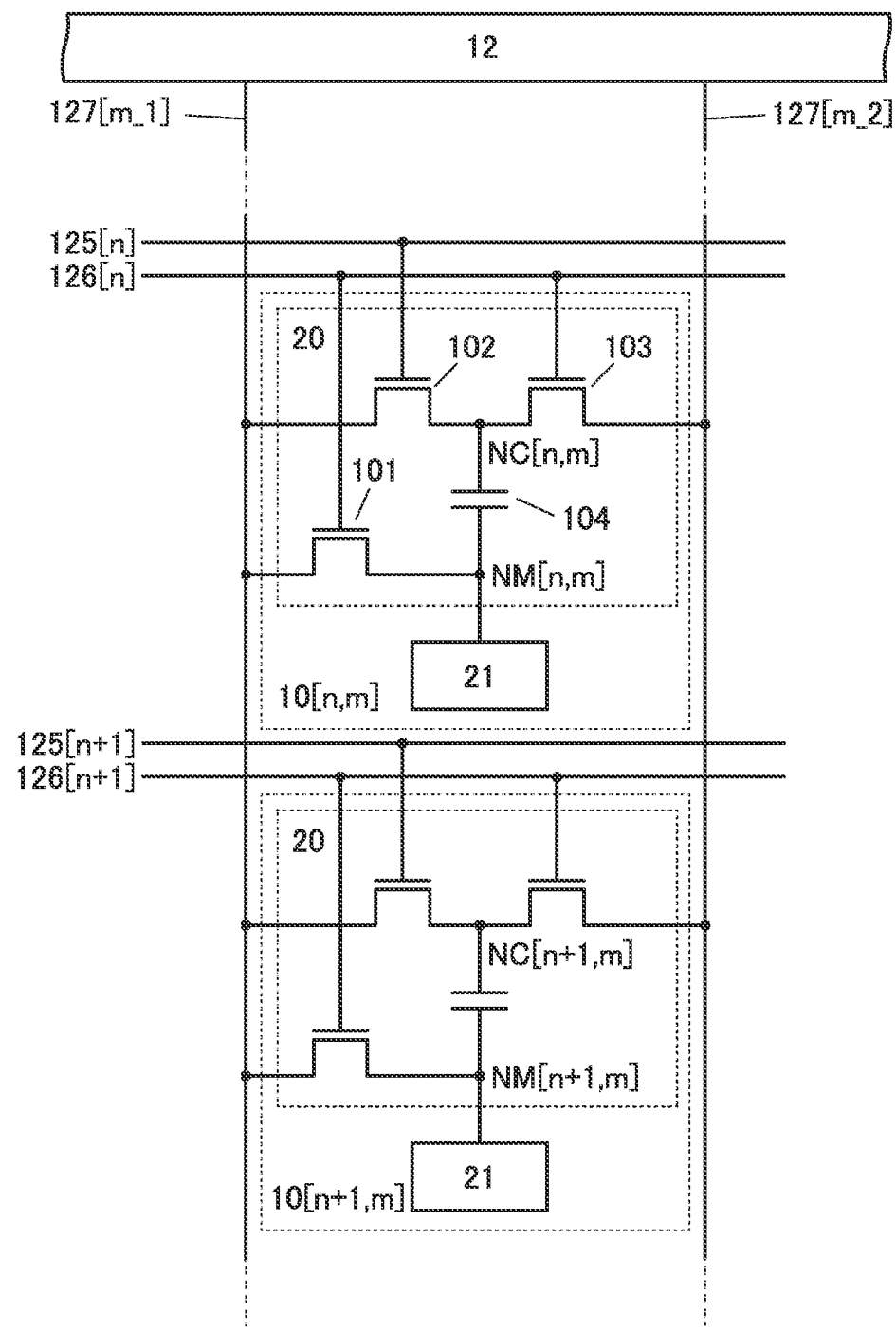
FIG. 14 is a diagram illustrating a structure in which an inverter circuit is omitted.

In the case where the source driver 12 has a function of being capable of outputting the first data and the second data, which is inverted data of the first data, a structure in which the circuit 11 is omitted as illustrated in FIG. 14 may be employed. Note that Modification examples 1 to 3 described above can be combined with each other.

<Circuit 21>

FIG. 15A to FIG. 15D each show an example of a structure including a liquid crystal device as the display device, which can be applied to the circuit 21.

Figure 15A:
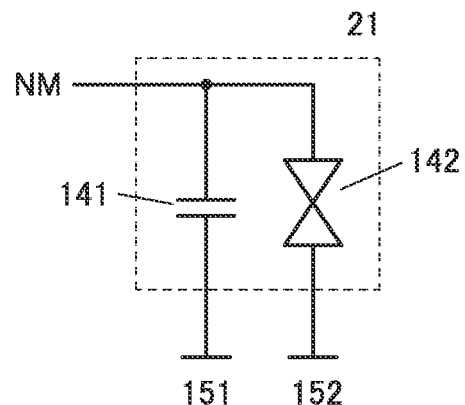
FIG. 15A to FIG. 15D are diagrams illustrating circuits each including a display device.

The structure illustrated in FIG. 15A includes a capacitor 141 and a liquid crystal device 142. One electrode of the liquid crystal device 142 is electrically connected to one electrode of the capacitor 141. The one electrode of the capacitor 141 is electrically connected to the node NM.

The other electrode of the capacitor 141 is electrically connected to a wiring 151. The other electrode of the liquid crystal device 142 is electrically connected to a wiring 152. The wirings 151 and 152 have a function of supplying power. The wirings 151 and 152 are capable of supplying a reference potential such as GND or 0 V or a given potential, for example.

Figure 15B:
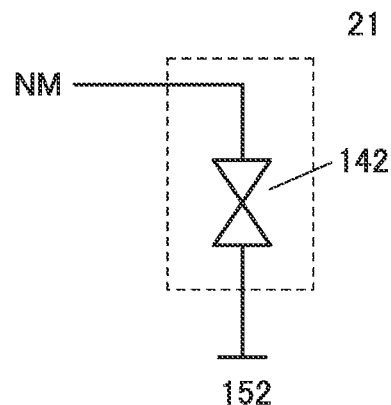

Note that a structure in which the capacitor 141 is omitted may be employed as illustrated in FIG. 15B. As described above, an OS transistor can be used as the transistor connected to the node NM. Since an OS transistor has an extremely low leakage current, an image can be displayed for a comparatively long time even when the capacitor 141 functioning as a storage capacitor is omitted. In addition, regardless of the transistor structure, omitting the capacitor 141 is effective in the case where a high-speed operation allows a shorter display period as in field-sequential driving. The aperture ratio can be improved by omitting the capacitor 141. Alternatively, the transmittance of the pixel can be improved.

In the structures illustrated in FIG. 15A and FIG. 15B, the operation of the liquid crystal device 142 is started when the potential of the node NM becomes higher than or equal to the operation threshold of the liquid crystal device 142. Thus, a display operation is started in some cases before the potential of the node NM is determined. In a transmissive liquid crystal display apparatus, however, even when an unnecessary display operation is performed, visual recognition can be inhibited by performing an operation of turning off a backlight until the potential of the node NM is determined, for example.

Figure 15C:
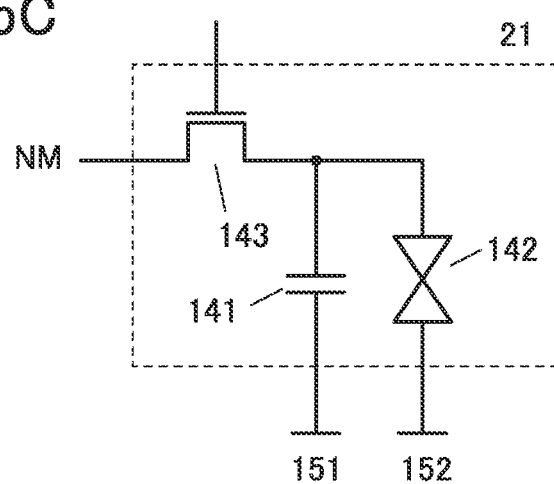

FIG. 15C illustrates a structure in which a transistor 143 is added to the structure of FIG. 15A. One of a source and a drain of the transistor 143 is electrically connected to the one electrode of the capacitor 141. The other of the source and the drain of the transistor 143 is electrically connected to the node NM.

In this structure, the potential of the node NM is applied to the liquid crystal device 142 when the transistor 143 is brought into conduction. Thus, the operation of the liquid crystal device 142 can be started at any time after the potential of the node NM is determined.

Figure 15D:
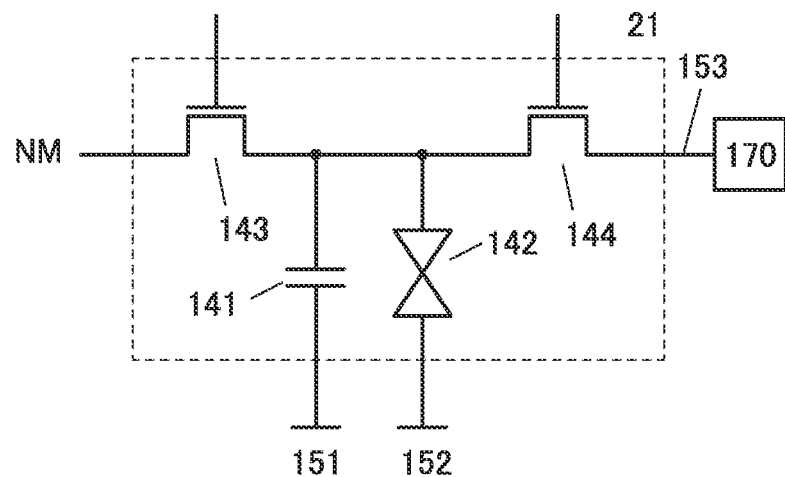

FIG. 15D illustrates a structure in which a transistor 144 is added to the structure of FIG. 15C. One of a source and a drain of the transistor 144 is electrically connected to the one electrode of the liquid crystal device 142. The other of the source and the drain of the transistor 144 is electrically connected to the wiring 153.

The circuit 170 electrically connected to the wiring 153 can have a function of resetting the potentials supplied to the capacitor 141 and the liquid crystal device 142.

FIG. 16A to FIG. 16D each show an example of a structure including a light-emitting device as the display device, which can be applied to the circuit 21.

Figure 16A:
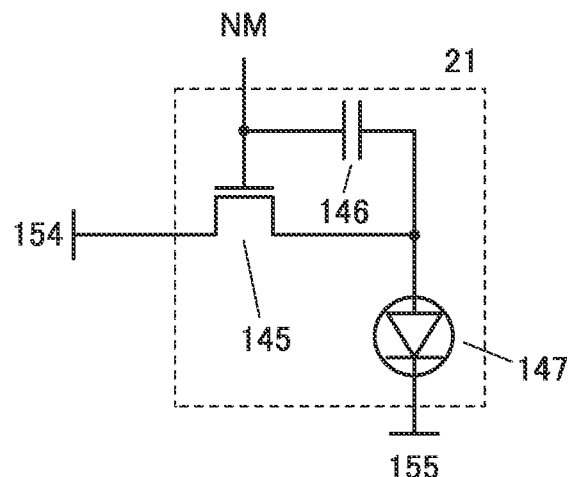
FIG. 16A to FIG. 16D are diagrams illustrating circuits each including a display device.

The structure illustrated in FIG. 16A includes a transistor 145, a capacitor 146, and a light-emitting device 147. One of a source and a drain of the transistor 145 is electrically connected to one electrode of the light-emitting device 147. The one electrode of the light-emitting device 147 is electrically connected to one electrode of the capacitor 146. The other electrode of the capacitor 146 is electrically connected to a gate of the transistor 145. The gate of the transistor 145 is electrically connected to the node NM.

The other of the source and the drain of the transistor 145 is electrically connected to a wiring 154. The other electrode of the light-emitting device 147 is electrically connected to a wiring 155. The wirings 154 and 155 have a function of supplying power. For example, the wiring 154 is capable of supplying a high potential power. The wiring 155 is capable of supplying a low potential power.

In the structure illustrated in FIG. 16A, current flows through the light-emitting device 147 when the potential of the node NM becomes higher than or equal to the threshold voltage of the transistor 111.

Figure 16B:
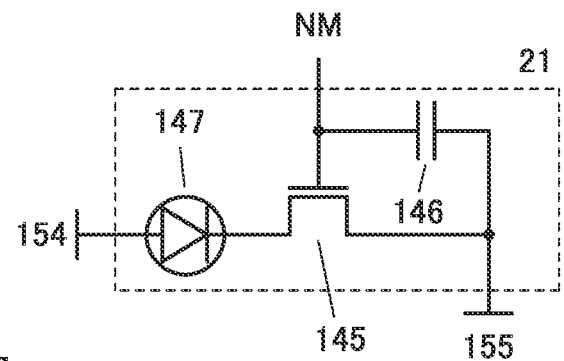

Alternatively, as illustrated in FIG. 16B, one electrode of the light-emitting device 147 may be electrically connected to the wiring 154, and the other electrode of the light-emitting device 147 may be electrically connected to the other of the source and the drain of the transistor 145. This structure can also be applied to other circuits 21 each including the light-emitting device 147.

Figure 16C:
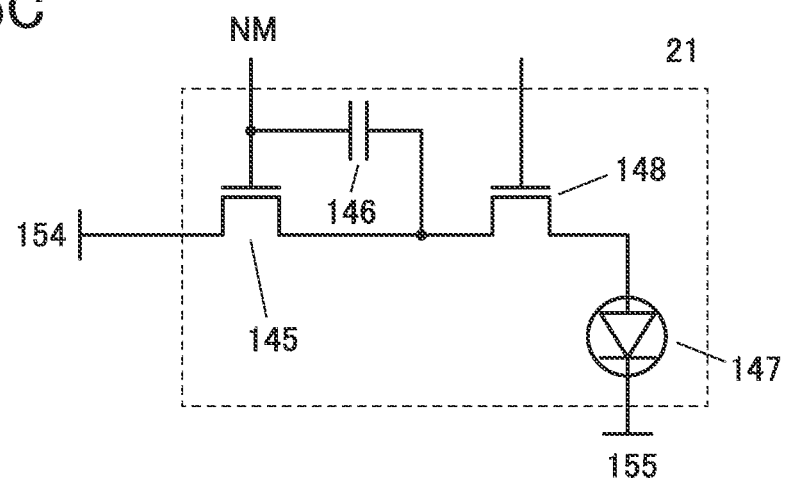

FIG. 16C is a structure in which a transistor 148 is added to the structure of FIG. 16A. One of a source and a drain of the transistor 148 is electrically connected to the one of the source and the drain of the transistor 145. The other of the source and the drain of the transistor 148 is electrically connected to the one electrode of the light-emitting device 147.

In this structure, current flows through the light-emitting device 147 when the potential of the node NM is higher than or equal to the threshold voltage of the transistor 111 and the transistor 148 is brought into conduction. Thus, light emission of the light-emitting device 147 can be started at any time after the potential of the node NM is determined.

Figure 16D:
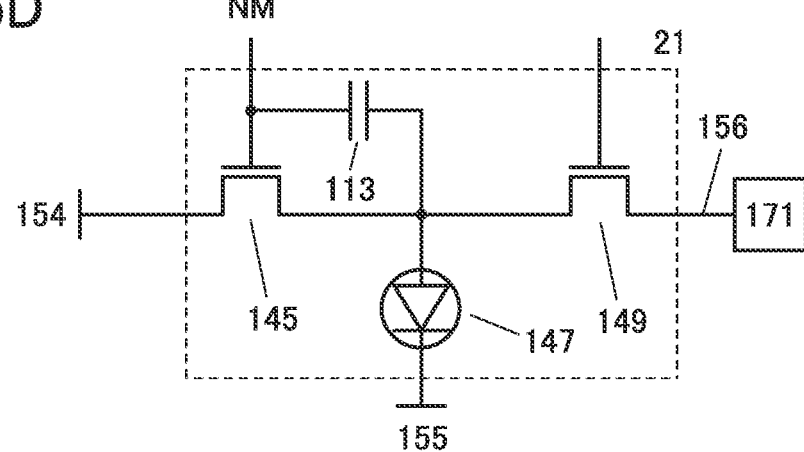

FIG. 16D is a structure in which a transistor 149 is added to the structure of FIG. 16A. One of a source and a drain of the transistor 149 is electrically connected to the one of the source and the drain of the transistor 145. The other of the source and the drain of the transistor 149 is electrically connected to a wiring 156.

The wiring 156 can be electrically connected to a supply source of a certain potential such as a reference potential. When a certain potential is supplied from the wiring 156 to the one of the source and the drain of the transistor 145, write of image data can be stable. Furthermore, the timing of light emission of the light-emitting device 147 can be controlled.

In addition, the wiring 156 can be connected to a circuit 171 and can also have a function of a monitor line. The circuit 171 can have one or more of a function of the supply source of a certain potential, a function of obtaining electric characteristics of the transistor 145, and a function of generating correction data.

<Modification Example of Transistor>

Figure 17A:
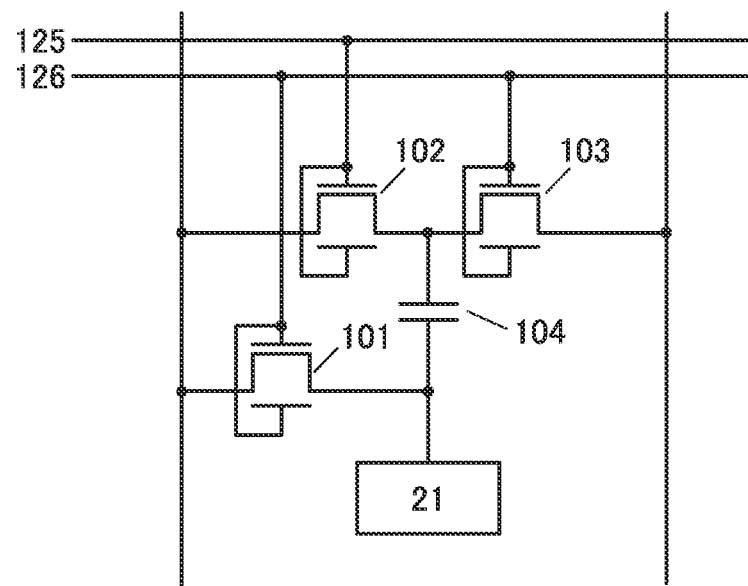
FIG. 17A and FIG. 17B are diagrams illustrating a pixel.

As illustrated in FIG. 17A as an example, a transistor provided with a back gate may be used in the circuit of one embodiment of the present invention. FIG. 17A illustrates a structure in which back gates are electrically connected to front gates, which has an effect of increasing on-state currents. Alternatively, a structure in which the back gates are electrically connected to wirings capable of supplying a constant potential may be employed. This structure enables control of the threshold voltages of the transistors. The transistors included in the circuit 11 and the circuit 21 may also have back gates.

In the pixel 10, the transistors 101 and 102 have a function of rapidly charging and discharging the capacitor 104 with a relatively large capacitance value. The transistor 103 has a function of charging combined capacitance C of the capacitor 104 and the circuit 21. When the capacitance value of the capacitor 104 is represented by $C_{104}$ and the capacitance value of the circuit 21 is represented by $C_{21}$, the combined capacitance C is represented by $C_{104} \times (C_{21}/(C_{104}+C_{21}))$, i.e., a value smaller than $C_{104}$.

Figure 17B:
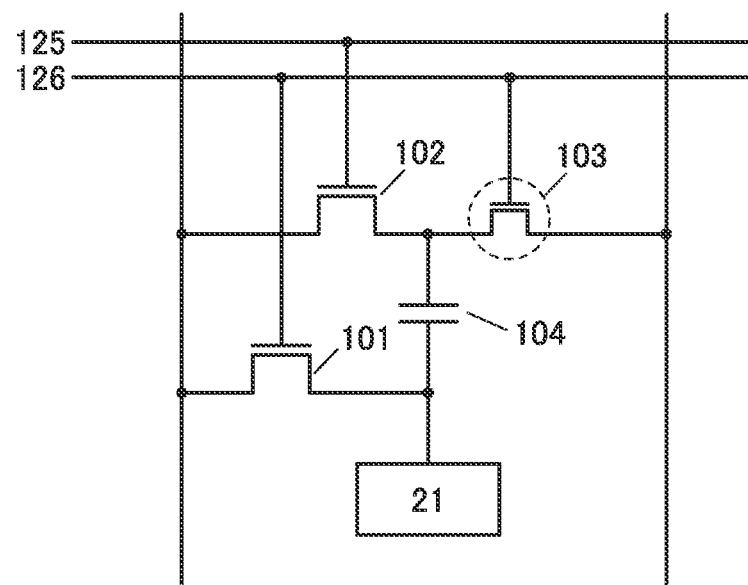

Therefore, as in a conceptual diagram illustrated in FIG. 17B, a transistor having lower current supply capability than the transistors 101 and 102 can be used as the transistor 103. Specifically, the channel width of the transistor 103 can be smaller than the channel widths of the transistors 101 and 102. Accordingly, aperture ratio can be increased compared to the case of fabrication using transistors having the same size.

<Simulation Results>

Figure 18:
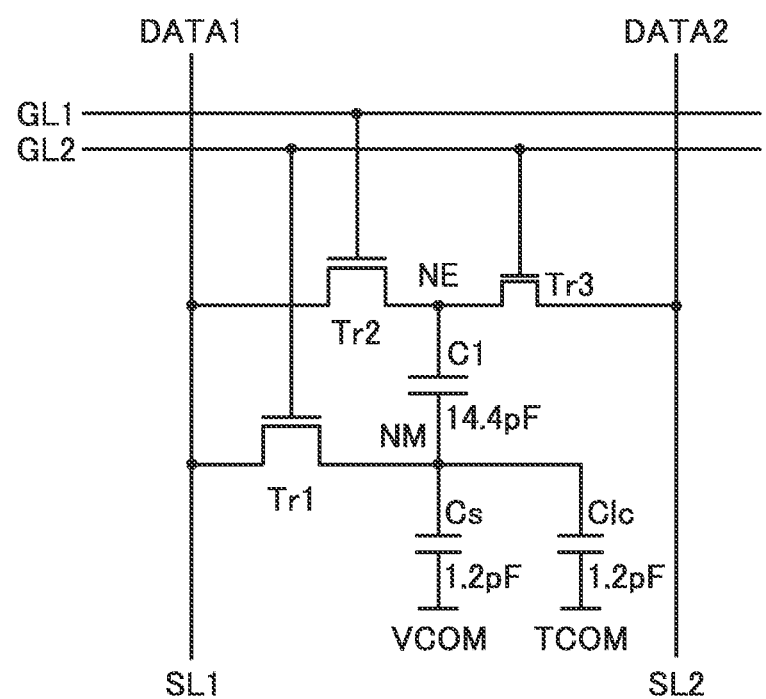
FIG. 18 is a diagram illustrating a circuit used for simulation.

Next, simulation results of a pixel operation are described. FIG. 18 illustrates a structure of the pixel 10 used for the simulation. A structure that is based on the circuit structure illustrated in FIG. 2 and includes a liquid crystal device (Clc) and a capacitor (Cs) for the circuit 21 was employed. The simulation was performed on a change in the voltage of the node NM during the operation of making an input voltage approximately three times higher.

Parameters used in the simulation are as follows: the transistor sizes are L/W=3 µm/60 µm (transistors Tr1 and Tr2) and L/W=3 µm/30 µm (a transistor Tr3)); the capacitance value of a capacitor C1 is 14.4 pF; the capacitance value of a capacitor Cs is 1.2 pF; and the capacitance value of the liquid crystal element Clc is 1.2 pF. Voltages applied to gate lines GL1 and GL2 are +26 V as "H" and −21 V as "L". In addition, the potentials of VCOM and TCOM (a common voltage) were each +8 V. Note that SPICE was used as circuit simulation software.

Figure 19:
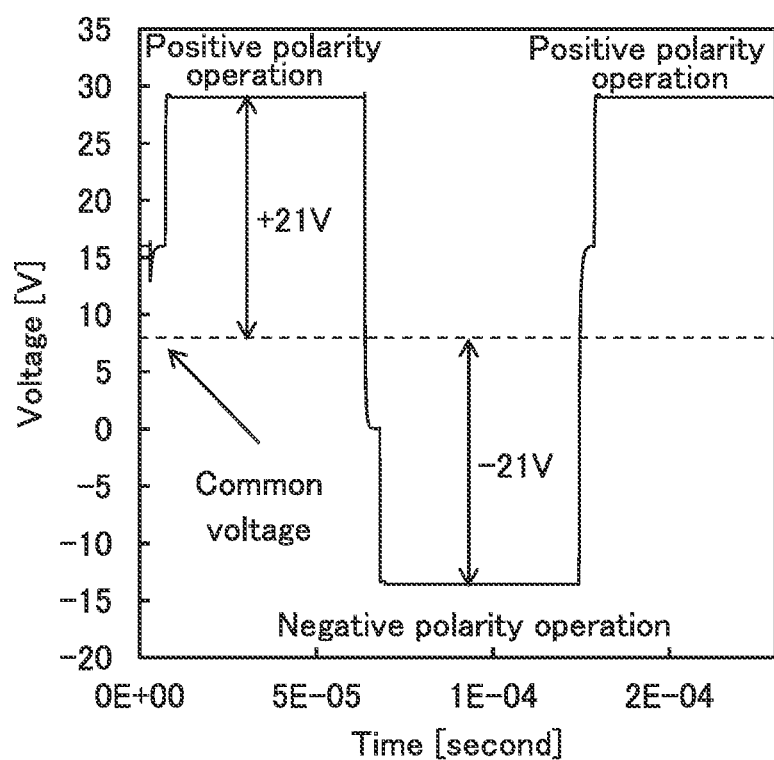
FIG. 19 is a diagram showing simulation results.

FIG. 19 shows the simulation results of the operation in accordance with the timing chart of the above-described pixel, and the horizontal axis represents time (second) and the vertical axis represents the voltage (V) of the node NM of the pixel 10. Note that SL1 corresponds to the wiring 127[m_1], SL2 corresponds to the wiring 127[m_2], GL1 corresponds to the wiring 126, and GL2 corresponds to the wiring 125. In the positive polarity operation, DATA1 was +16 V and DATA2 was 0 V. In the negative polarity operation, DATA1 was 0 V and DATA2 was +16 V.

As shown in FIG. 19, with use of the common voltage as a reference, an increase in voltage approximately 21 V (approximately 2.6 times or more) was confirmed in both the positive polarity operation and the negative polarity operation. When the electric characteristics of the transistor are improved and the parasitic capacitance is reduced, for example, a higher voltage can be generated.

The above simulation results show the effect of one embodiment of the present invention.

This embodiment can be implemented in an appropriate combination with the structures described in the other embodiments and the like.

Embodiment 2

In this embodiment, a structure example of a display apparatus using a liquid crystal device and a structure example of a display apparatus using a light-emitting device are described. Note that the description of the components, operations, and functions of the display apparatus described in Embodiment 1 is omitted in this embodiment.

The pixel described in Embodiment 1 can be used in the display apparatus described in this embodiment. Note that a scan line driver circuit and a signal line driver circuit which are described below correspond to the gate driver and the source driver, respectively.

Figure 20A:
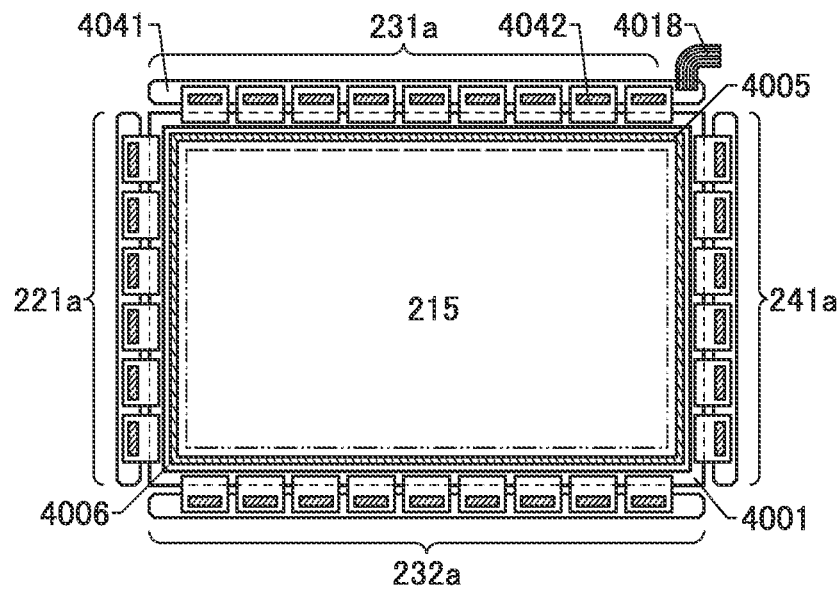
FIG. 20A to FIG. 20C are diagrams illustrating display apparatuses.
Figure 20B:
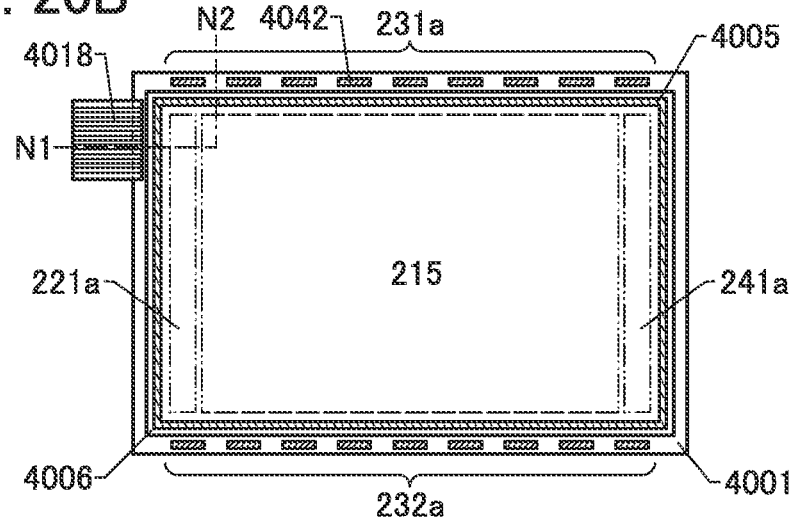
Figure 20C:
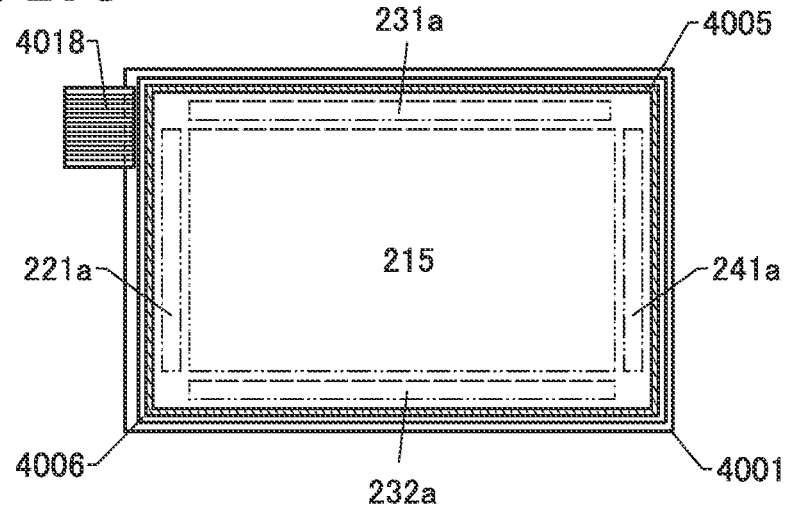

FIG. 20A to FIG. 20C are diagrams each illustrating a structure of a display apparatus in which one embodiment of the present invention can be used.

In FIG. 20A, a sealant 4005 is provided to surround a display portion 215 provided over a first substrate 4001, and the display portion 215 is sealed with the sealant 4005 and a second substrate 4006.

In FIG. 20A, a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The common line driver circuit 241a has a function of supplying a prescribed potential to the wirings 151, 152, 129, 154, 155, and the like described in Embodiment 1.

Signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COF (Chip On Film) method, a COG (Chip On Glass) method, a TCP (Tape Carrier Package) method, or the like can be used.

FIG. 20B illustrates an example in which the integrated circuits 4042 included in the signal line driver circuit 231a and the signal line driver circuit 232a are mounted by a COG method. Some or all of the driver circuits can be formed over the same substrate as the display portion 215, whereby a system-on-panel can be formed.

In the example illustrated in FIG. 20B, the scan line driver circuit 221a and the common line driver circuit 241a are formed over the same substrate as the display portion 215. When the driver circuits are formed concurrently with pixel circuits in the display portion 215, the number of components can be reduced. Accordingly, the productivity can be increased.

In FIG. 20B, the sealant 4005 is provided to surround the display portion 215, the scan line driver circuit 221a, and the common line driver circuit 241a provided over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed with the use of the first substrate 4001, the sealant 4005, and the second substrate 4006 together with the display device.

Although the signal line driver circuit 231a and the signal line driver circuit 232a are separately formed and mounted on the first substrate 4001 in the example illustrated in FIG. 20B, one embodiment of the present invention is not limited to this structure. The scan line driver circuit may be separately formed and then mounted, part of the signal line driver circuits or part of the scan line driver circuits may be separately formed and then mounted. The signal line driver circuit 231a and the signal line driver circuit 232a may be formed over the same substrate as the display portion 215, as illustrated in FIG. 20C.

In some cases, the display apparatus encompasses a panel in which the display element is sealed, and a module in which an IC or the like including a controller is mounted on the panel.

The display portion and the scan line driver circuit provided over the first substrate each include a plurality of transistors. As the transistors, the Si transistor or the OS transistor described in Embodiment 1 can be used.

The transistors included in the peripheral driver circuit and transistors included in the pixel circuits of the display portion may have the same structure or different structures. The transistors included in the peripheral driver circuit may have the same structure, or two or more kinds of structures may be used in combination. Similarly, the transistors included in the pixel circuits may have the same structure, or two or more kinds of structures may be used in combination.

An input device 4200 can be provided over the second substrate 4006. The display apparatuses illustrated in FIG. 20A to FIG. 20C and provided with the input device 4200 can function as a touch panel.

There is no particular limitation on a sensor device (also referred to as a sensor element) included in the touch panel of one embodiment of the present invention. A variety of sensors capable of sensing an approach or a contact of a sensing target such as a finger or a stylus can be used as the sensor device.

For example, a variety of types such as a capacitive type, a resistive type, a surface acoustic wave type, an infrared type, an optical type, and a pressure-sensitive type can be used for the sensor.

In this embodiment, a touch panel including a capacitive sensor device is described as an example.

Examples of the capacitive sensor device include a surface capacitive sensor device and a projected capacitive sensor device. Examples of the projected capacitive sensor device include a self-capacitive sensor device and a mutual capacitive sensor device. The use of a mutual capacitive sensor device is preferred because multiple points can be sensed simultaneously.

The touch panel of one embodiment of the present invention can have any of a variety of structures, including a structure in which a display apparatus and a sensor device that are separately formed are attached to each other and a structure in which an electrode and the like included in a sensor device are provided on one or both of a substrate supporting a display device and a counter substrate.

Figure 21A:
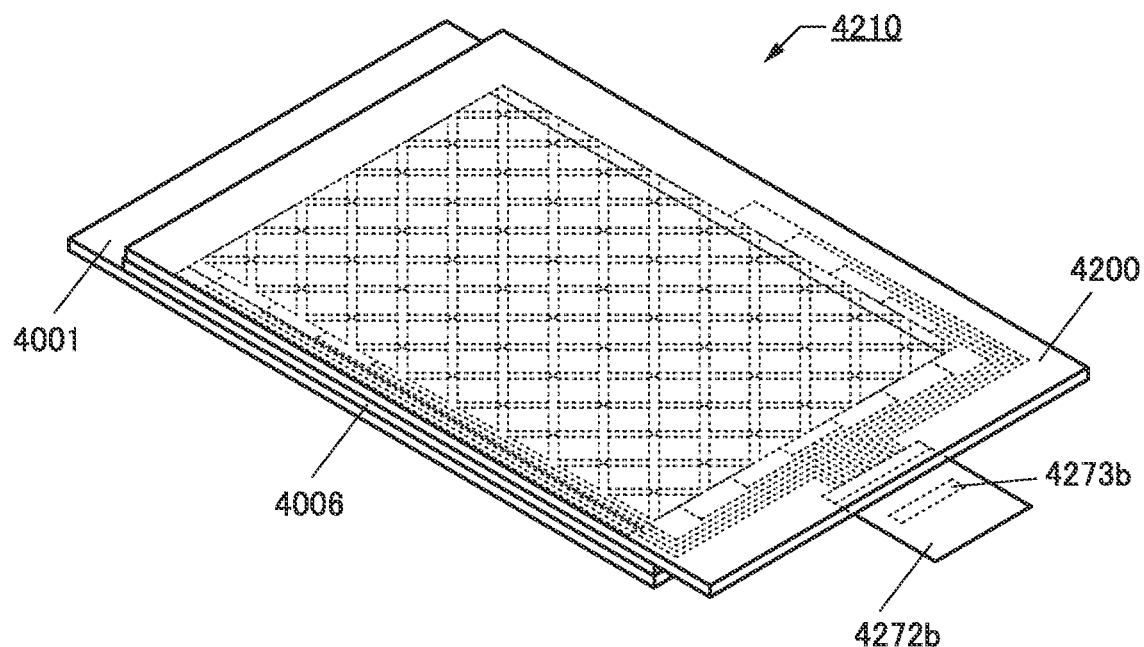
FIG. 21A and FIG. 21B are diagrams illustrating a touch panel.
Figure 21B:
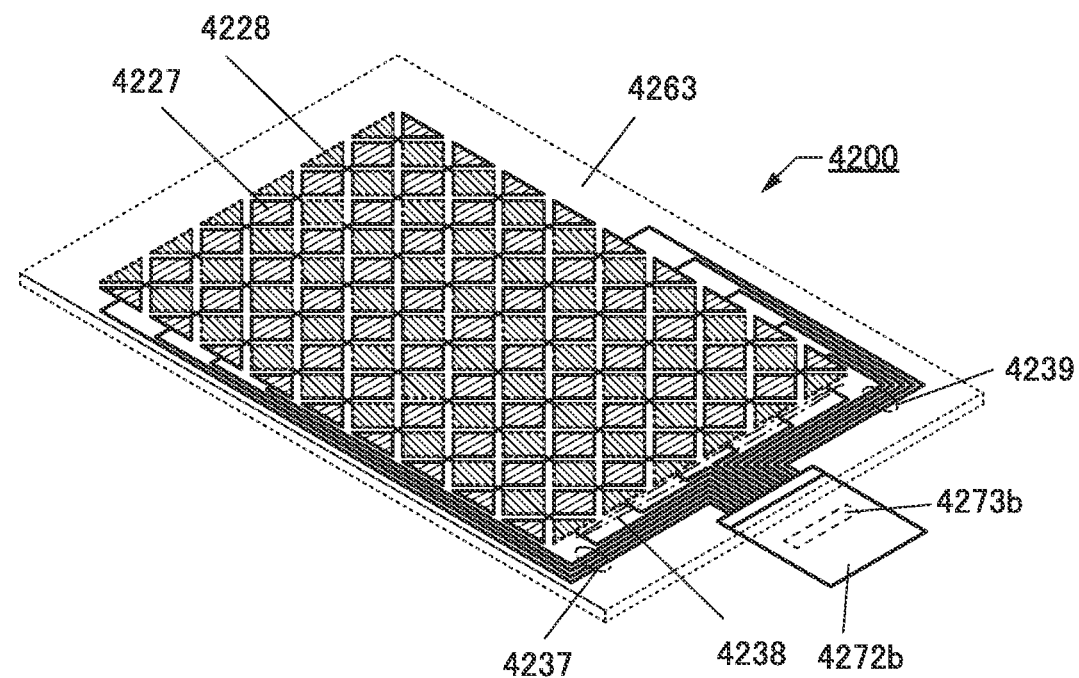

FIG. 21A and FIG. 21B show an example of the touch panel. FIG. 21A is a perspective view of a touch panel 4210. FIG. 21B is a schematic perspective view of the input device 4200. Note that for clarity, only typical components are illustrated.

The touch panel 4210 has a structure in which a display apparatus and a sensor device that are separately formed are attached to each other.

The touch panel 4210 includes the input device 4200 and the display apparatus, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to any of the wirings 4237 or any of the wirings 4239. In addition, the electrode 4228 can be electrically connected to any of the wirings 4239. An FPC 4272*b* is electrically connected to each of the plurality of wirings 4237, and the plurality of wirings 4238. An IC 4273*b* can be provided for the FPC 4272*b*.

Alternatively, a touch sensor may be provided between the first substrate 4001 and the second substrate 4006 in the display apparatus. In the case where a touch sensor is provided between the first substrate 4001 and the second substrate 4006, either a capacitive touch sensor or an optical touch sensor including a photoelectric conversion element may be used.

FIG. 22A and FIG. 22B are cross-sectional views of a portion indicated by chain line N1-N2 in FIG. 20B. Display apparatuses illustrated in FIG. 22A and FIG. 22B each include an electrode 4015, and the electrode 4015 is electrically connected to a terminal included in the FPC 4018 through an anisotropic conductive layer 4019. In FIG. 22A and FIG. 22B, the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221*a* provided over the first substrate 4001 each include a plurality of transistors. In FIG. 22A and FIG. 22B, the transistor 4010 included in the display portion 215 and the transistor 4011 included in the scan line driver circuit 221*a* are illustrated as an example. Note that in the examples illustrated in FIG. 22A and FIG. 22B, the transistor 4010 and the transistor 4011 are bottom-gate transistors but may be top-gate transistors.

In FIG. 22A and FIG. 22B, the insulating layer 4112 is provided over the transistor 4010 and the transistor 4011. In FIG. 22B, a partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can function as a back gate electrode.

The display apparatuses illustrated in FIG. 22A and FIG. 22B each include a capacitor 4020. An example is shown in which the capacitor 4020 includes an electrode 4021 formed in the same step as a gate electrode of the transistor 4010, an insulating layer 4103, and an electrode formed in the same step as the source electrode and the drain electrode. The capacitor 4020 is not limited to having this structure and may be formed using another conductive layer and another insulating layer.

The transistor 4010 provided in the display portion 215 is electrically connected to the display device. FIG. 22A illustrates an example of a liquid crystal display apparatus using a liquid crystal device as the display device. In FIG. 22A, a liquid crystal device 4013 serving as the display device includes the first electrode layer 4030, a second electrode layer 4031, and a liquid crystal layer 4008. Note that an insulating layer 4032 and an insulating layer 4033 functioning as alignment films are provided so that the liquid crystal layer 4008 is positioned therebetween. The second electrode layer 4031 is provided on the second substrate 4006 side, and the first electrode layer 4030 and the second electrode layer 4031 overlap with each other with the liquid crystal layer 4008 therebetween.

A liquid crystal device having a variety of modes can be used as the liquid crystal device 4013. For example, a liquid crystal device using a VA (Vertical Alignment) mode, a TN (Twisted Nematic) mode, an IPS (In-Plane-Switching) mode, an ASM (Axially Symmetric aligned Micro-cell) mode, an OCB (Optically Compensated Bend) mode, an FLC (Ferroelectric Liquid Crystal) mode, an AFLC (Anti-Ferroelectric Liquid Crystal) mode, an ECB (Electrically Controlled Birefringence) mode, a VA-IPS mode, a guest-host mode, or the like can be used.

As the liquid crystal display apparatus described in this embodiment, a normally black liquid crystal display apparatus such as a transmissive liquid crystal display apparatus employing a vertical alignment (VA) mode may be used. As the vertical alignment mode, an MVA (Multi-Domain Vertical Alignment) mode, a PVA (Patterned Vertical Alignment) mode, an ASV (Advanced Super View) mode, and the like can be used.

Note that the liquid crystal device is a device that controls transmission and non-transmission of light by the optical modulation action of liquid crystal. The optical modulation action of the liquid crystal is controlled by an electric field applied to the liquid crystal (including a horizontal electric field, a vertical electric field, and an oblique electric field). As the liquid crystal used for the liquid crystal device, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Although an example of a liquid crystal display apparatus including a liquid crystal device with a vertical electric field mode is illustrated in FIG. 22A, a liquid crystal display apparatus including a liquid crystal device with a horizontal electric field mode can be applied to one embodiment of the present invention. In the case of employing a horizontal electric field mode, liquid crystal exhibiting a blue phase for which an alignment film is not used may be used. The blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which a chiral material of 5 weight % or more is mixed is used for the liquid crystal layer 4008 in order to improve the temperature range. The liquid crystal composition containing liquid crystal exhibiting a blue phase and a chiral material has a short response speed and exhibits optical isotropy. In addition, the liquid crystal composition containing liquid crystal exhibiting a blue phase and a chiral material does not need alignment treatment and has small viewing angle dependence. Since an alignment film does not need to be provided and rubbing treatment is unnecessary, electrostatic discharge damage caused by the rubbing treatment can be prevented and defects or damage of the liquid crystal display apparatus in the manufacturing process can be reduced.

A spacer 4035 is a columnar spacer obtained by selective etching of an insulating layer and is provided in order to control a distance (a cell gap) between the first electrode layer 4030 and the second electrode layer 4031. Note that a spherical spacer may alternatively be used.

A black matrix (a light-blocking layer); a coloring layer (a color filter); an optical member (an optical substrate) such as a polarizing member, a retardation member, or an anti-reflection member; or the like may be provided as appropriate if needed. For example, circular polarization may be employed by using a polarizing substrate and a retardation substrate. In addition, a backlight, a side light, or the like may be used as a light source. A micro LED or the like may be used as the backlight or the side light.

In the display apparatus illustrated in FIG. 22A, a light-blocking layer 4132, a coloring layer 4131, and an insulating layer 4133 are provided between the second substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material for the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same apparatus can be used and the process can be simplified.

Examples of a material that can be used for the coloring layer include a metal material, a resin material, and a resin material containing a pigment or a dye. The light-blocking layer and the coloring layer can be formed by an inkjet method, for example.

The display apparatuses illustrated in FIG. 22A and FIG. 22B each include the insulating layer 4111 and an insulating layer 4104. As the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

A light-emitting device can be used as the display device included in the display apparatus. As the light-emitting device, for example, an EL device that utilizes electroluminescence can be used. An EL device includes a layer containing a light-emitting compound (also referred to as an "EL layer") between a pair of electrodes. By generating a potential difference between the pair of electrodes that is greater than the threshold voltage of the EL device, holes are injected to the EL layer from the anode side and electrons are injected to the EL layer from the cathode side. The injected electrons and holes are recombined in the EL layer and a light-emitting compound contained in the EL layer emits light.

As the EL device, an organic EL device or an inorganic EL device can be used, for example. Note that an LED (including a micro LED) that uses a compound semiconductor as a light-emitting material can also be used.

Note that in addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

The EL layer can be formed by a method such as an evaporation method (including a vacuum evaporation method), a transfer method, a printing method, an inkjet method, or a coating method.

The inorganic EL devices are classified according to their element structures into a dispersion-type inorganic EL device and a thin-film inorganic EL device. A dispersion-type inorganic EL device includes a light-emitting layer where particles of a light-emitting material are dispersed in a binder, and its light emission mechanism is donor-acceptor recombination type light emission that utilizes a donor level and an acceptor level. A thin-film inorganic EL device has a structure in which a light-emitting layer is positioned between dielectric layers, which are further positioned between electrodes, and its light emission mechanism is localization type light emission that utilizes inner-shell electron transition of metal ions. Note that the description is made here using an organic EL device as the light-emitting device.

In order to extract light emitted from the light-emitting device, at least one of the pair of electrodes needs to be transparent. A transistor and a light-emitting device are formed over a substrate. The light-emitting device can have a top emission structure in which light emission is extracted from the surface on the side opposite to the substrate; a bottom emission structure in which light emission is extracted from the surface on the substrate side; or a dual emission structure in which light emission is extracted from both surfaces. The light-emitting device having any of the emission structures can be used.

FIG. 22B illustrates an example of a light-emitting display apparatus using a light-emitting device as a display device (also referred to as an "EL display apparatus"). A light-emitting device 4513 serving as the display device is electrically connected to the transistor 4010 provided in the display portion 215. Note that the structure of the light-emitting device 4513 is a stacked-layer structure of the first electrode layer 4030, a light-emitting layer 4511, and the second electrode layer 4031; however, this embodiment is not limited to this structure. The structure of the light-emitting device 4513 can be changed as appropriate depending on the direction in which light is extracted from the light-emitting device 4513, or the like.

The partition wall 4510 is formed using an organic insulating material or an inorganic insulating material. It is particularly preferable that the partition wall 4510 be formed using a photosensitive resin material to have an opening portion over the first electrode layer 4030 such that a side surface of the opening portion slopes with continuous curvature.

The light-emitting layer 4511 may be formed using a single layer or a plurality of layers stacked.

The emission color of the light-emitting device 4513 can be white, red, green, blue, cyan, magenta, yellow, or the like depending on the material for the light-emitting layer 4511.

As a color display method, there are a method in which the light-emitting device 4513 that emits white light is combined with a coloring layer and a method in which the light-emitting device 4513 that emits light of a different emission color is provided in each pixel. The former method is more productive than the latter method. The latter method, which requires separate formation of the light-emitting layer 4511 pixel by pixel, is less productive than the former method. However, the latter method can provide higher color purity of the emission color than the former method. In the latter method, the color purity can be further increased when the light-emitting device 4513 has a microcavity structure.

Note that the light-emitting layer 4511 may contain an inorganic compound such as quantum dots. For example, when used for the light-emitting layer, the quantum dots can function as a light-emitting material.

A protective layer may be formed over the second electrode layer 4031 and the partition wall 4510 in order to prevent entry of oxygen, hydrogen, moisture, carbon dioxide, or the like into the light-emitting device 4513. For the protective layer, silicon nitride, silicon nitride oxide, aluminum oxide, aluminum nitride, aluminum oxynitride, aluminum nitride oxide, DLC (Diamond Like Carbon), or the like can be used. In a space enclosed by the first substrate 4001, the second substrate 4006, and the sealant 4005, a filler 4514 is provided for sealing. It is preferable that packaging (sealing) be performed with a protective film (such as a laminate film or an ultraviolet curable resin film) or a cover member with high air-tightness and little degasification to prevent exposure to the outside air.

As the filler 4514, an ultraviolet curable resin or a thermosetting resin can be used as well as an inert gas such as nitrogen or argon; PVC (polyvinyl chloride), an acrylic resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a $\lambda/4$ plate or a $\lambda/2$ plate), or a color filter may be provided as appropriate on an emission surface of the light-emitting device. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting device has a microcavity structure, light with high color purity can be extracted. Furthermore, when a microcavity structure and a color filter are used in combination, the glare can be reduced and visibility of a displayed image can be increased.

The first electrode layer and the second electrode layer (also called a pixel electrode layer, a common electrode layer, a counter electrode layer, or the like) for applying a voltage to the display device each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as conductive polymer) can be used for the first electrode layer 4030 and the second electrode layer 4031. As the conductive high molecule, what is called a π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

Figure 23:
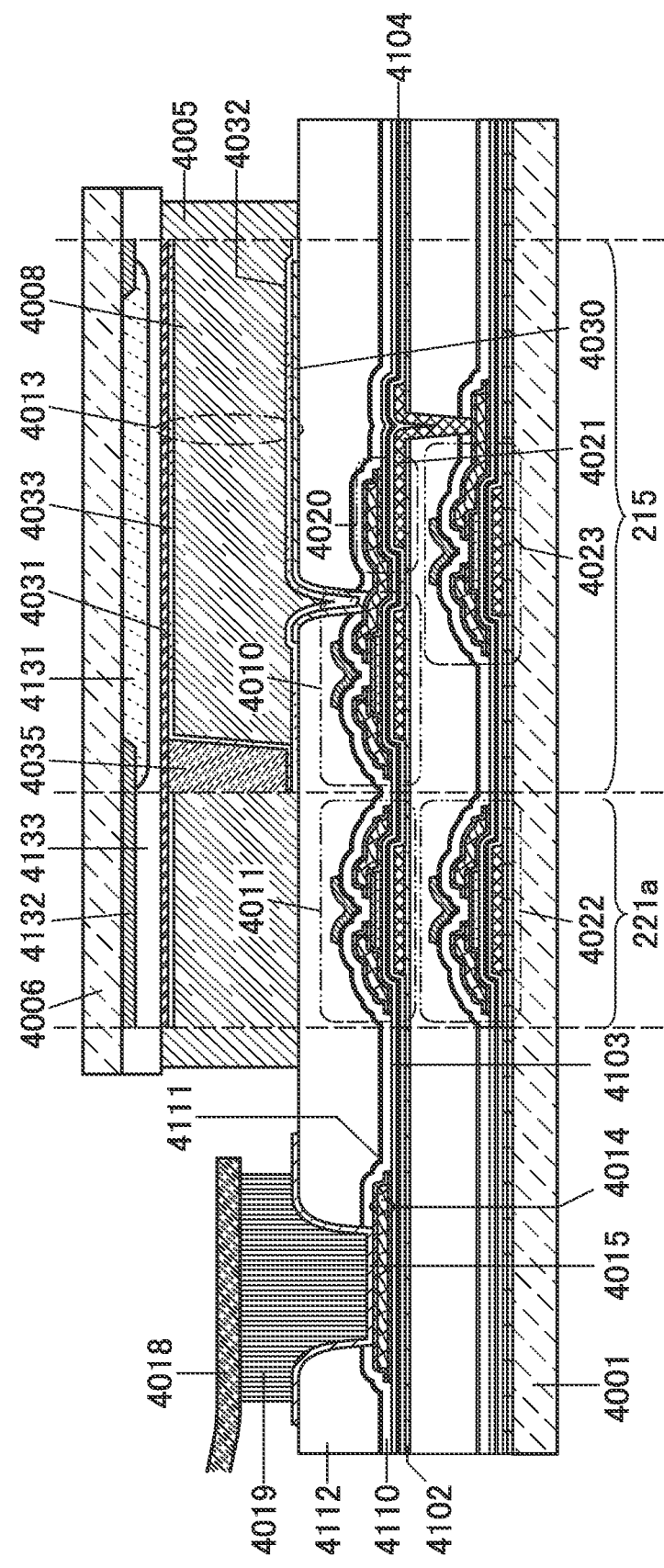
FIG. 23 is a diagram illustrating a display apparatus.

Note that as illustrated in FIG. 23, a stacked structure including a region where a transistor and a capacitor overlap with each other in the height direction may be employed. For example, when the transistor 4011 and a transistor 4022 included in the driver circuit are provided to overlap with each other, a display apparatus with a narrow frame can be provided. Furthermore, when the transistor 4010, a transistor 4023, the capacitor 4020, and the like included in the pixel circuit are provided to at least partly overlap with each other, the aperture ratio and the resolution can be improved. Although an example in which the stacked structure is employed for the liquid crystal display apparatus illustrated in FIG. 22A is illustrated in FIG. 23, the stacked structure may be employed for the EL display apparatus illustrated in FIG. 22B.

In addition, a light-transmitting conductive film with high visible-light-transmitting property is used as an electrode or a wiring in the pixel circuit, whereby transmittance of light in the pixel can be increased and the aperture ratio can be substantially improved. Note that in the case where an OS transistor is used, a semiconductor layer also has a light-transmitting property and thus the aperture ratio can be further increased. These are effective even when transistors and the like are not stacked.

The display apparatus may have a structure with a combination of a liquid crystal display apparatus and a light-emitting apparatus.

The light-emitting apparatus is disposed on the side opposite to the display surface or on an end portion of the display surface. The light-emitting apparatus has a function of supplying light to the display device. The light-emitting apparatus can also be referred to as a backlight.

Here, the light-emitting apparatus can include a plate-like or sheet-like light guide portion (also referred to as a light guide plate) and a plurality of light-emitting devices which emit light of different colors. When the light-emitting devices are disposed in the vicinity of the side surface of the light guide portion, light can be emitted from the side surface of the light guide portion to the inside. The light guide portion has a mechanism that changes an optical path (also referred to as a light extraction mechanism), and this enables the light-emitting apparatus to emit light uniformly to a pixel portion of a display panel. Alternatively, the light-emitting apparatus may be provided directly under the pixel without providing the light guide portion.

The light-emitting apparatus preferably includes light-emitting devices of three colors, red (R), green (G), and blue (B). In addition, a light-emitting device of white (W) may be included. A light emitting diode (LED) is preferably used as these light-emitting devices.

Furthermore, the light-emitting devices preferably have extremely high color purities; the full width at half maximum (FWHM) of the emission spectrum of the light-emitting device is less than or equal to 50 nm, preferably less than or equal to 40 nm, further preferably less than or equal to 30 nm, still further preferably less than or equal to 20 nm. Note that the full width at half maximum of the emission spectrum is preferably as small as possible, and can be, for example, greater than or equal to 1nm. Thus, when a color image is displayed, a vivid image with high color reproducibility can be displayed.

As the red light-emitting device, an element whose wavelength of an emission spectrum peak is in a range from 625 nm to 650 nm is preferably used. As the green light-emitting device, an element whose wavelength of an emission spectrum peak is in a range from 515 nm to 540 nm is preferably used. As the blue light-emitting device, an element whose wavelength of an emission spectrum peak is in a range from 445 nm to 470 nm is preferably used.

The display apparatus can make the light-emitting devices of the three colors blink sequentially, drive the pixels in synchronization with these light-emitting devices, and display a color image on the basis of the successive additive color mixing method. This driving method can also be referred to as a field-sequential driving.

By the field-sequential driving, a clear color image can be displayed. In addition, a smooth moving image can be displayed. When the above-described driving method is used, one pixel does not need to be formed with subpixels of different colors, which can make an effective reflection area (also referred to as an effective display area or an aperture ratio) per pixel large; thus, a bright image can be displayed. Furthermore, the pixels do not need to be provided with color filters, and thus can have improved transmittance and achieve brighter image display. In addition, the manufacturing process can be simplified, and the manufacturing costs can be reduced.

FIG. 24A and FIG. 24B each show an example of a schematic cross-sectional view of a display apparatus capable of the field-sequential driving. A backlight unit capable of emitting light of RGB colors is provided on the first substrate 4001 side of the display apparatus. Note that in the field-sequential driving, the RGB colors are expressed through time division light emission, and thus color filters are not needed.

A backlight unit 4340a illustrated in FIG. 24A has a structure in which a plurality of light-emitting devices 4342 are provided directly under a pixel with a diffusing plate 4352 positioned therebetween. The diffusing plate 4352 have functions of diffusing light emitted from the light-emitting device 4342 to the first substrate 4001 side and making the luminance in a display portion uniform. Between the light-emitting device 4342 and the diffusing plate 4352, a polarizing plate may be provided if necessary. The diffusing plate 4352 does not need to be provided if not needed. The light-blocking layer 4132 may be omitted.

The backlight unit 4340a can include a large number of light-emitting devices 4342, which enables bright image display. Moreover, there are advantages that a light guide plate is not needed and light efficiency of the light-emitting device 4342 is less likely to be lowered. Note that the light-emitting device 4342 may be provided with a light diffusion lens 4344 if necessary.

A backlight unit 4340b illustrated in FIG. 24B has a structure in which a light guide plate 4341 is provided directly under a pixel with the diffusing plate 4352 positioned therebetween. The plurality of light-emitting devices 4342 are provided at an end portion of the light guide plate 4341. The light guide plate 4341 has an uneven shape on the side opposite to the diffusing plate 4352, and can scatter waveguided light with the uneven shape to emit the light in the direction of the diffusing plate 4352.

The light-emitting device 4342 can be fixed to a printed circuit board 4347. Note that in FIG. 24B, the light-emitting devices 4342 of RGB colors overlap with each other; however, the light-emitting devices 4342 of RGB colors can be arranged to be lined up in the depth direction. A reflective layer 4348 that reflects visible light may be provided on the side surface of the light guide plate 4341 which is opposite to the light-emitting device 4342.

The backlight unit 4340b can reduce the number of light-emitting devices 4342, leading to reductions in cost and thickness.

A light-scattering liquid crystal device may be used as the liquid crystal device. The light-scattering liquid crystal device is preferably an element containing a composite material of liquid crystal and a polymer molecule. For example, a polymer dispersed liquid crystal device can be used. Alternatively, a polymer network liquid crystal (PNLC) element may be used.

The light-scattering liquid crystal device has a structure in which a liquid crystal portion is provided in a three-dimensional network structure of a resin portion sandwiched between a pair of electrodes. As a material used in the liquid crystal portion, for example, a nematic liquid crystal can be used. A photocurable resin can be used for the resin portion. The photocurable resin can be a monofunctional monomer, such as acrylate or methacrylate; a polyfunctional monomer, such as diacrylate, triacrylate, dimethacrylate, or trimethacrylate; or a polymerizable compound obtained by mixing these.

The light-scattering liquid crystal device displays an image by transmitting or scattering light utilizing the anisotropy of a refractive index of a liquid crystal material. The resin portion may have the anisotropy of a refractive index. When liquid crystal molecules are arranged in a certain direction in accordance with a voltage applied to the light-scattering liquid crystal device, a direction is generated at which a difference in a refractive index between the liquid crystal portion and the resin portion is small. Incident light along the direction passes without being scattered in the liquid crystal portion. Thus, the light-scattering liquid crystal device is perceived in a transparent state from the direction. By contrast, when liquid crystal molecules are arranged randomly in accordance with the applied voltage, a large difference in refractive index between the liquid crystal portion and the resin portion is not generated, and incident light is scattered in the liquid crystal portion. Thus, the light-scattering liquid crystal device is in an opaque state regardless of the viewing direction.

FIG. 25A illustrates a structure in which the liquid crystal device 4013 of the display apparatus illustrated in FIG. 24A is replaced by a light-scattering liquid crystal device 4016. The light-scattering liquid crystal device 4016 includes a composite layer 4009 including a liquid crystal portion and a resin portion, and the first electrode layer 4030 and the second electrode layer 4031. Although components relating to the field-sequential driving are the same as those in FIG. 24A, when the light-scattering liquid crystal device 4016 is used, an alignment film and a polarizing plate are not necessary. Note that the spherical spacer 4035 is illustrated, but the spacer 4035 may have a columnar shape.

FIG. 25B illustrates a structure in which the liquid crystal device 4013 of the display apparatus in FIG. 24B is replaced by the light-scattering liquid crystal device 4016. In the structure of FIG. 24B, it is preferable that light be transmitted when a voltage is not applied to the light-scattering liquid crystal device 4016, and light be scattered when a voltage is applied. With such a structure, the display apparatus can be transparent in a normal state (state where no image is displayed). In that case, a color image can be displayed when a light scattering operation is performed.

FIG. 26A to FIG. 26E illustrate modification examples of the display apparatus illustrated in FIG. 25B. Note that in FIG. 26A to FIG. 26E, some components in FIG. 25B are used and the other components are not illustrated for simplicity.

Figure 26A:
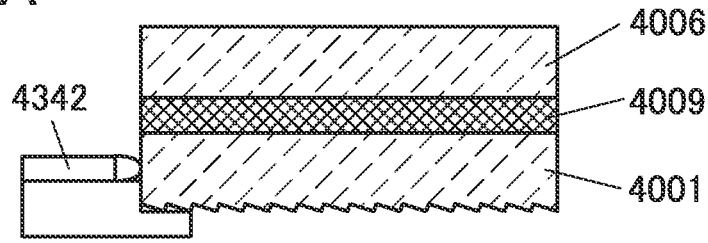
FIG. 26A to FIG. 26E are diagrams illustrating display apparatuses.

FIG. 26A illustrates a structure in which the first substrate 4001 has a function of a light guide plate. An uneven surface may be provided on an outer surface of the first substrate 4001. With this structure, a light guide plate does not need to be provided additionally, leading to a reduction in a manufacturing cost. Furthermore, the attenuation of light caused by the light guide plate also does not occur; accordingly, light emitted from the light-emitting device 4342 can be efficiently utilized.

Figure 26B:
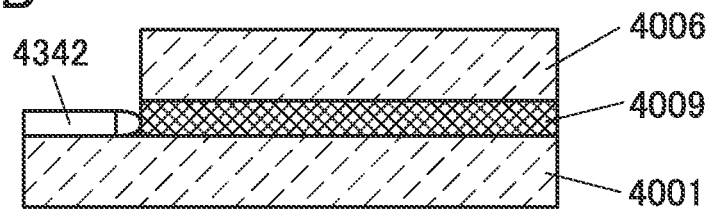

FIG. 26B illustrates a structure in which light enters from the vicinity of an end portion of the composite layer 4009. By utilizing total reflection at the interface between the composite layer 4009 and the second substrate 4006 and the interface between the composite layer 4009 and the first substrate 4001, light can be emitted to the outside from the light-scattering liquid crystal device. For the resin portion of the composite layer 4009, a material having a refractive index higher than that of the first substrate 4001 and that of the second substrate 4006 is used.

Figure 26C:
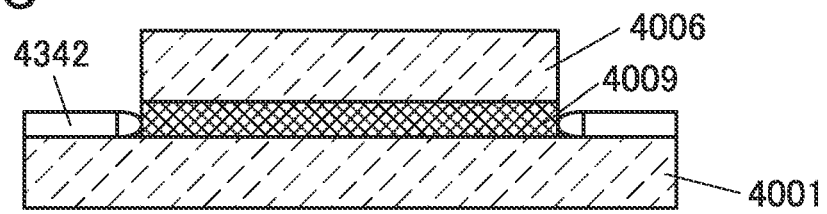

Note that the light-emitting device 4342 may be provided on one side of the display apparatus, or may be provided on each of two sides facing each other as illustrated in FIG. 26C. Furthermore, the light-emitting devices 4342 may be provided on three sides or four sides. When the light-emitting devices 4342 are provided on a plurality of sides, attenuation of light can be compensated for and application to a large-area display device is possible.

Figure 26D:
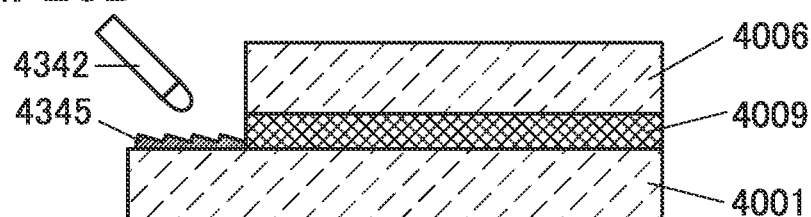

FIG. 26D illustrates a structure in which light emitted from the light-emitting device 4342 is guided to the display apparatus through a mirror 4345. With this structure, light can be guided easily with a certain angle to the display apparatus; thus, total reflection light can be obtained efficiently.

Figure 26E:
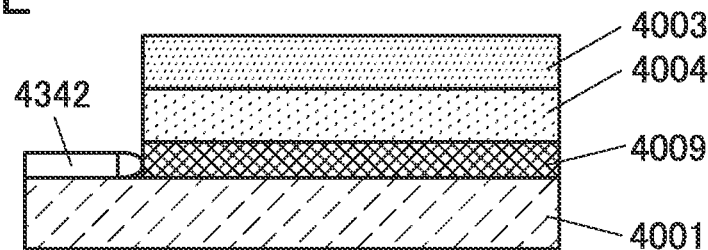

FIG. 26E illustrates a structure in which a layer 4003 and a layer 4004 are stacked over the composite layer 4009. One of the layer 4003 and the layer 4004 is a support such as a glass substrate, and the other can be formed of an inorganic film, a coating film of an organic resin, a film, or the like. For the resin portion of the composite layer 4009, a material having a refractive index higher than that of the layer 4004 is used. For the layer 4004, a material having a refractive index higher than that of the layer 4003 is used.

A first interface is formed between the composite layer 4009 and the layer 4004, and a second interface is formed between the layer 4004 and the layer 4003. With this structure, light passing through the first interface without being totally reflected is totally reflected at the second interface and can be returned to the composite layer 4009. Accordingly, light emitted from the light-emitting device 4342 can be efficiently utilized.

Note that the structures in FIG. 25B and FIG. 26A to FIG. 26E can be combined with each other.

This embodiment can be implemented in an appropriate combination with the structures described in the other embodiments and the like.

Embodiment 3

In this embodiment, examples of transistors which can be used as the transistors described in the above embodiments are described with reference to drawings.

The display apparatus of one embodiment of the present invention can be fabricated using a transistor with any of various structures, such as a bottom-gate transistor or a top-gate transistor. Therefore, a material of a semiconductor layer or the structure of a transistor can be easily changed depending on the existing production line.

[Bottom-Gate Transistor]

FIG. 27A1 is a cross-sectional view of a channel-protective transistor 810, which is a type of bottom-gate transistor, in the channel length direction. In FIG. 27A1, the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

Furthermore, an insulating layer 741 is provided over a channel formation region in the semiconductor layer 742. Furthermore, an electrode 744a and an electrode 744b are provided over the insulating layer 726 to be partly in contact with the semiconductor layer 742. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b. According to one embodiment of the present invention, a transistor with favorable electrical characteristics can be provided.

The transistor 810 includes an insulating layer 728 over the electrode 744a, the electrode 744b, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b which are in contact with the semiconductor layer 742. The carrier concentration in the regions of the semiconductor layer 742 where oxygen vacancies are generated is increased, so that the regions become n-type regions ($n^+$ regions). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that has a function of preventing or reducing diffusion of impurities into the transistor from the outside. Note that the insulating layer 729 can be omitted as necessary.

A transistor 811 illustrated in FIG. 27A2 is different from the transistor 810 in that an electrode 723 that can function as a back gate electrode is provided over the insulating layer 729.

The electrode 723 can be formed using a material and a method similar to those for the electrode 746.

In general, a back gate electrode is formed using a conductive layer and positioned so that a channel formation region in a semiconductor layer is positioned between the gate electrode and the back gate electrode. Thus, the back gate electrode can function in a manner similar to that of the gate electrode. The potential of the back gate electrode may be the same as the potential of the gate electrode or may be a ground potential (GND potential) or a given potential. When the potential of the back gate electrode is changed independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 therebetween and setting the potential of the electrode 746 equal to the potential of the electrode 723, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having a high on-state current for its occupation area. That is, the occupation area of the transistor 811 can be small for required on-state current. According to one embodiment of the present invention, the occupation area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). Note that when the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with favorable reliability can be provided. Moreover, a semiconductor device with favorable reliability can be provided.

FIG. 27B1 is a cross-sectional view of a channel-protective transistor 820, which has a structure different from FIG. 27A1, in the channel length direction. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening portion formed by selectively removing part of the insulating layer 741 that overlaps with the semiconductor layer 742. The semiconductor layer 742 is electrically connected to the electrode 744b through another opening portion formed by selectively removing part of the insulating layer 741 that overlaps with the semiconductor layer 742. A region of the insulating layer 741 that overlaps with the channel formation region can function as a channel protective layer.

A transistor 821 illustrated in FIG. 27B2 is different from the transistor 820 in that the electrode 723 that can function as a back gate electrode is provided over the insulating layer 729.

With the insulating layer 741, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

The distance between the electrode 744a and the electrode 746 and the distance between the electrode 744b and the electrode 746 are longer in the transistor 820 and the transistor 821 than in the transistor 810 and the transistor 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with favorable electrical characteristics can be provided.

FIG. 27C1 is a cross-sectional view of a channel-etched transistor 825, which is a type of bottom-gate transistor, in the channel length direction. In the transistor 825, the electrode 744a and the electrode 744b are formed without the insulating layer 741. Thus, part of the semiconductor layer 742 that is exposed at the time of forming the electrode 744a and the electrode 744b might be etched. However, since the insulating layer 741 is not provided, the productivity of the transistor can be increased.

A transistor 826 illustrated in FIG. 27C2 is different from the transistor 825 in that the electrode 723 that can function as a back gate electrode is provided over the insulating layer 729.

FIG. 28A1 to FIG. 28C2 are cross-sectional views of the transistors 810, 811, 820, 821, 825, and 826 in the channel width direction, respectively.

In each of the structures illustrated in FIG. 28B2 and FIG. 28C2, the gate electrode is connected to the back gate electrode, and the gate electrode and the back gate electrode have the same potential. In addition, the semiconductor layer 742 is positioned between the gate electrode and the back gate electrode.

The length of each of the gate electrode and the back gate electrode in the channel width direction is longer than the length of the semiconductor layer 742 in the channel width direction. In the channel width direction, the whole of the semiconductor layer 742 is covered with the gate electrode and the back gate electrode with the insulating layers 726, 741, 728, and 729 positioned therebetween.

In this structure, the semiconductor layer 742 included in the transistor can be electrically surrounded by electric fields of the gate electrode and the back gate electrode.

The transistor device structure in which the semiconductor layer 742 in which the channel formation region is formed is electrically surrounded by electric fields of the gate electrode and the back gate electrode, as in the transistor 821 or the transistor 826, can be referred to as a Surrounded channel (S-channel) structure.

With the S-channel structure, an electric field for inducing a channel can be effectively applied to the semiconductor layer 742 by one or both of the gate electrode and the back gate electrode, which improves the current drive capability of the transistor and offers high on-state current characteristics. In addition, the transistor can be miniaturized because the on-state current can be increased. The S-channel structure can also increase the mechanical strength of the transistor.

[Top-Gate Transistor]

A transistor 842 illustrated in FIG. 29A1 as an example is a type of top-gate transistor. The electrode 744a and the electrode 744b are electrically connected to the semiconductor layer 742 through opening portions formed in the insulating layer 728 and the insulating layer 729.

Part of the insulating layer 726 that does not overlap with the electrode 746 is removed, and an impurity is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity is introduced through the insulating layer 726 has a lower impurity concentration than the semiconductor layer 742 in a region into which the impurity is introduced not through the insulating layer 726. Thus, an LDD (Lightly Doped Drain) region is formed in a region of the semiconductor layer 742 which overlaps with the insulating layer 726 but does not overlap with the electrode 746.

A transistor 843 illustrated in FIG. 29A2 is different from the transistor 842 in that the electrode 723 is included. The transistor 843 includes the electrode 723 that is formed over the substrate 771. The electrode 723 includes a region overlapping with the semiconductor layer 742 with the insulating layer 772 therebetween. The electrode 723 can function as a back gate electrode.

As in a transistor 844 illustrated in FIG. 29B1 and a transistor 845 illustrated in FIG. 29B2, the insulating layer 726 in a region that does not overlap with the electrode 746 may be completely removed. Alternatively, as in a transistor 846 illustrated in FIG. 29C1 and a transistor 847 illustrated in FIG. 29C2, the insulating layer 726 may be left.

Also in the transistor 842 to the transistor 847, after the formation of the electrode 746, an impurity is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

FIG. 30A1 to FIG. 30C2 are cross-sectional views of the transistors 842, 843, 844, 845, 846, and 847 in the channel width direction, respectively.

The transistor 843, the transistor 845, and the transistor 847 each have the above-described S-channel structure. However, one embodiment of the present invention is not limited to this, and the transistor 843, the transistor 845, and the transistor 847 do not necessarily have the S-channel structure.

This embodiment can be implemented in an appropriate combination with the structures described in the other embodiments and the like.

Embodiment 4

Examples of an electronic device that can use the display apparatus of one embodiment of the present invention include display equipment, personal computers, image storage devices or image reproducing devices provided with storage media, cellular phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIG. 31 illustrates specific examples of such electronic devices.

Figure 31A:
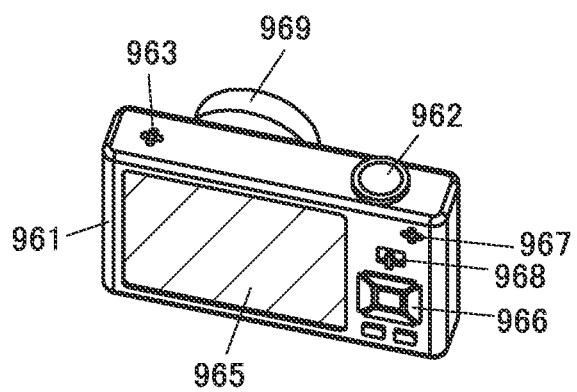
FIG. 31A to FIG. 31F are diagrams illustrating electronic devices.

FIG. 31A illustrates a digital camera, which includes a housing 961, a shutter button 962, a microphone 963, a speaker 967, a display portion 965, operation keys 966, a zoom lever 968, a lens 969, and the like. With the use of the display apparatus of one embodiment of the present invention for the display portion 965, a variety of images can be displayed.

Figure 31B:
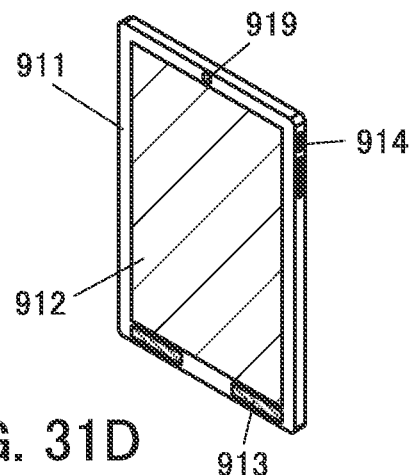

FIG. 31B illustrates a portable data terminal, which includes a housing 911, a display portion 912, speakers 913, an operation button 914, a camera 919, and the like. A touch panel function of the display portion 912 enables input and output of information. With the use of the display apparatus of one embodiment of the present invention for the display portion 912, a variety of images can be displayed.

Figure 31C:
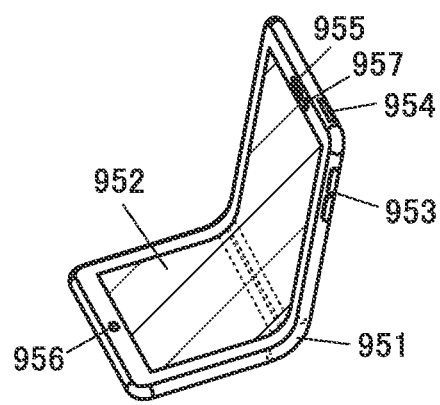

FIG. 31C illustrates a cellular phone, which includes a housing 951, a display portion 952, an operation button 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. The housing 951 and the display portion 952 have flexibility and can be used in a bent state as illustrated in the figure. With the use of the display apparatus of one embodiment of the present invention for the display portion 952, a variety of images can be displayed.

Figure 31D:
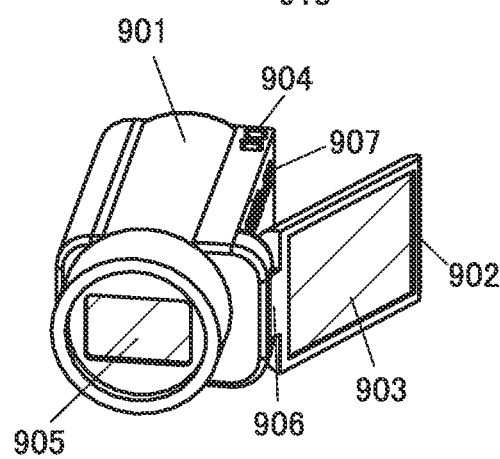

FIG. 31D illustrates a video camera, which includes a first housing 901, a second housing 902, a display portion 903, an operation key 904, a lens 905, a connection portion 906, a speaker 907, and the like. The operation key 904 and the lens 905 are provided on the first housing 901, and the display portion 903 is provided on the second housing 902. With the use of the display apparatus of one embodiment of the present invention for the display portion 903, a variety of images can be displayed.

Figure 31E:
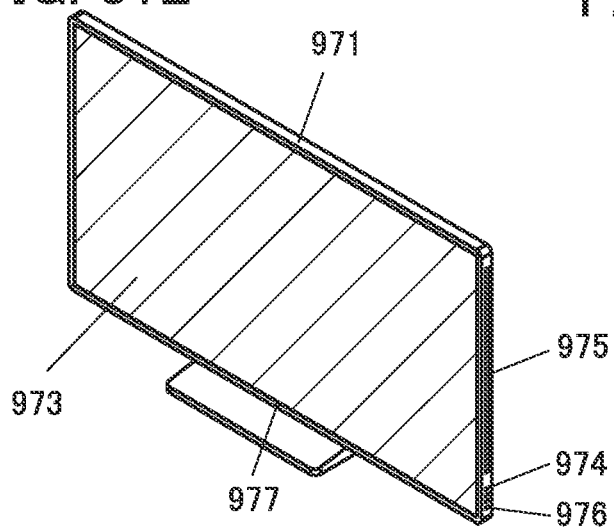

FIG. 31E illustrates a television, which includes a housing 971, a display portion 973, an operation button 974, speakers 975, a communication connection terminal 976, an optical sensor 977, and the like. The display portion 973 includes a touch sensor that enables an input operation. With the use of the display apparatus of one embodiment of the present invention for the display portion 973, a variety of images can be displayed.

Figure 31F:
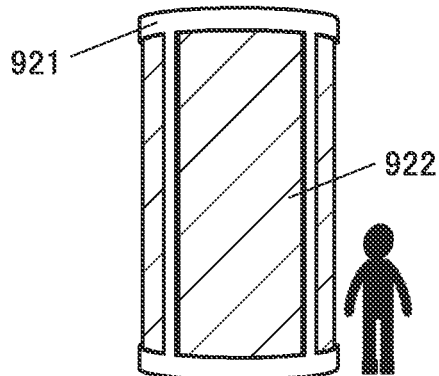

FIG. 31F illustrates digital signage which has a large display portion 922. The large display portion 922 in the digital signage is attached to a side surface of a pillar 921, for example. With the use of the display apparatus of one embodiment of the present invention for the display portion 922, an image can be displayed with high display quality.

This embodiment can be implemented in an appropriate combination with the structures described in the other embodiments and the like.

REFERENCE NUMERALS

10: pixel, 11: circuit, 11A: circuit, 11B: circuit, 12: source driver, 12A: source driver, 12B: source driver, 13: gate driver, 13A: gate driver, 13B: gate driver, 15: display region, 16: selection circuit, 17: selection circuit, 18: selection circuit, 19: selection circuit, 20: circuit, 21: circuit, 101: transistor, 102: transistor, 103: transistor, 104: capacitor, 111: transistor, 112: transistor, 113: transistor, 114: transistor, 115: transistor, 116: transistor, 117: capacitor, 118: capacitor, 125: wiring, 126: wiring, 127: wiring, 128: wiring, 129: wiring, 131: transistor, 132: transistor, 133: transistor, 134: transistor, 141: capacitor, 142: liquid crystal device, 143: transistor, 144: transistor, 145: transistor, 146: capacitor, 147: light-emitting device, 148: transistor, 149: transistor, 151: wiring, 152: wiring, 153: wiring, 154: wiring, 155: wiring, 156: wiring, 161: wiring, 162: wiring, 163: wiring, 164: wiring, 165: wiring, 166: wiring, 170: circuit, 171: circuit, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 771: substrate, 772: insulating layer, 810: transistor, 811: transistor, 820: transistor, 821: transistor, 825: transistor, 826: transistor, 842: transistor, 843: transistor, 844: transistor, 845: transistor, 846: transistor, 847: transistor, 901: housing, 902: housing, 903: display portion, 904: operation key, 905: lens, 906: connection portion, 907: speaker, 911: housing, 912: display portion, 913: speaker, 914: operation button, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation button, 975: speaker, 976: communication connection terminal, 977: optical sensor, 4001: substrate, 4003: layer, 4004: layer, 4005: sealant, 4006: substrate, 4008: liquid crystal layer, 4009: composite layer, 4010: transistor, 4011: transistor, 4013: liquid crystal device, 4014: wiring, 4015: electrode, 4016: light-scattering liquid crystal device, 4017: electrode, 4018: FPC, 4019: anisotropic conductive layer, 4020: capacitor, 4021: electrode, 4022: transistor, 4023: transistor, 4030: electrode layer, 4031: electrode layer, 4032: insulating layer, 4033: insulating layer, 4035: spacer, 4041: printed circuit board, 4042: integrated circuit, 4102: insulating layer, 4103: insulating layer, 4104: insulating layer, 4110: insulating layer, 4111: insulating layer, 4112: insulating layer, 4131: coloring layer, 4132: light-blocking layer, 4133: insulating layer, 4200: input device, 4210: touch panel, 4227: electrode, 4228: electrode, 4237: wiring, 4238: wiring, 4239: wiring, 4263: substrate, 4272b: FPC, 4273b: IC, 4340a: backlight unit, 4340b: backlight unit, 4341: light guide plate, 4342: light-emitting device, 4344: lens, 4345:

mirror, 4347: printed circuit board, 4348: reflective layer, 4352: diffusing plate, 4510: partition wall, 4511: light-emitting layer, 4513: light-emitting device, 4514: filler

What is claimed is:

1. A display apparatus comprising:
a first circuit configured to output first data;
a second circuit configured to generate second data by inverting the first data;
a third circuit configured to output third data;
a fourth circuit configured to generate fourth data by inverting the third data; and
a display region comprising a pixel,
wherein the first circuit is positioned on one end side of the display region,
wherein the third circuit is positioned on the other end side of the display region,
wherein the pixel comprises a first transistor, a second transistor, a third transistor, a first capacitor, and a fifth circuit which comprises a display device,
wherein one of a source and a drain of the first transistor is electrically connected to one electrode of the first capacitor and the third circuit,
wherein one of a source and a drain of the second transistor is electrically connected to one of a source and a drain of the third transistor and the other electrode of the first capacitor,
wherein the other of the source and the drain of the first transistor and the other of the source and the drain of the second transistor are electrically connected to at least one of the first circuit and the third circuit, and
wherein the other of the source and the drain of the third transistor is electrically connected to at least one of the second circuit and the fourth circuit.

2. The display apparatus according to claim 1, wherein each of the first circuit and the third circuit is a source driver.

3. The display apparatus according to claim 1, wherein the first transistor, the second transistor, and the third transistor each comprise a metal oxide in a channel formation region, and
wherein the metal oxide comprises indium.

4. The display apparatus according to claim 1, wherein the fifth circuit comprises a liquid crystal device as the display device.

5. The display apparatus according to claim 1, wherein the fifth circuit comprises a fourth transistor and a light-emitting device as the display device.

* * * * *